United States Patent
Kinoshita

(10) Patent No.: US 11,709,428 B2
(45) Date of Patent: Jul. 25, 2023

(54) RADIATION-SENSITIVE RESIN COMPOSITION, METHOD FOR FORMING PATTERN, AND METHOD FOR PRODUCING MONOMERIC COMPOUND

(71) Applicant: JSR CORPORATION, Tokyo (JP)

(72) Inventor: Natsuko Kinoshita, Tokyo (JP)

(73) Assignee: JSR CORPORATION, Tokyo (JP)

( * ) Notice: Subject to any disclaimer, the term of this patent is extended or adjusted under 35 U.S.C. 154(b) by 166 days.

(21) Appl. No.: 17/192,928

(22) Filed: Mar. 5, 2021

(65) Prior Publication Data

US 2021/0284773 A1  Sep. 16, 2021

(30) Foreign Application Priority Data

Mar. 11, 2020 (JP) .................................. 2020-042383
Sep. 24, 2020 (JP) .................................. 2020-159868

(51) Int. Cl.
| | |
|---|---|
| G03F 7/039 | (2006.01) |
| G03F 7/30 | (2006.01) |
| C08F 212/00 | (2006.01) |
| C08F 220/14 | (2006.01) |
| G03F 7/004 | (2006.01) |
| C08F 220/22 | (2006.01) |
| C08F 220/16 | (2006.01) |

(52) U.S. Cl.
CPC .......... *G03F 7/0392* (2013.01); *C08F 212/00* (2013.01); *C08F 220/14* (2013.01); *C08F 220/16* (2013.01); *C08F 220/22* (2013.01); *G03F 7/0045* (2013.01); *G03F 7/0046* (2013.01); *G03F 7/0397* (2013.01); *G03F 7/30* (2013.01)

(58) Field of Classification Search
CPC ........ G03F 7/0392; G03F 7/0397; G03F 7/30; C08F 212/00
See application file for complete search history.

(56) References Cited

U.S. PATENT DOCUMENTS

2014/0045122 A1* 2/2014 Hatakeyama ......... G03F 7/0397
  430/326
2015/0185612 A1* 7/2015 Kawabata ................. G03F 7/30
  430/311

FOREIGN PATENT DOCUMENTS

JP  4958584 B2  6/2000

* cited by examiner

*Primary Examiner* — John S Chu
(74) *Attorney, Agent, or Firm* — Element IP, PLC

(57) ABSTRACT

A radiation-sensitive resin composition includes: a resin containing a structural unit A represented by formula (1); at least one radiation-sensitive acid generator selected from the group consisting of a radiation-sensitive acid generator represented by formula (2-1) and a radiation-sensitive acid generator represented formula (2-2); and a solvent. At least one $R^3$ is an acid-dissociable group; and $R^{41}$ is a hydrogen atom or a protective group to be deprotected by action of an acid. At least one of $R^{f1}$ and $R^{f2}$ is a fluorine atom or a fluoroalkyl group; $R^{5a}$ is a monovalent organic group having a cyclic structure; $X_1^+$ is a monovalent onium cation; $R^{5b}$ is a monovalent organic group, and $X_2^+$ is a monovalent onium cation whose atom having a positive charge is not an atom forming a cyclic structure.

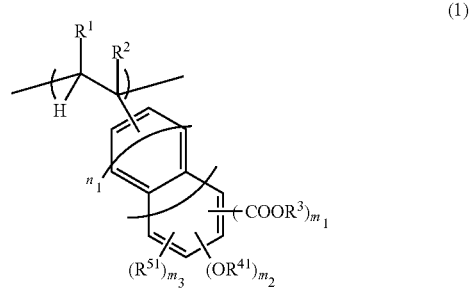

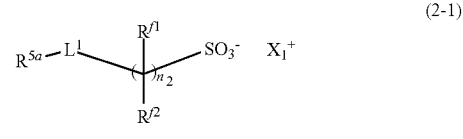

9 Claims, No Drawings

RADIATION-SENSITIVE RESIN COMPOSITION, METHOD FOR FORMING PATTERN, AND METHOD FOR PRODUCING MONOMERIC COMPOUND

CROSS-REFERENCE TO RELATED APPLICATIONS

The present application claims priority to Japanese Patent Application No. 2020-042383, filed Mar. 11, 2020, and to Japanese Patent Application No. 2020-159868, filed Sep. 24, 2020. The contents of these applications are incorporated herein by reference in their entirety.

BACKGROUND OF THE INVENTION

Field of the Invention

The present invention relates to a radiation-sensitive resin composition, a method for forming a pattern, and a method for producing a monomeric compound.

Description of the Related Art

A photolithography technology using a resist composition has been used for the fine circuit formation in a semiconductor device. As the representative procedure, for example, a resist pattern is formed on a substrate by generating an acid by irradiating the coating of the resist composition with a radioactive ray through a mask pattern, and then reacting in the presence of the acid as a catalyst to generate the difference of solubility of a resin into an alkaline or organic developer between an exposed part and a non-exposed part.

In the above-described photolithography technology, the micronization of the pattern is promoted by using a short wavelength radioactive ray such as an ArF excimer laser or by using such a radioactive ray and an immersion exposure method (liquid immersion lithography) in combination. As a next-generation technology, a shorter wavelength radioactive ray such as an electron beam, an X ray, or EUV (extreme-ultraviolet ray) is tried to be used, and a resist material containing a styrene-based resin having an enhanced efficiency of absorbing such a radioactive ray is being studied (see, Japanese Patent No. 4958584).

SUMMARY OF THE INVENTION

According to an aspect of the present invention, a radiation-sensitive resin composition includes: a resin including a structural unit A represented by formula (1); at least one radiation-sensitive acid generator selected from the group consisting of a radiation-sensitive acid generator represented by formula (2-1) and a radiation-sensitive acid generator represented by formula (2-2); and a solvent.

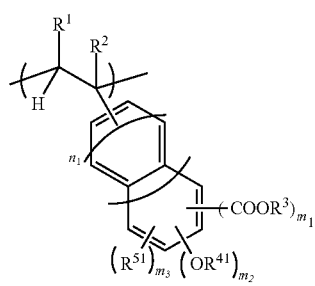

(1)

$R^1$ and $R^2$ are each independently a hydrogen atom, a fluorine atom, a methyl group, or a trifluoromethyl group; $R^3$ is an acid-dissociable group or a non-acid-dissociable group, provided that when one $R^3$ is present, the $R^3$ is an acid-dissociable group and when two or more $R^3$s are present, at least one of the two or more $R^3$s is an acid-dissociable group, and when two or more $R^3$s are present, the two or more $R^3$s are the same or different from each other; $R^{41}$ is a hydrogen atom or a protective group to be deprotected by action of an acid, and when two or more $R^{41}$s are present, the two or more $R^{41}$s are the same or different from each other; $R^{51}$ is a cyano group, a nitro group, an alkyl group, a fluorinated alkyl group, an alkoxycarbonyloxy group, an acyl group, or an acyloxy group, and when two or more $R^{51}$s are present, the two or more $R^{51}$s are the same or different from each other; and $n_1$ is an integer of 0 to 2, $m_1$ is an integer of 1 to 8, $m_2$ is an integer of 1 to 8, and $m_3$ is an integer of 0 to 6, provided that $n_1$, $m_1$, $m_2$, and $m_3$ satisfy $2 \leq m_1 + m_2 + m_3 \leq 2n_1 + 5$.

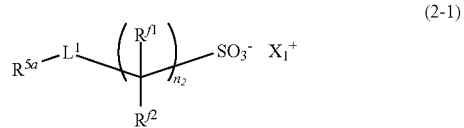

(2-1)

(2-2)

In the formula (2-1), $n_2$ is an integer of 1 to 5; $R^{f1}$ and $R^{f2}$ are each independently a hydrogen atom, a fluorine atom, or a fluoroalkyl group, provided that when $n_2$ is 1, at least one of $R^{f1}$ and $R^{f2}$ is a fluorine atom or a fluoroalkyl group and when $n_2$ is 2 to 5, at least one of two or more $R^{f1}$s and two or more $R^{f2}$s is a fluorine atom or a fluoroalkyl group, the two or more $R^{f1}$s are the same or different from each other, and the two or more $R^{f2}$s are the same or different from each other; $L_1$ is a divalent linking group; $R^{5a}$ is a monovalent organic group having a cyclic structure; and $x_1^+$ is a monovalent onium cation. In the formula (2-2), $R^{5b}$ is a monovalent organic group; and $X_2^+$ is a monovalent onium cation whose atom having a positive charge is not an atom forming a cyclic structure.

According to another aspect of the present invention, a method for forming a pattern includes applying the radiation-sensitive resin composition directly or indirectly onto a substrate to form a resist film. The resist film is exposed. The exposed resist film is developed with a developer.

According to a further aspect of the present invention, a method for producing a monomeric compound includes reacting a formylhydroxy aromatic carboxylic acid and an alcohol having an acid-dissociable group structure to synthesize an ester body. The method further includes, in any order: protecting a hydroxyl group of the ester body; and converting a formyl group of the ester body to an alkene.

DETAILED DESCRIPTION OF THE PREFERRED EMBODIMENTS

In the above-described next-generation technology, various resist performances, such as sensitivity, critical dimension uniformity (CDU) performance as an indicator of uniformity of line width and hole diameter, and resolution, equal to or higher than ever before are required. However, such characteristics of existing radiation-sensitive resin compositions are not at adequate levels.

An embodiment of the present invention relates to a radiation-sensitive resin composition including:

a resin containing a structural unit A represented by the following formula (1);

at least one radiation-sensitive acid generator selected from the group consisting of a radiation-sensitive acid generator represented by the following formula (2-1) and a radiation-sensitive acid generator represented by the following formula (2-2); and a solvent:

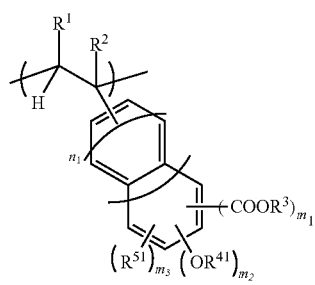

(1)

(wherein $R^1$ and $R^2$ are each independently a hydrogen atom, a fluorine atom, a methyl group, or a trifluoromethyl group, $R^3$ is an acid-dissociable group or a non-acid-dissociable group, provided that when one $R^3$ is present, the $R^3$ is an acid-dissociable group and when two or more $R^3$s are present, at least one of the two or more $R^3$s is an acid-dissociable group, and when two or more $R^3$s are present, the two or more $R^3$s are the same or different from each other, $R^{41}$ is a hydrogen atom or a protective group to be deprotected by action of an acid, and when two or more $R^{41}$s are present, the two or more $R^{41}$s are the same or different from each other, $R^{51}$ is a cyano group, a nitro group, an alkyl group, a fluorinated alkyl group, an alkoxycarbonyloxy group, an acyl group, or an acyloxy group, and when two or more $R^{31}$s are present, the two or more $R^{51}$s are the same or different from each other, and $n_1$ is an integer of 0 to 2, $m_1$ is an integer of 1 to 8, $m_2$ is an integer of 1 to 8, and $m_3$ is an integer of 0 to 6, provided that $n_1$, $m_1$, $m_2$, and $m_3$ satisfy $2 \leq m_1 + m_2 + m_3 \leq 2n_1 + 5$);

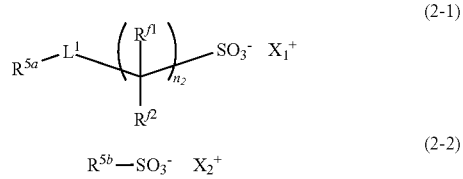

(2-1)

(2-2)

(wherein in the above formula (2-1), $n_2$ is an integer of 1 to 5, $R^{f1}$ and $R^{f2}$ are each independently a hydrogen atom, a fluorine atom, or a fluoroalkyl group, provided that when $n_2$ is 1, at least one of $R^{f1}$ and $R^{f2}$ is a fluorine atom or a fluoroalkyl group and when $n_2$ is 2 to 5, at least one of two or more $R^{f1}$s and two or more $R^{f2}$s is a fluorine atom or a fluoroalkyl group, the two or more $R^{f1}$s are the same or different from each other, and the two or more $R^{f2}$s are the same or different from each other, $L^1$ is a divalent linking group, $R^{5a}$ is a monovalent organic group having a cyclic structure, $X_1^+$ is a monovalent onium cation;

in the above formula (2-2), $R^{5b}$ is a monovalent organic group, and $X_2^+$ is a monovalent onium cation whose atom having a positive charge is not an atom forming a cyclic structure).

The radiation-sensitive resin composition contains the resin containing a structural unit A, and therefore can exhibit sensitivity, CDU performance, and resolution at adequate levels. The reason for this is not clear, but can be expected as follows. In the structural unit A, a phenolic hydroxyl group or a protective structure that generates a phenolic hydroxyl group by the action of an acid and an acid-dissociable group coexist. The presence of the former improves energy absorption efficiency during exposure so that acid generation efficiency increases, and the presence of the latter increases the contrast between an exposed part and a non-exposed part. On the other hand, in the case of a conventional resin containing a structural unit having a phenolic hydroxyl group or a protective structure that generates a phenolic hydroxyl group by the action of an acid and a structural unit having an acid-dissociable group, an increase in the content of one of the structural units relatively decreases the content of the other structural unit, and accordingly, the effect of function based on one of the structural units increases but the effect of function based on the other structural unit decreases, that is, they are in a trade-off relationship. However, the resin in the radiation-sensitive resin composition contains the structural unit A having the characteristics of both the structural units, and therefore a synergistic effect obtained by this improves sensitivity and CDU performance. Further, when a carboxyl group is generated from the acid-dissociable group by the action of an acid, the phenolic hydroxyl group and the carboxyl group coexist in the structural unit A. This enhances the solubility of the resin in an alkaline developer so that resolution can be improved.

It is to be noted that the term "acid-dissociable group" refers to a group that substitutes for a hydrogen atom of an alkali-soluble group such as an carboxyl group, a phenolic hydroxyl group, a sulfo group, or a sulfonamide group and that dissociates due to the action of an acid. Therefore, the acid-dissociable group bonds to an oxygen atom that has been bonded to the hydrogen atom in such a functional group. The term "organic group" refers to a group having at least one carbon atom.

Another embodiment of the present invention relates to a method for forming a pattern, including the steps of:

applying the radiation-sensitive resin composition onto a substrate directly or indirectly to form a resist film;

exposing the resist film; and developing the exposed resist film with a developer.

The method for forming a pattern uses the radiation-sensitive resin composition excellent in sensitivity, CDU performance, and resolution, and therefore a high-quality resist pattern can efficiently be formed by lithography using a next-generation exposure technology.

Yet another embodiment of the present invention relates to a method for producing a monomeric compound, including the step of reacting a formylhydroxy aromatic carboxylic acid and an alcohol having an acid-dissociable group structure to synthesize an ester body, the method further including in any order the step of protecting a hydroxyl group of the ester body and the step of converting a formyl group of the ester body into an alkene.

The production method makes it possible to efficiently produce a monomeric compound suitable for preparing a resin of the radiation-sensitive resin composition.

Hereinbelow, embodiments of the present invention will be described in detail, but the present invention is not limited to these embodiments.

<<Radiation-Sensitive Resin Composition>>

A radiation-sensitive resin composition according to the present embodiment (hereinafter, also simply referred to as a "composition") contains a resin, a radiation-sensitive acid generator, and a solvent. The composition may contain another optional component as long as the effects of the present invention are not impaired.

<Resin>

The resin is an assembly of polymers containing a structural unit A (hereinafter, this resin is also referred to as a "base resin"). The base resin may contain, in addition to the structural unit A, a structural unit B derived from a (meth) acrylic ester-based monomer, a structural unit C having a phenolic hydroxyl group, a structural unit D having a polar group, a structural unit E containing a lactone structure, and the like. Hereinbelow, each of the structural units will be described.

(Structural Unit A)

The structural unit A is represented by the following formula (1).

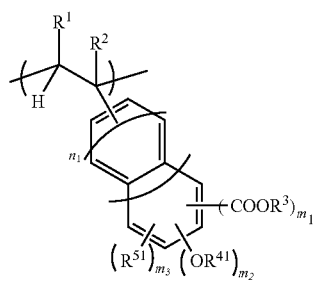

In the above formula (1), $R^1$ and $R^2$ are each independently a hydrogen atom, a fluorine atom, a methyl group, or a trifluoromethyl group.

$R^3$ is an acid-dissociable group or a non-acid-dissociable group. However, when one $R^3$ is present, the $R^3$ is an acid-dissociable group and when two or more $R^3$s are present, at least one of the two or more $R^3$s is an acid-dissociable group. When two or more $R^3$s are present, the two or more $R^3$s are the same or different from each other.

$R^{41}$ is a hydrogen atom or a protective group to be deprotected by action of an acid. When two or more $R^{41}$s are present, the two or more $R^{41}$s are the same or different from each other.

$R^{51}$ is a cyano group, a nitro group, an alkyl group, a fluorinated alkyl group, an alkoxycarbonyloxy group, an acyl group, or an acyloxy group. When two or more $R^{51}$s are present, the two or more $R^{51}$s are the same or different from each other.

$n_1$ is an integer of 0 to 2, $m_1$ is an integer of 1 to 8, $m_2$ is an integer of 1 to 8, and $m_3$ is an integer of 0 to 6. However, $n_1$, $m_1$, $m_2$, and $m_3$ satisfy $2 \leq m_1+m_2+m_3 \leq 2n_1+5$.

The acid-dissociable group represented by $R^3$ is not particularly limited, and examples thereof include a structure forming a tertiary alkyl ester moiety together with —COO— to which $R^3$ bonds, a structure forming a secondary unsaturated alkyl ester moiety having a double bond between carbon atoms in β and γ positions to the terminal oxygen atom of —COO— together with —COO— to which $R^3$ bonds, and a structure forming an acetal bond together with —COO— to which $R^3$ bonds. From the viewpoint of improving the ability of the radiation-sensitive resin composition to form a pattern, the acid-dissociable group is preferably represented by the following formula (2).

In the above formula (2), $R^8$ is a monovalent hydrocarbon group having 1 to 20 carbon atoms. $R^9$ and $R^{10}$ are each independently a monovalent chain hydrocarbon group having 1 to 10 carbon atoms or a monovalent alicyclic hydrocarbon group having 3 to 20 carbon atoms or represent a divalent alicyclic group having 3 to 20 carbon atoms formed by these groups combined together and a carbon atom to which these groups are bonded. * represents a hand bonding to an oxygen atom.

Examples of the monovalent hydrocarbon group having 1 to 20 carbon atoms represented by $R^8$ include a chain hydrocarbon group having 1 to 10 carbon atoms, a monovalent alicyclic hydrocarbon group having 3 to 20 carbon atoms, and a monovalent aromatic hydrocarbon group having 6 to 20 carbon atoms.

Examples of the chain hydrocarbon group having 1 to 10 carbon atoms represented by $R^8$ to $R^{10}$ include a linear or branched saturated hydrocarbon group having 1 to 10 carbon atoms and a linear or branched unsaturated hydrocarbon group having 1 to 10 carbon atoms.

Examples of the alicyclic hydrocarbon group having 3 to 20 carbon atoms represented by $R^8$ to $R^{10}$ include a monocyclic or polycyclic saturated hydrocarbon group and a monocyclic or polycyclic unsaturated hydrocarbon group. The monocyclic saturated hydrocarbon group is preferably a cyclopentyl group, a cyclohexyl group, a cycloheptyl group, or a cyclooctyl group. The polycyclic cycloalkyl group is preferably a bridged alicyclic hydrocarbon group such as a norbornyl group, an adamantyl group, a tricyclodecyl group, or a tetracyclododecyl group. It is to be noted that the bridged alicyclic hydrocarbon group refers to a polycyclic alicyclic hydrocarbon group in which two carbon atoms that constitute an alicyclic ring and are not adjacent to each other are bonded by a bonding chain containing at least one carbon atom.

Examples of the monovalent aromatic hydrocarbon group having 6 to 20 carbon atoms represented by $R^8$ include: aryl groups such as a phenyl group, a tolyl group, a xylyl group, a naphthyl group and an anthryl group; and aralkyl groups such as a benzyl group, a phenethyl group, and a naphthylmethyl group.

The $R^8$ is preferably a linear or branched saturated hydrocarbon group having 1 to 10 carbon atoms or an alicyclic hydrocarbon group having 3 to 20 carbon atoms.

The divalent alicyclic group having 3 to 20 carbon atoms formed by $R^9$ and $R^{10}$ combined together and a carbon atom to which a chain hydrocarbon group or an alicyclic hydrocarbon group represented by $R^9$ and a chain hydrocarbon group or an alicyclic hydrocarbon group represented by $R^{10}$ are bonded is not particularly limited as long as it is a group obtained by removing two hydrogen atoms from the same carbon atom constituting a carbon ring of a monocyclic or polycyclic alicyclic hydrocarbon having the above-described carbon number. The divalent alicyclic group may be either a monocyclic hydrocarbon group or a polycyclic hydrocarbon group. The polycyclic hydrocarbon group may be either a bridged alicyclic hydrocarbon group or a condensed alicyclic hydrocarbon group. The divalent alicyclic group may be either a saturated hydrocarbon group or an unsaturated hydrocarbon group. It is to be noted that the condensed alicyclic hydrocarbon group refers to a polycyclic alicyclic hydrocarbon group in which two or more alicyclic rings share their sides (bond between adjacent two carbon atoms).

When the monocyclic alicyclic hydrocarbon group is a saturated hydrocarbon group, preferred examples thereof include a cyclopentanediyl group, a cyclohexanediyl group, a cycloheptanediyl group, and a cyclooctanediyl group. When the monocyclic alicyclic hydrocarbon group is an unsaturated hydrocarbon group, preferred examples thereof include a cyclopentenediyl group, a cyclohexenediyl group, a cycloheptenediyl group, a cyclooctenediyl group, and a cyclodecenediyl group. The polycyclic alicyclic hydrocarbon group is preferably a bridged alicyclic saturated hydrocarbon group, and preferred examples thereof include a bicyclo[2.2.1]heptane-2,2-diyl group (norbornane-2,2-diyl group), a bicyclo[2,2,2]octane-2,2-diyl group, and a tricyclo[3.3.1.1$^{3,7}$]decane-2,2-diyl group (adamantane-2,2-diyl group).

Among them, $R^8$ is preferably an alkyl group having 1 to 4 carbon atoms, and the alicyclic structure formed by $R^9$ and $R^{10}$ combined together and a carbon atom to which $R^9$ and $R^{10}$ are bonded is preferably a polycyclic or monocyclic cycloalkane structure.

Preferred examples of the acid-dissociable group include structures represented by the following formulas (3-1) to (3-8).

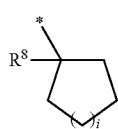

(3-1)

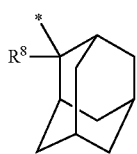

(3-2)

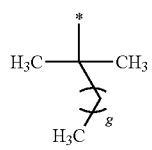

(3-3)

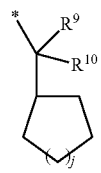

(3-4)

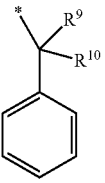

(3-5)

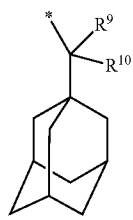

(3-6)

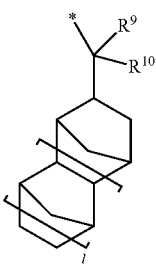

(3-7)

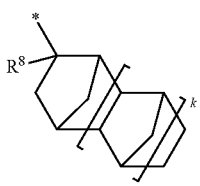

(3-8)

In the above formulas (3-1) to (3-8), $R^8$ to $R^{10}$ have the same meaning as in the above formula (2). i and j are each independently an integer of 1 to 4. g, k, and l are each 0 or 1. * represents a hand bonding to an oxygen atom.

i and j are preferably 1. $R^8$ is preferably a methyl group, an ethyl group, an isopropyl group, or a phenyl group. $R^9$ and $R^{10}$ are each preferably a methyl group or an ethyl group.

It is to be noted that when the acid-dissociable group includes a cyclic structure, part or all of the hydrogen atoms of the cyclic structure may be substituted by a substituent. Examples of the substituent include: halogen atoms such as a fluorine atom and a chlorine atom; alkyl groups such as a methyl group, an ethyl group, and a propyl group; and alkoxy groups such as a methoxy group and an ethoxy group.

In addition to or instead of the above-described acid-dissociable groups, structures represented by the following formulas (1f) to (3f) may be included as acid-dissociable groups.

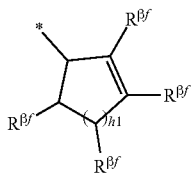

(1f)

-continued (2f)

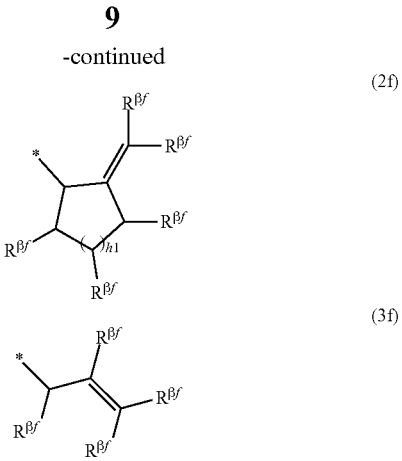

(3f)

In the above formulas (1f) to (3f), $R^{\beta f}$'s are each independently a hydrogen atom or a chain alkyl group having 1 to 5 carbon atoms. $h_1$ is an integer of 1 to 4. * represents a hand bonding to an oxygen atom.

$R^{\beta f}$ is preferably a hydrogen atom, a methyl group, or an ethyl group. $h_1$ is preferably 1 or 2.

Examples of the non-acid-dissociable group represented by $R^3$ include:

primary alkyl groups such as a methyl group, an ethyl group, and a propyl group;

secondary cycloalkyl groups such as a cyclopentyl group and a cyclohexyl group;

a tertiary cycloalkyl group such as a 1-adamantyl group;

primary cycloalkyl groups such as a cyclopentylmethyl group and a cyclohexylmethyl group;

alkoxyalkyl groups such as a methoxymethyl group, a methoxyethyl group, an ethoxymethyl group, an ethoxyethyl group, and a propoxymethyl group;

fluoroalkyl groups such as a trifluoromethyl group, a trifluoroethyl group, and a hexafluoropropyl group;

acyl groups such as an acetyl group and a propionyl group; and an aryl group such as a phenyl group. Among them, secondary cycloalkyl groups and alkoxyalkyl groups are preferred.

When one $R^3$ is present, the $R^3$ is an acid-dissociable group. When two or more $R^3$s are present, at least one of the two or more $R^3$s is an acid-dissociable group. When two or more $R^3$s are present, all the $R^3$s are preferably acid-dissociable groups. When $R^3$ is an acid-dissociable group, the resolution of a resist film can be improved. When two or more $R^3$s are present, the two or more $R^3$s are the same or different from each other, Examples of the protective group represented by $R^{41}$ to be deprotected by the action of an acid include groups represented by the following formulas (Al-1) to (AL-3).

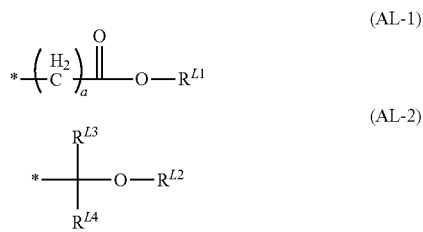

In the above formulas (AL-1) and (AL-2), $R^{L1}$ and $R^{L2}$ are each a monovalent hydrocarbon group, and may contain a hetero atom such as an oxygen atom, a sulfur atom, a nitrogen atom, or a fluorine atom. The monovalent hydrocarbon group may be linear, branched, or cyclic, and is preferably an alkyl group having 1 to 40 carbon atoms, more preferably an alkyl group having 1 to 20 carbon atoms. In the formula (AL-1), a is an integer of 0 to 10, preferably an integer of 1 to 5. In the above formulas (AL-1) to (AL-3), * represents a hand bonding to another moiety.

In the above formula (AL-2), $R^{L3}$ and $R^{L4}$ are each independently a monovalent hydrocarbon group, and may contain a hetero atom such as an oxygen atom, a sulfur atom, a nitrogen atom, or a fluorine atom. The monovalent hydrocarbon group may be linear, branched, or cyclic, and is preferably an alkyl group having 1 to 20 carbon atoms. Any two of $R^{L2}$, $R^{L3}$, and $R^{L4}$ may be bonded together to form a ring having 3 to 20 carbon atoms together with a carbon atom or a carbon atom and an oxygen atom to which they are bonded. The ring is preferably a ring having 4 to 16 carbon atoms, particularly preferably an alicyclic ring.

In the above formula (AL-3), $R^{L5}$, $R^{L6}$, and $R^{L7}$ are each independently a monovalent hydrocarbon group, and may contain a hetero atom such as an oxygen atom, a sulfur atom, a nitrogen atom, or a fluorine atom. The monovalent hydrocarbon group may be linear, branched, or cyclic, and is preferably an alkyl group having 1 to 20 carbon atoms. Any two of $R^{L5}$, $R^{L6}$, and $R^{L7}$ may be bonded together to form a ring having 3 to 20 carbon atoms together with a carbon atom to which they are bonded. The ring is preferably a ring having 4 to 16 carbon atoms, particularly preferably an alicyclic ring.

Among them, the protective group to be deprotected by the action of an acid is preferably a group represented by the above formula (AL-3).

$R^{51}$ is a cyano group, a nitro group, an alkyl group, a fluorinated alkyl group, an alkoxycarbonyloxy group, an acyl group, or an acyloxy group. Examples of the alkyl group include linear or branched alkyl groups having 1 to 8 carbon atoms, such as a methyl group, an ethyl group, and a propyl group. Examples of the fluorinated alkyl group include linear or branched fluorinated alkyl groups having 1 to 8 carbon atoms, such as a trifluoromethyl group and a pentafluoroethyl group. Examples of the alkoxycarbonyloxy group include chain or alicyclic alkoxycarbonyloxy groups having 2 to 16 carbon atoms, such as a methoxycarbonyloxy group, a butoxycarbonyloxy group, and an adamantylmethyloxycarbonyloxy group. Examples of the acyl group include aliphatic or aromatic acyl groups having 2 to 12 carbon atoms, such as an acetyl group, a propionyl group, a benzoyl group, and an acryloyl group. Examples of the acyloxy group include aliphatic or aromatic acyloxy groups having 2 to 12 carbon atoms, such as an acetyloxy group, a propionyloxy group, a benzoyloxy group, and an acryloyloxy group.

$n_1$ is an integer of 0 to 2. $n_1$ is preferably 0 or 1, more preferably 0. $m_1$ is an integer of 1 to 8. $m_1$ is preferably an integer of 1 to 3, more preferably 1 or 2. $m_2$ is an integer of 1 to 8. $m_2$ is preferably an integer of 1 to 3, more preferably

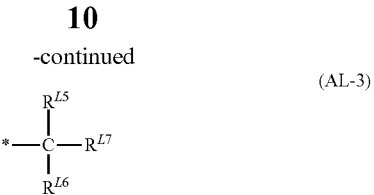

1 or 2. $m_3$ is an integer of 0 to 6. $m_3$ is preferably an integer of 0 to 2, more preferably 0 or 1.

In the above formula (1), a carbon atom to which $COOR^3$ is bonded and a carbon atom to which $OR^{41}$ is bonded are preferably adjacent to each other. This improves the acidity of COOH because COOH derived from $COOR^3$ and OH derived from $OR^{41}$ form a six-membered hydrogen bond, and therefore solubility in an alkaline developer is improved. As a result, sensitivity, CDU performance, and resolution can be exhibited at higher levels.

The structural unit A is preferably represented by any of the following formulas (A-1) to (A-39).

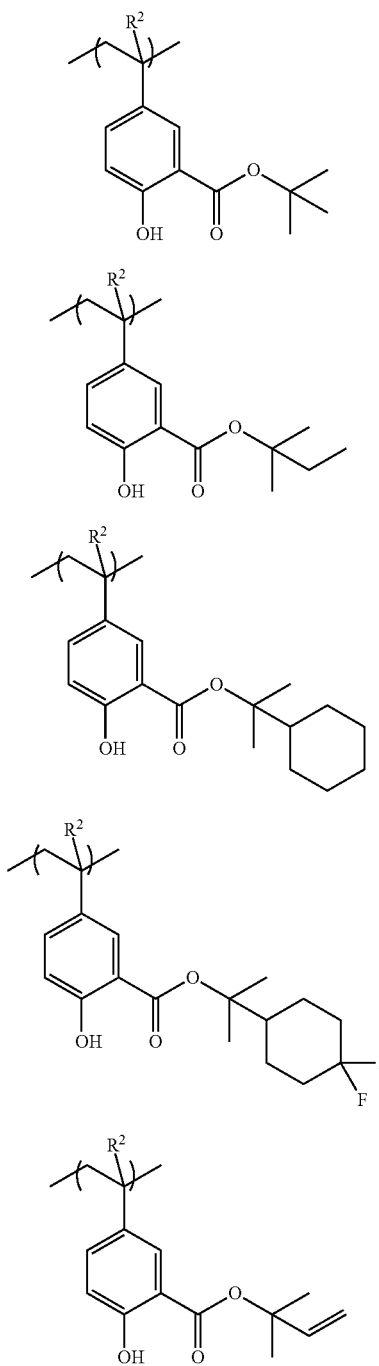
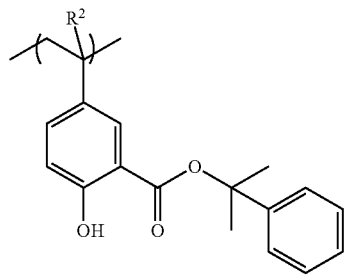
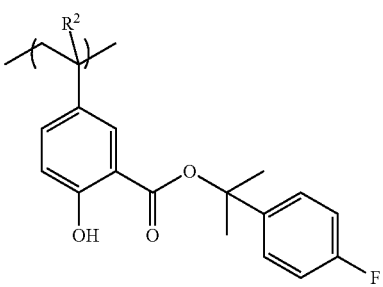
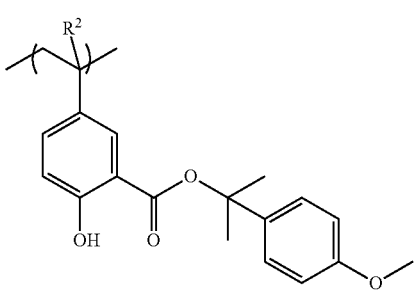
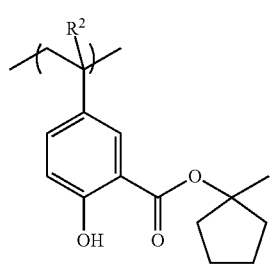
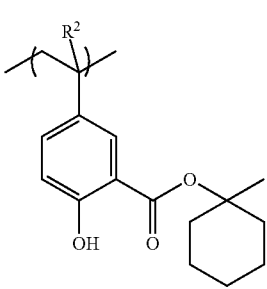

(A-11)
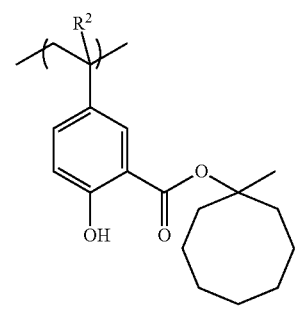
(A-12)
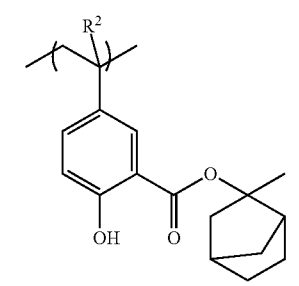
(A-13)
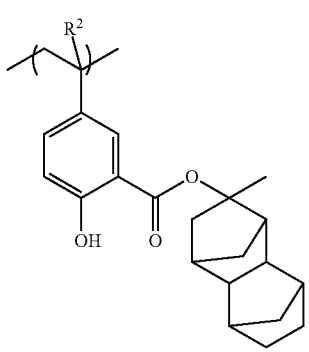
(A-14)
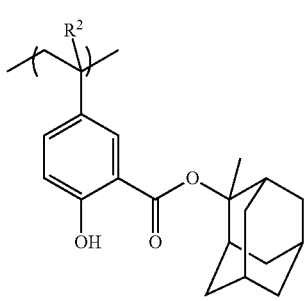
(A-15)
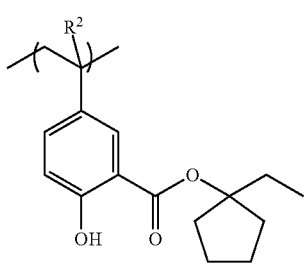
(A-16)
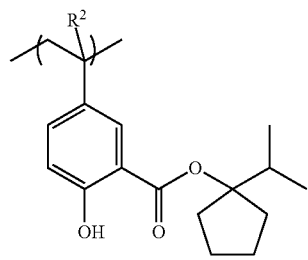
(A-17)
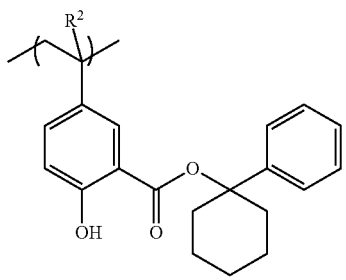
(A-18)
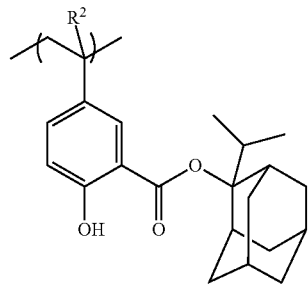
(A-19)
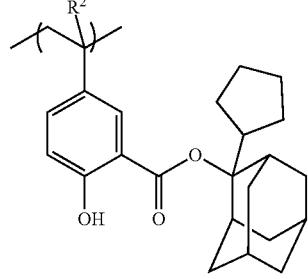
(A-20)
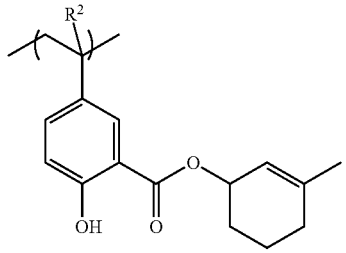
(A-21)
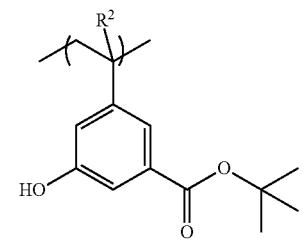

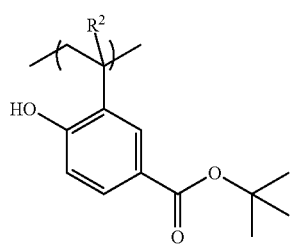 (A-22)
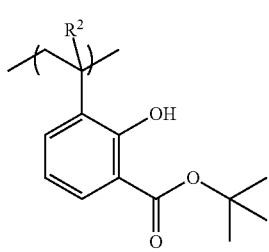 (A-23)
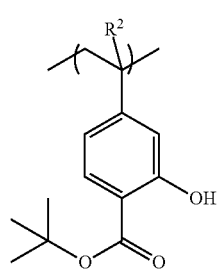 (A-24)
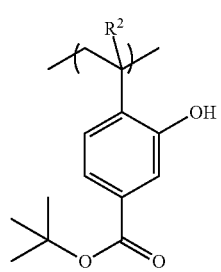 (A-25)
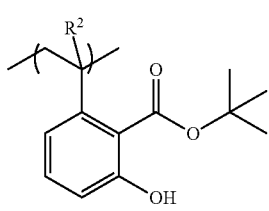 (A-26)
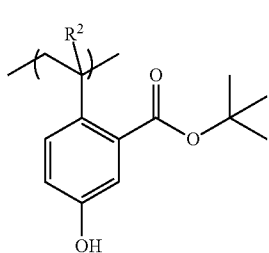 (A-27)
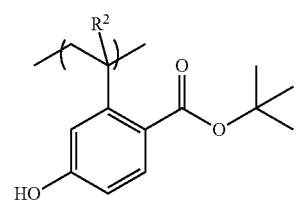 (A-28)
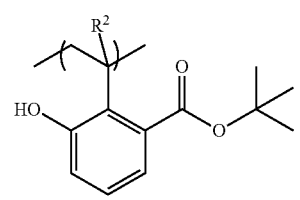 (A-29)
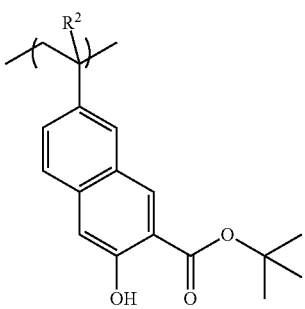 (A-30)
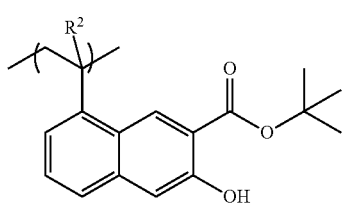 (A-31)
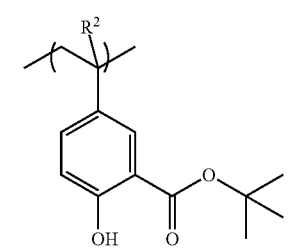 (A-32)
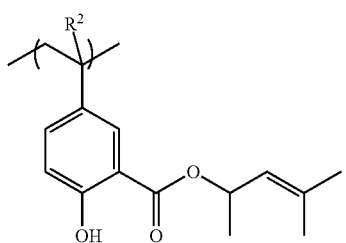 (A-33)

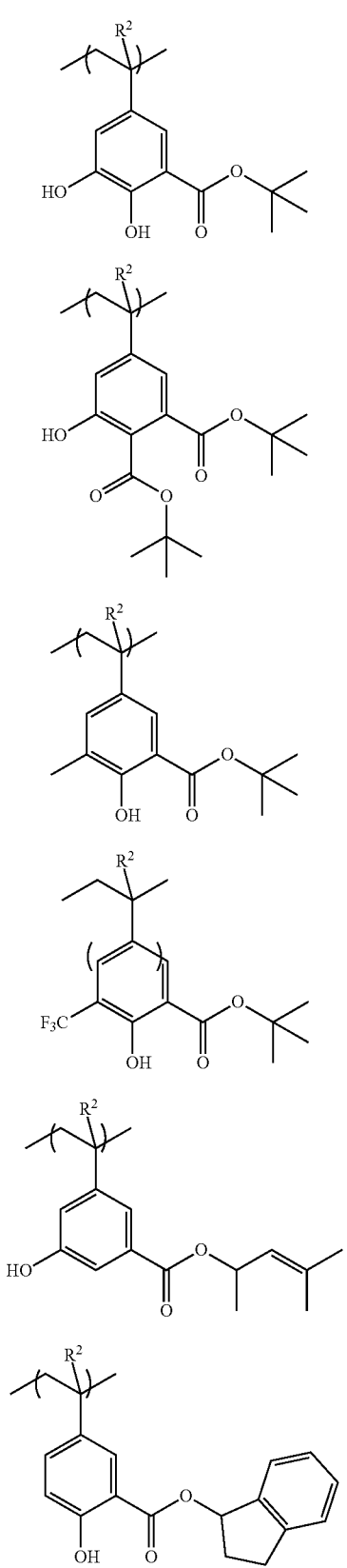

(A-34)
(A-35)
(A-36)
(A-37)
(A-38)
(A-39)

In the above formulas (A-1) to (A-39), $R^2$ has the same meaning as in the above formula (1).

Among them, structural units represented by the above formulas (A-1) to (A-9), (A-14), (A-17), (A-20), (A-21), (A-24), (A-30), (A-32), (A-34) to (A-37) are preferred.

The structural units A may be used singly or in combination of two or more of them.

When the structural unit A is obtained which is represented by the above formula (1) in which $R^{41}$ is a hydrogen atom, it is preferred that the structural unit A is obtained by polymerizing a monomeric compound whose phenolic hydroxyl group is protected by a protective group such as an alkali-dissociable group and then performing hydrolysis for deprotection. Examples of such a protective group used to give a phenolic hydroxyl group by hydrolysis include an acyl group having 2 to 20 carbon atoms and an alkoxycarbonyl group having 2 to 20 carbon atoms. Among them, an acetyl group and a tert-butoxycarbonyl group are preferred.

(Method for Producing Monomeric Compound Giving Structural Unit A)

A method for producing a monomeric compound giving a structural unit A will be described with reference to a case where a monomeric compound that corresponds to a structural unit represented by the above formula (A-1) and that has a hydroxyl group protected by an acetyl group is produced as a representative. A synthetic scheme is as follows.

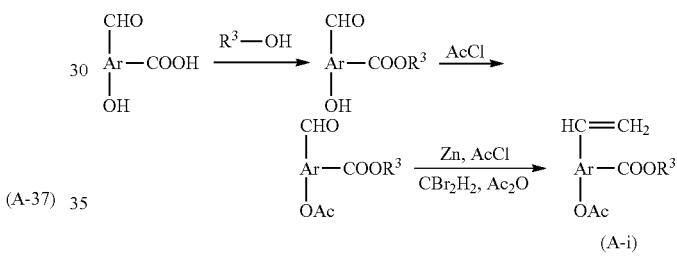

(A-i)

In the above scheme, Ar is a structure corresponding to an aromatic ring structure in the above formula (1), and $R^3$ has the same meaning as in the above formula (1).

A formylhydroxy aromatic carboxylic acid and an alcohol having an acid-dissociable group structure are reacted to synthesize an ester body having an acid-dissociable group introduced thereinto. Then, the ester body and acetyl chloride are reacted to protect a hydroxyl group, and a formyl group is further converted to an alkene by the Wittig olefination reaction in the presence of a metal complex generated from zinc and an alkyl halide. In this way, a target monomeric compound (A-i) can be synthesized. In the above scheme, after an ester body is obtained, protection of a hydroxyl group is followed by olefination of a formyl group. However, the scheme is not limited thereto, and olefination of a formyl group may be followed by protection of a hydroxyl group. Other monomeric compound structures can be synthesized by appropriately changing the structure of an aromatic ring in a compound as a stating material, the type or number of substituents (e.g., a carboxyl group, a hydroxyl group, another substituent) on the aromatic ring, the structure of an alcohol having an acid-dissociable group structure, etc.

The lower limit of a structural unit A content in the resin (when two or more kinds of structural units A are present, the structural unit A content is a total structural unit A content) is preferably 5 mol %, more preferably 7 mol %, even more preferably 10 mol % with respect to the total amount of all the structural units constituting the resin. The upper limit of the content is preferably 100 mol %, more preferably 90 mol %, even more preferably 80 mol %. When the structural unit A content is set to fall within the above range, the sensitivity, CDU performance, and resolution of the radiation-sensitive resin composition can further be improved.

(Structural Unit B)

The structural unit B is a structural unit derived from a (meth)acrylic ester-based monomer. When the base resin contains the structural unit B, the sensitivity, CDU performance, and resolution of a resist film of the radiation-sensitive resin composition can further be improved, and excellent pattern-forming performance can be achieved.

The structural unit B is preferably represented by the following formula (4).

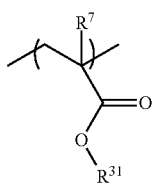

(4)

In the above formula (4), $R^7$ is a hydrogen atom, a fluorine atom, a methyl group, or a trifluoromethyl group, and $R^{31}$ is an acid-dissociable group or a non-acid-dissociable group.

Depending on the structure of $R^{31}$ in the above formula (4), the structural unit B may be a structural unit B1 having an acid-dissociable group or a structural unit B2 having a non-acid-dissociable group. When being an acid-dissociable group, $R^{31}$ is preferably an acid-dissociable group represented by the above formula (2). When $R^{31}$ is a non-acid-dissociable group, a preferred example of $R^{31}$ is a non-acid-dissociable group represented by $R^3$ in the above formula (1).

Examples of the structural unit B1 having an acid-dissociable group include structural units represented by the following formulas (4-1) to (4-6) (hereinafter, also referred to as "structural units (B1-1) to (B1-6)").

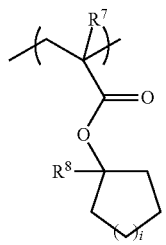

(4-1)

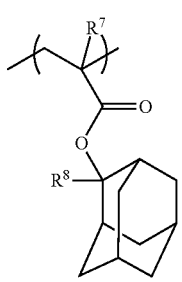

(4-2)

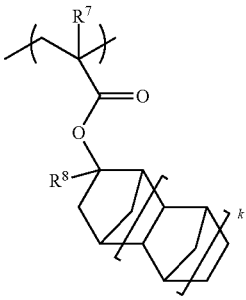

(4-3)

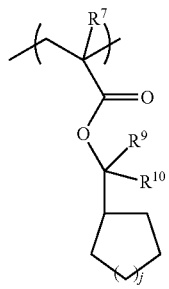

(4-4)

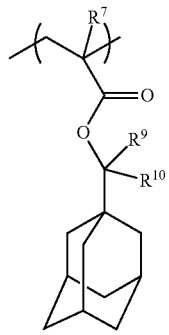

(4-5)

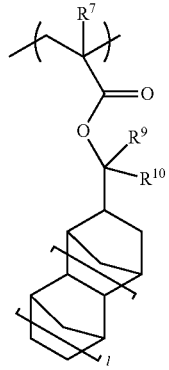

(4-6)

In the above formulas (4-1) to (4-6), $R^7$ has the same meaning as in the above formula (4), $R^8$ to $R^{10}$ have the same meaning as in the above formula (2). i and j are each independently an integer of 1 to 4. k and l are 0 or 1.

i and j are preferably 1. $R^8$ is preferably a methyl group, an ethyl group, or an isopropyl group. $R^9$ and $R^{10}$ are each preferably a methyl group or an ethyl group.

Further, the resin may contain, as the structural unit B1, structural units represented by the following formulas (4-7) to (4-9) (hereinafter, also referred to as "structural units (B1-7) to (B1-9)") in addition to or instead of the above structural units (B1-1) to (B1-6).

(4-7)

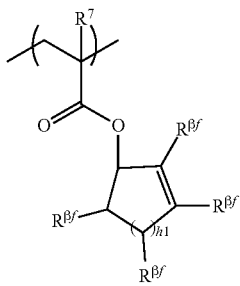

(4-8)

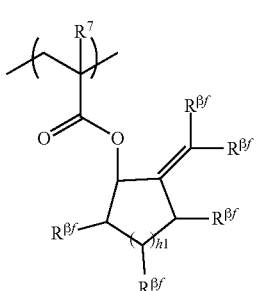

(4-9)

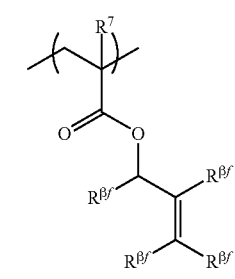

In the above formulas (4-7) to (4-9), $R^7$ has the same meaning as in the above formula (4). $R^{\beta f}$'s are each independently a hydrogen atom or a chain alkyl group having 1 to 5 carbon atoms. Two or more $R^{\beta f}$'s are the same or different from each other. $h_1$ is an integer of 1 to 4.

$R^{\beta f}$'s are each preferably a hydrogen atom, a methyl group, or an ethyl group. The $h_1$ is preferably 1 or 2. $h_1$ is preferably 1 or 2.

Examples of the structural unit B2 having a non-acid-dissociable group include structural units represented by the following formulas (4-10) to (4-11) (hereinafter, also referred to as "structural units (B2-1) to (B2-2)").

(4-10)

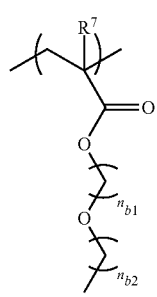

-continued (4-11)

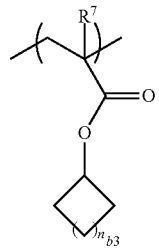

(wherein $R^7$ has the same meaning as in the above formula (4), $n_{b1}$ is an integer of 2 to 5, $n_{b2}$ is an integer of 0 to 4, and $n_{b3}$ is an integer of 0 to 5).

$R^7$ is preferably a hydrogen atom or a methyl group. $n_{b1}$ is preferably an integer of 2 to 4, more preferably 2 or 3. $n_{b2}$ is preferably an integer of 0 to 3, more preferably an integer of 0 to 2. $n_{b3}$ is preferably an integer of 1 to 4, more preferably an integer of 2 to 4.

The base resin may contain one kind of structural unit B or a combination of two or more kinds of structural units B.

When the resin contains the structural unit B, the lower limit of the content of the structural unit B (when two or more kinds of structural units B are present, the content of the structural unit B is the total content of the structural units B) is preferably 10 mol %, more preferably 15 mol %, even more preferably 20 mol %, particularly preferably 30 mol % with respect to the total amount of all the structural units constituting the base resin. The upper limit of the content is preferably 80 mol %, more preferably 70 mol %, even more preferably 65 mol %. When the content of the structural unit B is set to fall within the above range, the pattern-forming performance of the radiation-sensitive resin composition can further be improved.

(Structural Unit C)

The resin preferably further contains the structural unit C represented by the following formula (5):

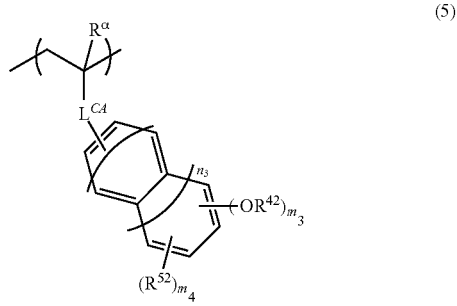

(5)

(wherein
$R^\alpha$ is a hydrogen atom, a fluorine atom, a methyl group, or a trifluoromethyl group,
$L^{CA}$ is a single bond, —COO—*, or —O—*, wherein * represents a hand bonding to an aromatic ring,
$R^{42}$ and $R^{52}$ have the same meaning as $R^{41}$ and $R^{51}$ in the above formula (1), respectively, and
$n_3$ is an integer of 0 to 2, $m_3$ is an integer of 1 to 8, and $m_4$ is an integer of 0 to 8, provided that $n_3$, $m_3$, and $m_4$ satisfy $1 \leq m_3+m_4 \leq 2n_3+5$).

The structural unit C is a structural unit that is different from the structural unit A and that contains a phenolic hydroxyl group or gives a phenolic hydroxyl group by the action of an acid. If necessary, the resin may contain the structural unit C or another structural unit to more appropriately adjust its solubility in a developer, which as a result makes it possible to further improve the sensitivity etc. of the radiation-sensitive resin composition. Further, when KrF excimer laser light, EUV, an electron beam, or the like is used as a radioactive ray for irradiation in an exposure step in a method for forming a resist pattern, the structural unit C contributes to improved etching resistance and improved difference in solubility in a developer between an exposed part and a non-exposed part (dissolution contrast). Particularly, the structural unit C is suitably used when a pattern is formed by exposure using a radioactive ray having a wavelength of 50 nm or less such as an electron beam or EUV.

From the viewpoint of copolymerizability of a monomer that gives the structural unit C, $R^\alpha$ is preferably a hydrogen atom or a methyl group.

$L^{CA}$ is preferably a single bond or —COO—*.

As the protective group represented by $R^{42}$ to be deprotected by the action of an acid, the protective group to be deprotected by the action of an acid, which has been mentioned as $R^{41}$ in the above formula (1), can suitably be used.

Similarly, as the substituent represented by $R^{52}$, the substituent that has been mentioned as $R^{51}$ in the above formula (1) can suitably be used.

$n_3$ is preferably 0 or 1, more preferably 0.

$m_3$ is preferably an integer of 1 to 3, more preferably 1 or 2.

$m_4$ is an integer of 0 to 3, more preferably an integer of 0 to 2.

Preferred examples of the structural unit C include structural units represented by the following formulas (c1-1) to (c1-10) (hereinafter, also referred to as "structural unit (C-1) to structural units (C-10)").

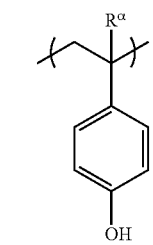
(c1-1)

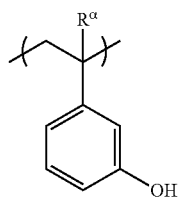
(c1-2)

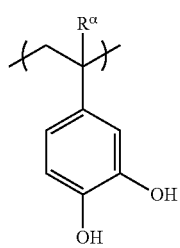
(c1-3)

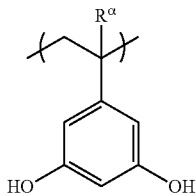
(c1-4)

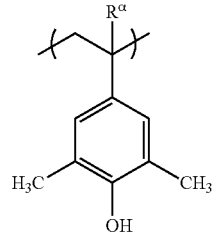
(c1-5)

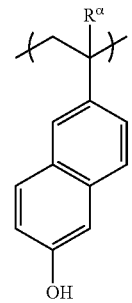
(c1-6)

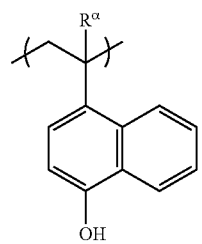
(c1-7)

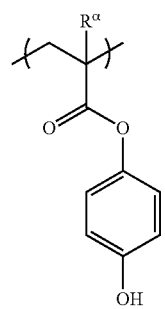
(c1-8)

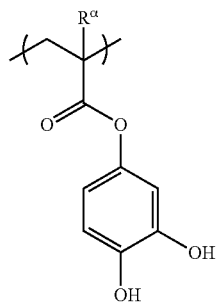
(c1-9)

-continued (c1-10)

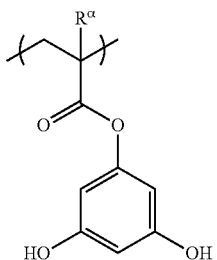

In the above formulas (c1-1) to (c1-10), $R^\alpha$ has the same meaning as in the above formula (5).

Among them, the structural units (C-1) to (C-4), (C-6), and (C-8) are preferred.

When the base resin contains the structural unit C, the lower limit of the content of the structural unit C (when two or more kinds of structural units C are present, the content of the structural unit C is the total content of the structural units C) is preferably 5 mol %, more preferably 8 mol %, even more preferably 10 mol %, particularly preferably 15 mol % with respect to the total amount of all the structural units constituting the resin. The upper limit of the content is preferably 70 mol %, more preferably 60 mol %, even more preferably 55 mol %, particularly preferably 50 mol %. When the content of the structural unit C is set to fall within the above range, the sensitivity, CDU performance, and resolution of the radiation-sensitive resin composition can further be improved.

When the structural unit C is obtained by polymerizing a monomer having a phenolic hydroxyl group such as a hydroxystyrene, it is preferred that the monomer is polymerized in a state where its phenolic hydroxyl group is protected by a protective group such as an alkali-dissociable group, and then hydrolysis is performed for deprotection.

(Structural Unit D)

If necessary, the base resin may contain the structural unit D having a polar group or an ionic functional group other than the above-described structural units A to C. Examples of the polar group include a fluorine atom, an alcoholic hydroxyl group, a carboxyl group, a cyano group, a nitro group, and a sulfonamide group. The structural unit D is preferably a structural unit having a fluorine atom, a structural unit having an alcoholic hydroxyl group, or a structural unit having a carboxyl group, more preferably a structural unit having a fluorine atom or a structural unit having an alcoholic hydroxyl group. The ionic functional group may be an anionic group or a cationic group. The anionic group is preferably a group having a sulfonate anion, and the cationic group is preferably a group having a sulfonium cation.

Examples of the structural unit D include structural units represented by the following formulas.

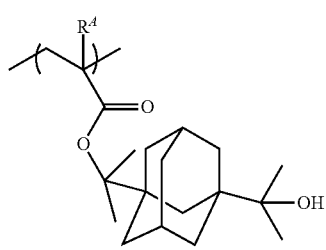

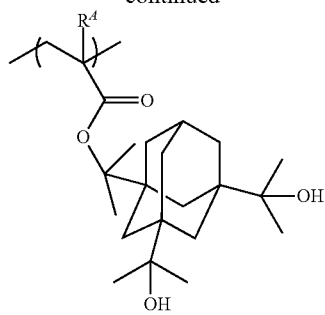

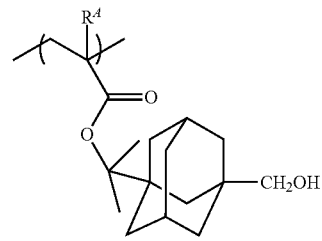

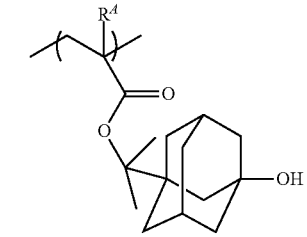

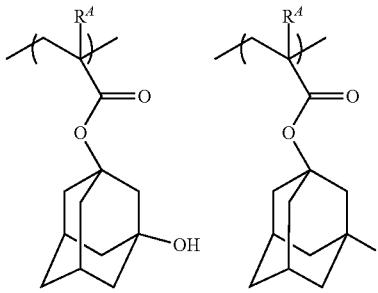

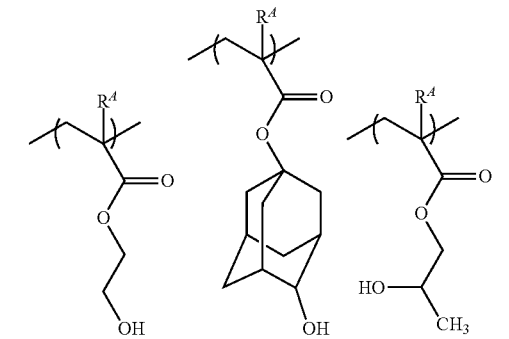

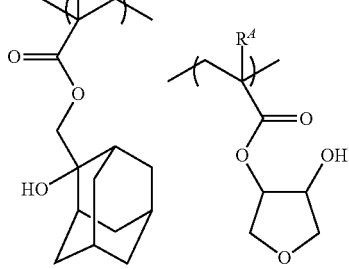

-continued

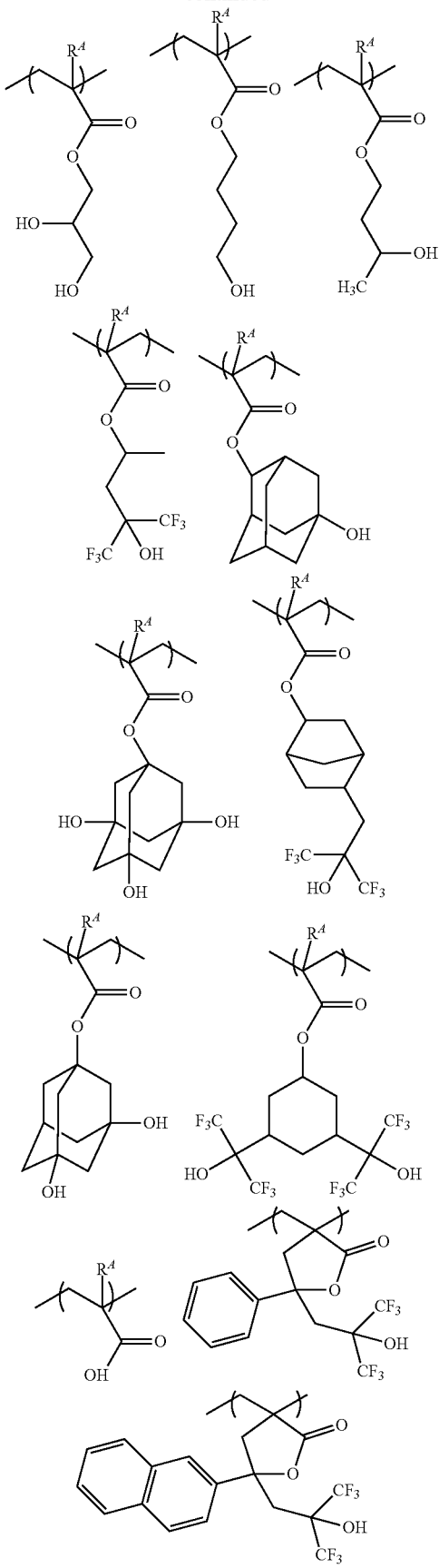

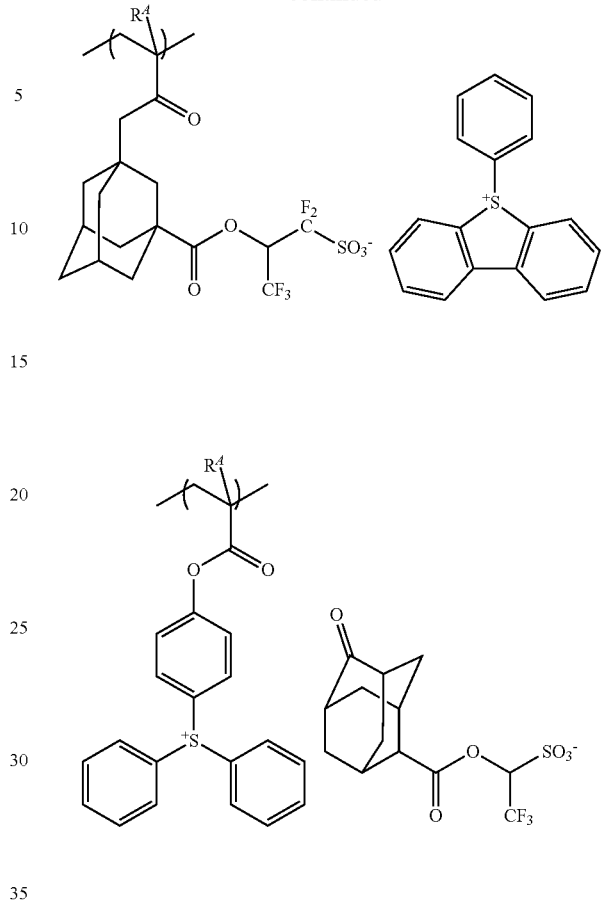

In the above formulas, $R^A$ is a hydrogen atom, a fluorine atom, a methyl group, or a trifluoromethyl group.

When the resin has the structural unit D, the lower limit of the content of the structural unit D (when two or more kinds of structural units D are present, the content of the structural unit D is the total content of the structural units D) is preferably 3 mol %, more preferably 5 mol %, even more preferably 8 mol % with respect to the total amount of all the structural units constituting the resin. On the other hand, the upper limit of the content is preferably 40 mol %, more preferably 35 mol %, even more preferably 30 mol %. When the content of the structural unit D is set to fall within the above range, solubility of the resin in a developer can be made more appropriate.

(Structural Unit E)

The structural unit E is a structural unit including at least one selected from the group consisting of a lactone structure, a cyclic carbonate structure and a sultone structure. The solubility of the base resin into a developer can be adjusted by further introducing the structural unit E. As a result, the radiation-sensitive resin composition can provide improved lithography properties such as the resolution. The adhesion between a resist pattern formed from the base resin and a substrate can also be improved.

Examples of the structural unit E include structural units represented by the following formulae (T-1) to (T-10).

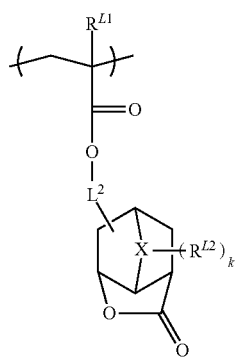
(T-1)
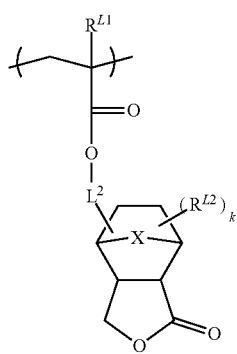
(T-2)
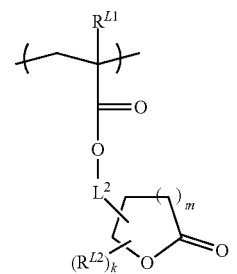
(T-3)
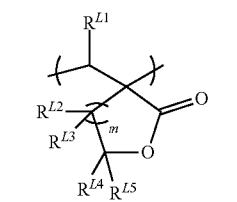
(T-4)
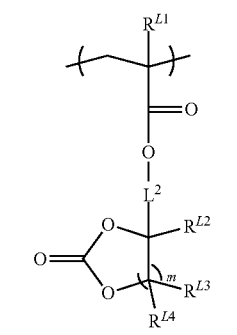
(T-5)
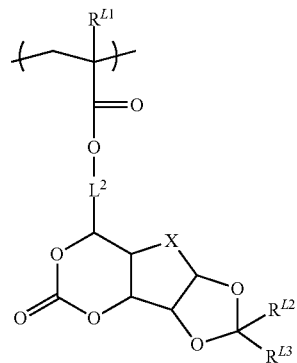
(T-6)
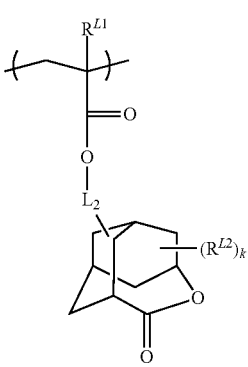
(T-7)
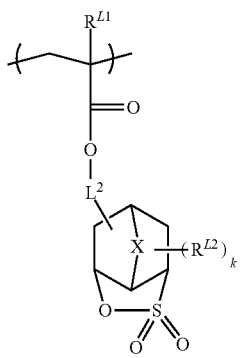
(T-8)
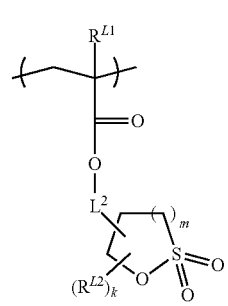
(T-9)

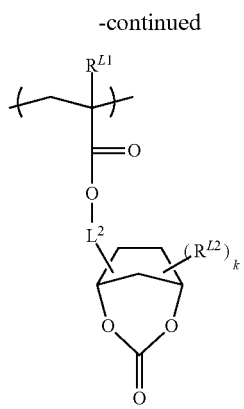

(T-10)

In the above formulae, $R^{L1}$ is a hydrogen atom, a fluorine atom, a methyl group, or a trifluoromethyl group; $R^{L2}$ to $R^{L5}$ are each independently a hydrogen atom, an alkyl group having a carbon number of 1 to 4, a cyano group, a trifluoromethyl group, a methoxy group, a methoxycarbonyl group, a hydroxy group, a hydroxymethyl group, or a dimethylamino group; $R^{L4}$ and $R^{L5}$ may be a divalent alicyclic group having a carbon number of 3 to 8, which is obtained by combining $R^{L4}$ and $R^{L5}$ with the carbon atom to which they are bound. $L^2$ is a single bond, or a divalent linking group; X is an oxygen atom or a methylene group; k is an integer of 0 to 3; and m is an integer of 1 to 3.

Example of the divalent alicyclic group having a carbon number of 3 to 8, which is composed of a combination of $R^{L4}$ and $R^{L5}$ with the carbon atom to which they are bound, includes the divalent alicyclic group having a carbon number of 3 to 8 in the divalent alicyclic group having a carbon number of 3 to 20, which is composed of a combination of the chain hydrocarbon group or the alicyclic hydrocarbon group represented by $R^9$ and $R^{10}$ in the above formula (2) with the carbon atom to which they are bound. One or more hydrogen atoms on the alicyclic group may be substituted with a hydroxy group.

Examples of the divalent linking group represented by $L^2$ as described above include a divalent straight or branched chain hydrocarbon group having a carbon number of 1 to 10; a divalent alicyclic hydrocarbon group having a carbon number of 4 to 12; and a group composed of one or more of the hydrocarbon group thereof and at least one group of —CO—, —O—, —NH— and —S—.

Among them, the structural unit E is preferably a group having a lactone structure, more preferably a group having a norbornane lactone structure, and further preferably a group derived from a norbornane lactone-yl (meth)acrylate.

The lower limit of the content by percent of the structural unit E is preferably 5 mol %, more preferably 15 mol %, and further preferably 30 mol % based on the total structural units as the component of the base resin. The upper limit of the content by percent is preferably 80 mol %, more preferably 75 mol %, and further preferably 70 mol %. By adjusting the content by percent of the structural unit (II) within the ranges, the radiation-sensitive resin composition can provide improved lithography properties such as the resolution. The adhesion between the formed resist pattern and the substrate can also be improved.

It is to be noted that the structural units B to E do not include those falling under the structural unit A.

The content of the resin is preferably 70 mass % or more, more preferably 75 mass % or more, even more preferably 80 mass % or more with respect to the total solid content of the radiation-sensitive resin composition. Here, the term "solid" refers to all components contained in the radiation-sensitive resin composition except for a solvent.

(Synthesis Method of Base Resin)

For example, the resin as a base resin can be synthesized by performing a polymerization reaction of each monomer for providing each structural unit with a radical polymerization initiator or the like in a suitable solvent.

Examples of the radical polymerization initiator include an azo-based radical initiator, including azobisisobutyronitrile (AIBN), 2,2'-azobis(4-methoxy-2,4-dimethylvaleronitrile), 2,2'-azobis(2-cyclopropylpropanenitrile), 2,2'-azobis(2,4-dimethylvaleronitrile), and dimethyl 2,2'-azobisisobutyrate; and peroxide-based radical initiator, including benzoyl peroxide, t-butyl hydroperoxide, and cumene hydroperoxide. Among them, AIBN or dimethyl 2,2'-azobisisobutyrate is preferred, and AIBN is more preferred. The radical initiator may be used alone, or two or more radical initiators may be used in combination.

Examples of the solvent used for the polymerization reaction include alkanes including n-pentane, n-hexane, n-heptane, n-octane, n-nonane, and n-decane;

cycloalkanes including cyclohexane, cycloheptane, cyclooctane, decalin, and norbornane;

aromatic hydrocarbons including benzene, toluene, xylene, ethylbenzene, and cumene;

halogenated hydrocarbons including chlorobutanes, bromohexanes, dichloroethanes, hexamethylenedibromide, and chlorobenzenes;

saturated carboxylate esters, including ethyl acetate, n-butyl acetate, i-butyl acetate, and methyl propionate;

ketones including acetone, methyl ethylketone, 4-methyl-2-pentanone, and 2-heptanone;

ethers including tetrahydrofuran, dimethoxyethanes, and diethoxyethanes; and alcohols including methanol, ethanol, 1-propanol, 2-propanol, and 4-methyl-2-pentanol. The solvent used for the polymerization reaction may be used alone, or two or more solvents may be used in combination.

The reaction temperature of the polymerization reaction is typically from 40° C. to 150° C., and preferably from 50° C. to 120° C. The reaction time is typically from 1 hour to 48 hours, and preferably from 1 hour to 24 hours.

The molecular weight of the resin as a base resin is not particularly limited, but the polystyrene-equivalent weight-average molecular weight (Mw) of the resin as measured by gel permeation chromatography (GPC) is preferably 1,000 or more and 50,000 or less, more preferably 2,000 or more and 30,000 or less, even more preferably 3,000 or more and 15,000 or less, particularly preferably 4,000 or more and 12,000 or less. If the Mw of the resin is less than the above lower limit, there is a case where the heat resistance of a resulting resist film is reduced. If the Mw of the resin exceeds the above upper limit, there is a case where the developability of a resist film is reduced.

For the base resin as a base resin, the ratio of Mw to the number average molecular weight (Mn) as determined by GPC relative to standard polystyrene (Mw/Mn) is typically not less than 1 and not more than 5, preferably not less than 1 and not more than 3, and more preferably not less than 1 and not more than 2.

The Mw and Mn of the resin in the specification are amounts measured by using Gel Permeation Chromatography (GPC) with the condition as described below.

GPC column: two G2000HXL, one G3000HXL, and one G4000HXL (all manufactured from Tosoh Corporation)

Column temperature: 40° C.
Eluting solvent: tetrahydrofuran
Flow rate: 1.0 mL/min
Sample concentration: 1.0% by mass
Sample injection amount: 100 μL
Detector: Differential Refractometer
Reference material: monodisperse polystyrene The content of the resin is preferably not less than 70% by mass, more preferably not less than 80% by mass, and further preferably not less than 85% by mass based on the total solid content of the radiation-sensitive resin composition.

<Another Resin>

The radiation-sensitive resin composition according to the present embodiment may contain, as another resin, a resin having higher content by mass of fluorine atoms than the above-described base resin (hereinafter, also referred to as a "high fluorine-containing resin). When the radiation-sensitive resin composition contains the high fluorine-containing resin, the high fluorine-containing resin can be localized in the surface layer of a resist film compared to the base resin, which as a result makes it possible to control the resist film so that the resist film can have a desired surface condition or a desired component distribution.

The high fluorine-containing resin preferably has, for example, the structural units A to C contained in the base resin and a structural unit represented by the following formula (6) (hereinafter, also referred to as a "structural unit G"), if necessary.

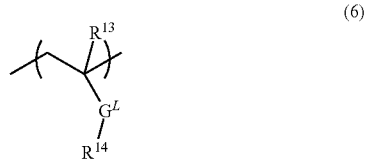

(6)

In the above formula (6), $R^{13}$ is a hydrogen atom, a methyl group, or a trifluoromethyl group; G is a single bond, an oxygen atom, a sulfur atom, —COO—, —SO$_2$ONH—, —CONH—, or —OCONH—; $R^{14}$ is a monovalent fluorinated chain hydrocarbon group having a carbon number of 1 to 20, or a monovalent fluorinated alicyclic hydrocarbon group having a carbon number of 3 to 20.

As $R^{13}$ as described above, in terms of the copolymerizability of monomers resulting in the structural unit G, a hydrogen atom or a methyl group is preferred, and a methyl group is more preferred.

As $G^L$ as described above, in terms of the copolymerizability of monomers resulting in the structural unit G, a single bond or —COO— is preferred, and —COO— is more preferred.

Example of the monovalent fluorinated chain hydrocarbon group having a carbon number of 1 to 20 represented by $R^{14}$ as described above includes a group in which a part of or all of hydrogen atoms in the straight or branched chain alkyl group having a carbon number of 1 to 20 is/are substituted with a fluorine atom.

Example of the monovalent fluorinated alicyclic hydrocarbon group having a carbon number of 3 to 20 represented by $R^{14}$ as described above includes a group in which a part of or all of hydrogen atoms in the monocyclic or polycyclic hydrocarbon group having a carbon number of 3 to 20 is/are substituted with a fluorine atom.

The $R^{14}$ as described above is preferably a fluorinated chain hydrocarbon group, more preferably a fluorinated alkyl group, and further preferably 2,2,2-trifluoroethyl group, 1,1,1,3,3,3-hexafluoropropyl group and 5,5,5-trifluoro-1,1-diethylpentyl group.

When the high fluorine-containing resin has the structural unit G, the lower limit of the content of the structural unit G is preferably 10 mol %, more preferably 15 mol %, even more preferably 20 mol %, particularly preferably 25 mol % with respect to the total amount of all the structural units constituting the high fluorine-containing resin. The upper limit of the content is preferably 60 mol %, more preferably 50 mol %, even more preferably 40 mol %. When the content of the structural unit G is set to fall within the above range, the content by mass of fluorine atoms of the high fluorine-containing resin can more appropriately be adjusted to further promote the localization of the high fluorine-containing resin in the surface layer of a resist film.

The high fluorine-containing resin may have a fluorine atom-containing structural unit represented by the following formula (f-1) (hereinafter, also referred to as a "structural unit H") in addition to the structural unit G. When the high fluorine-containing resin has the structural unit H, solubility in an alkaline developing solution is improved, and therefore generation of development defects can be prevented.

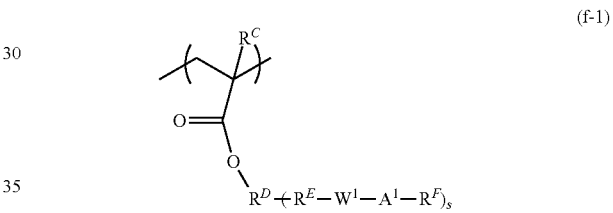

(f-1)

The structural unit H is classified into two groups: a unit having an alkali soluble group (x); and a unit having a group (y) in which the solubility into the alkaline developing solution is increased by the dissociation by alkali (hereinafter, simply referred as an "alkali-dissociable group"). In both cases of (x) and (y), $R^C$ in the above formula (f-1) is a hydrogen atom, a fluorine atom, a methyl group, or a trifluoromethyl group; $R^D$ is a single bond, a hydrocarbon group having a carbon number of 1 to 20 with the valency of (s+1), a structure in which an oxygen atom, a sulfur atom, —NR$^{dd}$—, a carbonyl group, —COO— or —CONH— is connected to the terminal on $R^E$ side of the hydrocarbon group, or a structure in which a part of hydrogen atoms in the hydrocarbon group is substituted with an organic group having a hetero atom; $R^{dd}$ is a hydrogen atom, or a monovalent hydrocarbon group having a carbon number of 1 to 10; and s is an integer of 1 to 3.

When the structural unit H has the alkali soluble group (x), $R^F$ is a hydrogen atom; $A^1$ is an oxygen atom, —COO—* or —SO$_2$O—*; * refers to a bond to $R^F$; $W^1$ is a single bond, a hydrocarbon group having a carbon number of 1 to 20, or a divalent fluorinated hydrocarbon group. When $A^1$ is an oxygen atom, $W^1$ is a fluorinated hydrocarbon group having a fluorine atom or a fluoroalkyl group on the carbon atom connecting to $A^1$. $R^E$ is a single bond, or a divalent organic group having a carbon number of 1 to 20. When s is 2 or 3, a plurality of $R^E$, $W^1$, $A^1$ and $R^F$ may be each identical or different. The affinity of the high fluorine-containing resin into the alkaline developing solution can be improved by including the structural unit H having the alkali soluble group (x), and thereby prevent from generating the development defect. As the structural unit H having the alkali soluble group (x), particularly preferred is a structural unit in which $A^1$ is an oxygen atom and $W^1$ is a 1,1,1,3,3,3-hexafluoro-2,2-methanediyl group.

When the structural unit H has the alkali-dissociable group (y), $R^F$ is a monovalent organic group having carbon number of 1 to 30; $A^1$ is an oxygen atom, —$NR^{aa}$—, —COO—*, or —$SO_2O$—*; $R^{aa}$ is a hydrogen atom, or a monovalent hydrocarbon group having a carbon number of 1 to 10; * refers to a bond to $R^F$; $W^1$ is a single bond, or a divalent fluorinated hydrocarbon group having a carbon number of 1 to 20; $R^E$ is a single bond, or a divalent organic group having a carbon number of 1 to 20. When $A^1$ is —COO—* or —$SO_2O$—*, $W^1$ or $R^F$ has a fluorine atom on the carbon atom connecting to $A^1$ or on the carbon atom adjacent to the carbon atom. When $A^1$ is an oxygen atom, $W^1$ and $R^E$ are a single bond; $R^D$ is a structure in which a carbonyl group is connected at the terminal on $R^E$ side of the hydrocarbon group having a carbon number of 1 to 20; and $R^F$ is an organic group having a fluorine atom. When s is 2 or 3, a plurality of $R^E$, $W^1$, $A^1$ and $R^F$ may be each identical or different. The surface of the resist film is changed from hydrophobic to hydrophilic in the alkaline developing step by including the structural unit H having the alkali-dissociable group (y). As a result, the affinity of the high fluorine-containing resin into the alkaline developing solution can be significantly improved, and thereby prevent from generating the development defect more efficiently. As the structural unit H having the alkali-dissociable group (y), particularly preferred is a structural unit in which $A^1$ is —COO—*, and $R^F$ or $W^1$, or both is/are a fluorine atom.

In terms of the copolymerizability of monomers resulting in the structural unit H, $R^C$ is preferably a hydrogen atom or a methyl group, and more preferably a methyl group.

When $R^E$ is a divalent organic group, $R^E$ is preferably a group having a lactone structure, more preferably a group having a polycyclic lactone structure, and further preferably a group having a norbornane lactone structure.

When the high fluorine-containing resin has the structural unit H, the lower limit of the content of the structural unit H is preferably 10 mol %, more preferably 20 mol %, even more preferably 30 mol %, particularly preferably 35 mol % with respect to the total amount of all the structural units constituting the high fluorine-containing resin. The upper limit of the content is preferably 90 mol %, more preferably 75 mol %, even more preferably 60 mol %. When the content of the structural unit H is set to fall within the above range, water repellency of a resist film during immersion exposure can further be improved.

The lower limit of Mw of the high fluorine-containing resin is preferably 1,000, more preferably 2,000, further preferably 3,000, and particularly preferably 5,000. The upper limit of Mw is preferably 50,000, more preferably 30,000, further preferably 20,000, and particularly preferably 15,000.

The lower limit of the Mw/Mn of the high fluorine-containing resin is typically 1, and more preferably 1.1. The upper limit of the Mw/Mn is typically 5, preferably 3, more preferably 2, and further preferably 1.7.

The lower limit of the content of the high fluorine-containing resin is preferably 0.1% by mass, more preferably 0.5% by mass, further preferably 1% by mass, and even further preferably 1.5% by mass based on the total solid content of the radiation-sensitive resin composition. The upper limit of the content is preferably 20% by mass, more preferably 15% by mass, further preferably 10% by mass, and particularly preferably 7% by mass.

The lower limit of the content of the high fluorine-containing resin is preferably 0.1 part by mass, more preferably 0.5 part by mass, further preferably 1 part by mass, and particularly preferably 1.5 part by mass based on 100 parts by mass of total base resins. The upper limit of the content is preferably 15 parts by mass, more preferably 10 parts by mass, further preferably 8 parts by mass, and particularly preferably 5 parts by mass.

When the content of the high fluorine-containing resin is set to fall within the above range, the high fluorine-containing resin can more effectively be localized in the surface layer of a resist film, which as a result makes it possible to prevent elution of the upper portion of a pattern during development to enhance the rectangularity of the pattern. The radiation-sensitive resin composition may contain one kind of high fluorine-containing resin or two or more kinds of high fluorine-containing resin.

(Method for Synthesizing High Fluorine-Containing Resin)

The high fluorine-containing resin can be synthesized by a method similar to the above-described method for synthesizing a base resin.

<Radiation-Sensitive Acid Generator>

The radiation-sensitive resin composition contains at least one selected from the group consisting of a radiation-sensitive acid generator having a cyclic structure at its terminal (hereinafter also referred to as a "radiation-sensitive acid generator 1") and a radiation-sensitive acid generator having a monovalent onium cation whose atom having a positive charge is not an atom forming a cyclic structure (hereinafter also referred to as a "radiation-sensitive acid generator 2"). The radiation-sensitive acid generator contained in the radiation-sensitive resin composition may be in the form of a low-molecular compound present alone, in the form of part incorporated into the polymer, or in both forms, but is preferably in the form of a low-molecular compound present alone.

(Radiation-Sensitive Acid Generator 1)

The radiation-sensitive acid generator 1 is represented by the following formula (2-1).

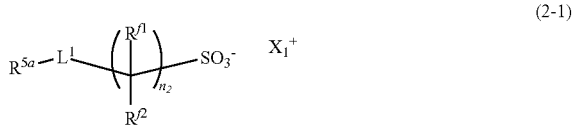

(2-1)

In the above formula (2-1), $n_2$ is an integer of 1 to 5.

$R^{f1}$ and $R^{f2}$ are each independently a hydrogen atom, a fluorine atom, or a fluoroalkyl group. However, when $n_2$ is 1, at least one of $R^{f1}$ and $R^{f2}$ is a fluorine atom or a fluoroalkyl group. When $n_2$ is 2 to 5, at least one of two or more $R^{f1}$ and two or more $R^{f2}$ is a fluorine atom or a fluoroalkyl group, the two or more $R^{f1}$s are the same or different from each other, and the two or more $R^{f2}$s are the same or different from each other.

$L^1$ is a divalent linking group.

$R^{5a}$ is a monovalent organic group having a cyclic structure.

$X_1^+$ is a monovalent onium cation.

In the above formula (2-1), $n_2$ is preferably an integer of 1 to 4, more preferably an integer of 1 to 3, even more preferably 1 or 2.

Examples of the fluoroalkyl group represented by $R^{f1}$ and $R^{f2}$ in the above formula (2-1) include fluoroalkyl groups having 1 to 20 carbon atoms. $R^{f1}$ and $R^{f2}$ are each preferably a fluorine atom or a fluoroalkyl group, more preferably a fluorine atom or a perfluoroalkyl group, even more preferably a fluorine atom or a trifluoromethyl group, particularly preferably a fluorine atom.

The divalent linking group represented by $L^1$ in the above formula (2-1) is, for example, one kind of group selected from among a divalent linear or branched hydrocarbon group having 1 to 10 carbon atoms, a divalent alicyclic hydrocarbon group having 4 to 12 carbon atoms, —CO—, —O—, —NH—, —S—, and a cyclic acetal structure or a group formed by combining two or more of these groups.

Examples of the divalent linear or branched hydrocarbon group having 1 to 10 carbon atoms include a methanediyl group, an ethanediyl group, a propanediyl group, a butanediyl group, a hexanediyl group, and an octanediyl group. Among them, an alkanediyl group having 1 to 8 carbon atoms is preferred.

Examples of the divalent alicyclic hydrocarbon group having 4 to 12 carbon atoms include: monocyclic cycloalkanediyl groups such as a cyclopentanediyl group and a cyclohexanediyl group; polycyclic cycloalkanediyl groups such as a norbornanediyl group and a adamantanediyl group. Among them, a cycloalkanediyl group having 5 to 12 carbon atoms is preferred.

Examples of the monovalent organic group having a cyclic structure represented by $R^{5a}$ include a monovalent group containing an alicyclic structure having 5 or more ring atoms, a monovalent group containing an aliphatic heterocyclic structure having 5 or more ring atoms, a monovalent group containing an aromatic ring structure having 6 or more ring atoms, and a monovalent group containing an aromatic heterocyclic structure having 5 or more ring atoms. The radiation-sensitive acid generator according to the present embodiment also includes the radiation-sensitive acid generator 1 represented by the above formula (2-1) incorporated as part of the polymer by bonding to the polymer at the monovalent organic group represented by $R^{5a}$.

Examples of the alicyclic structure having 5 or more ring atoms include:

monocyclic cycloalkane structures such as a cyclopentane structure, a cyclohexane structure, a cycloheptane structure, a cyclooctane structure, a cyclononane structure, a cyclodecane structure, and a cyclododecane structure;

monocyclic cycloalkene structures such as a cyclopentene structure, a cyclohexene structure, a cycloheptene structure, a cyclooctene structure, and a cyclodecene structure;

polycyclic cycloalkane structures such as a norbornane structure, an adamantane structure, a tricyclodecane structure, and a tetracyclododecane structure; and polycyclic cycloalkene structures such as a norbornene structure and a tricyclodecene structure.

Examples of the aliphatic heterocyclic structure having 5 or more ring atoms include:

lactone structures such as a pentanolactone structure, a hexanolactone structure, and a norbornanelactone structure;

sultone structures such as a pentanosultone structure, a hexanosultone structure, and a norbornanesultone structure;

oxygen atom-containing heterocyclic structures such as an oxacyclopentane structure, an oxacycloheptane structure, and an oxanorbornane structure;

nitrogen atom-containing heterocyclic structures such as an azacyclopentane structure, an azacyclohexane structure, and diazabicyclooctane structure; and sulfur atom-containing heterocyclic structures such as a thiacyclopentane structure, a thiacyclohexane structure, and a thianorbornane structure.

Examples of the aromatic ring structure having 6 or more ring atoms include a benzene structure, a naphthalene structure, a phenanthrene structure, and an anthracene structure.

Examples of the aromatic heterocyclic structure having 5 or more ring atoms include: oxygen atom-containing heterocyclic structures such as a furan structure, a pyran structure, and a benzopyran structure; and nitrogen atom-containing heterocyclic structures such as a pyridine structure, a pyrimidine structure, and an indole structure.

The lower limit of the number of ring atoms of the cyclic structure represented by $R^{5a}$ may be 5, but is preferably 6, more preferably 7, even more preferably 8. On the other hand, the upper limit of the number of ring atoms is preferably 15, more preferably 14, even more preferably 13, particularly preferably 12. When the number of ring atoms is set to fall within the above range, the diffusion length of the acid can more appropriately be reduced, which as a result makes it possible to further improve various performances of the radiation-sensitive resin composition.

Part or all of hydrogen atoms of the ring structure in $R^{5a}$ may be substituted by a substituent. Examples of the substituent include halogen atoms such as a fluorine atom, a chlorine atom, a bromine atom, and an iodine atom, a hydroxyl group, a carboxyl group, a cyano group, a nitro group, an alkoxy group, an alkoxycarbonyl group, an alkoxycarbonyloxy group, an acyl group, and an acyloxy group. Among them, a hydroxyl group is preferred.

Among them, $R^{5a}$ is preferably a monovalent group including an alicyclic structure having 5 or more ring atoms or a monovalent group including an aliphatic heterocyclic structure having 5 or more ring atoms, more preferably a monovalent group including an alicyclic structure having 6 or more ring atoms or a monovalent group including an aliphatic heterocyclic structure having 6 or more ring atoms, even more preferably a monovalent group including an alicyclic structure having 9 or more ring atoms or a monovalent group including an aliphatic heterocyclic structure having 9 or more ring atoms, even more preferably an adamantly group, a hydroxyadamantyl group, a norbornanelacton-yl group, a norbornanesulton-yl group, or 5-oxo-4-oxatricyclo[4.3.1.1 3,8]undecan-yl group, particularly preferably an adamantly group.

An example of the monovalent onium cation represented by $X_1^+$ is a radioactive ray-degradable onium cation containing an element such as S, I, O, N, P, Cl, Br, F, As, Se, Sn, Sb, Te, or Bi. Examples of such a radioactive ray-degradable onium cation include a sulfonium cation, a tetrahydrothiophenium cation, a iodonium cation, a phosphonium cation, a diazonium cation, and a pyridinium cation. Among them, a sulfonium cation or a iodonium cation is preferred. The sulfonium cation or the iodonium cation is preferably represented by any of the following formulas (X-1) to (X-6).

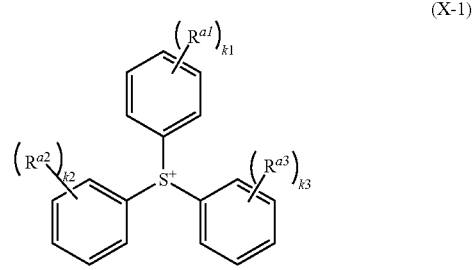

(X-1)

-continued

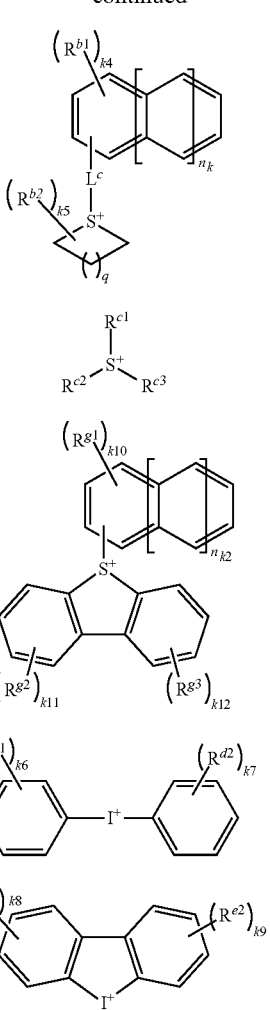

(X-2)

(X-3)

(X-4)

(X-5)

(X-6)

In the above formula (X-1), $R^{a1}$, $R^{a2}$ and $R^{a3}$ are each independently a substituted or unsubstituted, straight or branched chain alkyl group, alkoxy group or alkoxycarbonyloxy group having a carbon number of 1 to 12; a substituted or unsubstituted, monocyclic or polycyclic cycloalkyl group having a carbon number of 3 to 12; a substituted or unsubstituted aromatic hydrocarbon group having a carbon number of 6 to 12; a hydroxy group, a halogen atom, —OSO$_2$—R$^P$, —SO$_2$—R$^Q$ or —S—R$^T$; or a ring structure obtained by combining two or more of these groups. The ring structure may contain heteroatoms such as O and S between the carbon-carbon bonds forming the skeleton. $R^P$, $R^Q$ and $R^T$ are each independently a substituted or unsubstituted, straight or branched chain alkyl group having a carbon number of 1 to 12; a substituted or unsubstituted alicyclic hydrocarbon group having a carbon number of 5 to 25; and a substituted or unsubstituted aromatic hydrocarbon group having a carbon number of 6 to 12. k1, k2 and k3 are each independently an integer of 0 to 5. When there are a plurality of $R^{a1}$ to $R^{a3}$ and a plurality of $R^P$, $R^Q$ and $R^T$, a plurality of $R^{a1}$ to $R^{a3}$ and a plurality of $R^P$, $R^Q$ and $R^T$ may be each identical or different.

In the above formula (X-2), $R^{b1}$ is a substituted or unsubstituted, straight chain or branched alkyl group or alkoxy group having a carbon number of 1 to 20; a substituted or unsubstituted acyl group having a carbon number of 2 to 8; or a substituted or unsubstituted aromatic hydrocarbon group having a carbon number of 6 to 8; or a hydroxy group. $n_k$ is 0 or 1. When $n_k$ is 0, k4 is an integer of 0 to 4. When $n_k$ is 1, k4 is an integer of 0 to 7. When there are a plurality of $R^{b1}$, a plurality of $R^{b1}$ may be each identical or different. A plurality of $R^{b1}$ may represent a ring structure obtained by combining them. $R^{b2}$ is a substituted or unsubstituted, straight chain or branched alkyl group having a carbon number of 1 to 7; or a substituted or unsubstituted aromatic hydrocarbon group having a carbon number of 6 to 7. $L^C$ is a single bond or divalent linking group. k5 is an integer of 0 to 4. When there are a plurality of $R^{b2}$, a plurality of $R^{b2}$ may be each identical or different. A plurality of $R^{b2}$ may represent a ring structure obtained by combining them. q is an integer of 0 to 3. In the formula, the ring structure containing $S^+$ may contain a heteroatom such as O or S between the carbon-carbon bonds forming the skeleton.

In the above formula (X-3), $R^{c1}$, $R^{c2}$ and $R^{c3}$ are each independently a substituted or unsubstituted, straight or branched chain alkyl group having a carbon number of 1 to 12.

In the above formula (X-4), $R^{g1}$ is a substituted or unsubstituted linear or branched alkyl or alkoxy group having 1 to 20 carbon atoms, a substituted or unsubstituted acyl group having 2 to 8 carbon atoms, a substituted or unsubstituted aromatic hydrocarbon group having 6 to 8 carbon atoms, or a hydroxy group. $n_k$ is 0 or 1. When $n_{k2}$ is 0, k10 is an integer of 0 to 4, and when $n_{k2}$ is 1, k10 is an integer of 0 to 7. When there are two or more $R^{g1}$s, the two or more $R^{g1}$s are the same or different from each other, and may represent a cyclic structure formed by combining them together. $R^{g2}$ and $R^{g3}$ are each independently a substituted or unsubstituted linear or branched alkyl, alkoxy, or alkoxycarbonyloxy group having 1 to 12 carbon atoms, a substituted or unsubstituted monocyclic or polycyclic cycloalkyl group having 3 to 12 carbon atoms, a substituted or unsubstituted aromatic hydrocarbon group having 6 to 12 carbon atoms, a hydroxyl group, a halogen atom, or a ring structure formed by combining two or more of these groups together. K11 and k12 are each independently an integer of 0 to 4. When there are two or more $R^{g2}$s and two or more $R^{g3}$s, the two or more $R^{g2}$s may be the same or different from each other, and the two or more $R^{g3}$s may be the same or different from each other.

In the above formula (X-5), $R^{d1}$ and $R^{d2}$ are each independently a substituted or unsubstituted, straight or branched chain alkyl group, alkoxy group or alkoxycarbonyl group having a carbon number of 1 to 12; a substituted or unsubstituted aromatic hydrocarbon group having a carbon number of 6 to 12; a halogen atom; a halogenated alkyl group having a carbon number of 1 to 4; a nitro group; or a ring structure obtained by combining two or more of these groups. k6 and k7 are each independently an integer of 0 to 5. When there are a plurality of $R^{d1}$ and a plurality of $R^{d2}$, a plurality of $R^{d1}$ and a plurality of $R^{d2}$ may be each identical or different.

In the above formula (X-6), $R^{e1}$ and $R^{e2}$ are each independently a halogen atom; a substituted or unsubstituted straight or branched chain alkyl group having a carbon number of 1 to 12; or a substituted or unsubstituted aromatic hydrocarbon group having a carbon number of 6 to 12. k8 and k9 are each independently an integer of 0 to 4.

Examples of the radiation-sensitive acid generator 1 represented by the above formula (2-1) include radiation-sensitive acid generators represented by the following formulas (2-1-1) to (2-1-41) (hereinafter, also referred to as "radiation-sensitive acid generators (1-1) to (1-41)").
(2-1-1)
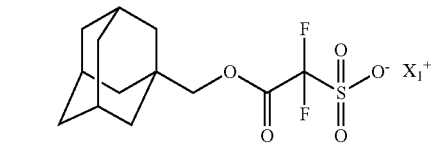
(2-1-2)
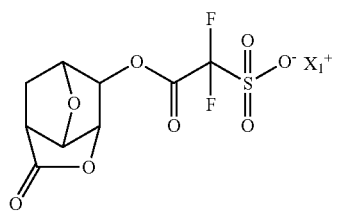
(2-1-3)
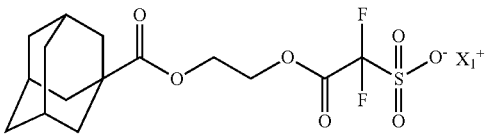
(2-1-4)
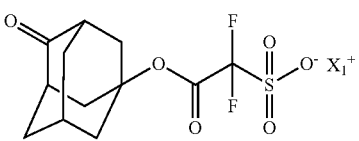
(2-1-5)
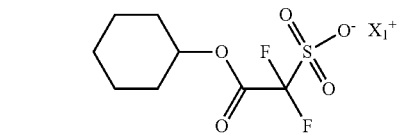
(2-1-6)
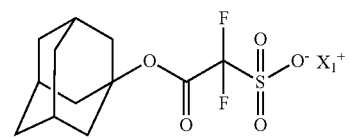
(2-1-7)
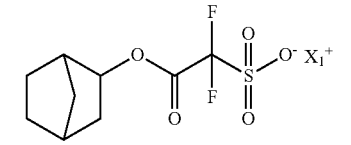
(2-1-8)
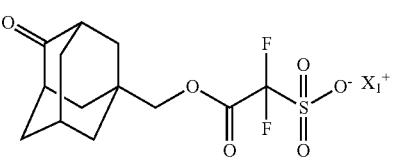
(2-1-9)
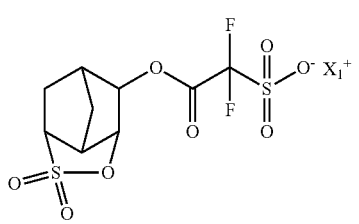
(2-1-10)
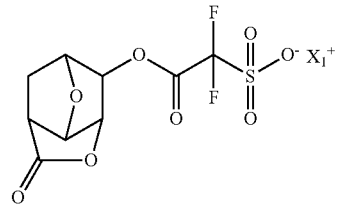
(2-1-11)
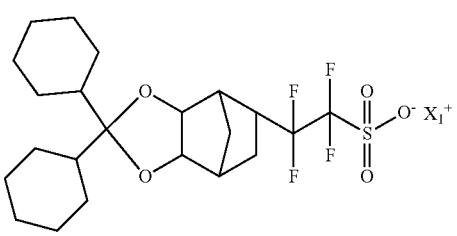
(2-1-12)
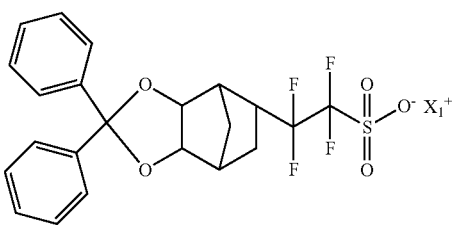
(2-1-13)
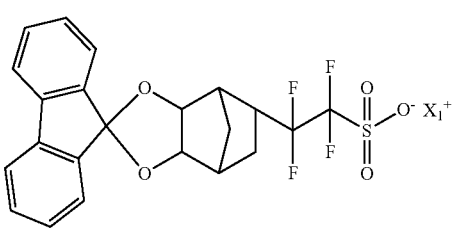
(2-1-14)
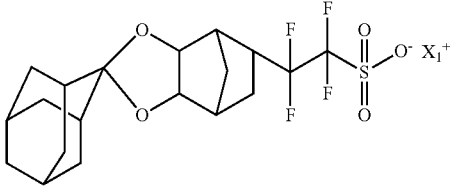
(2-1-15)
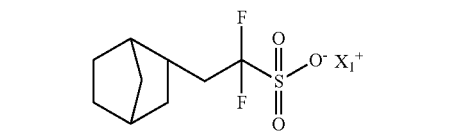
(2-1-16)
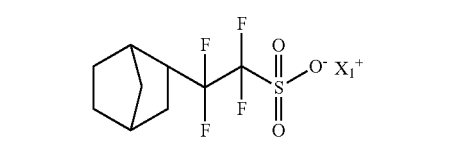
(2-1-17)
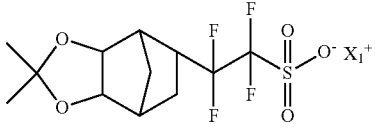

(2-1-18) 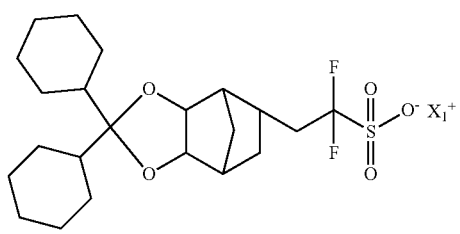
(2-1-19) 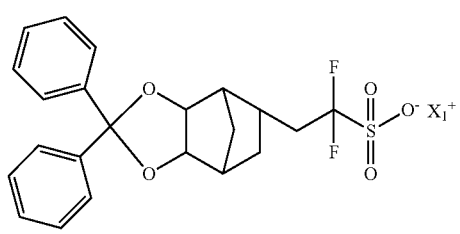
(2-1-20) 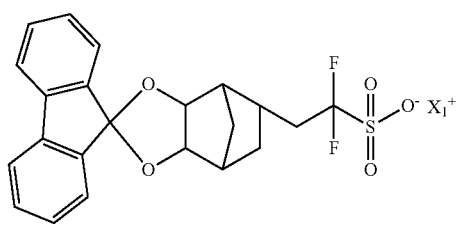
(2-1-20) 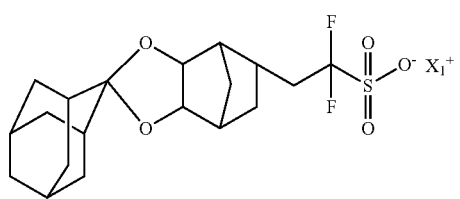
(2-1-21) 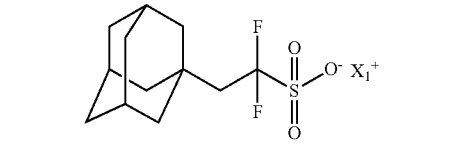
(2-1-22) 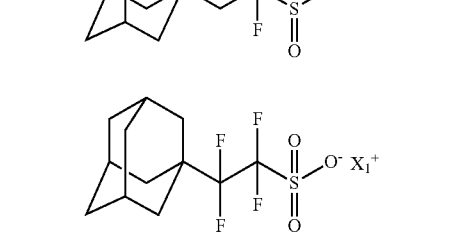
(2-1-23) 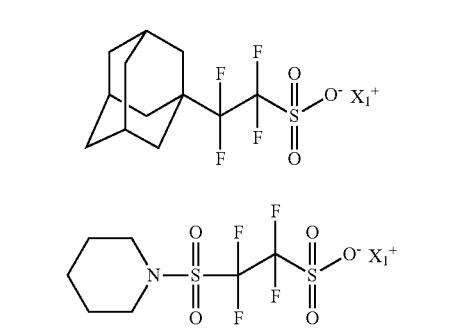
(2-1-24) 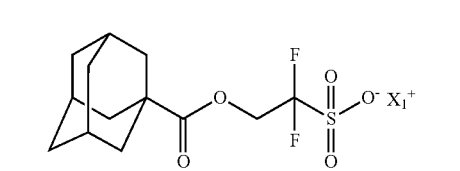
(2-1-25) 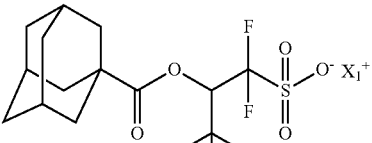
(2-1-26) 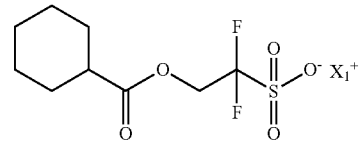
(2-1-27) 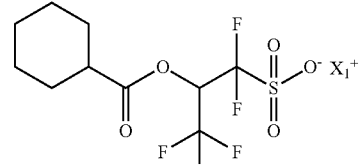
(2-1-28) 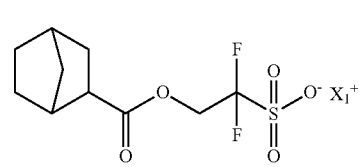
(2-1-29) 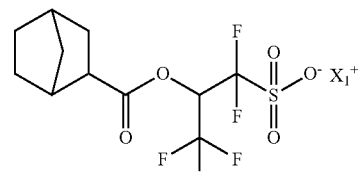
(2-1-30) 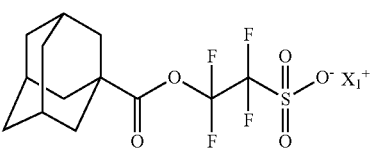
(2-1-31) 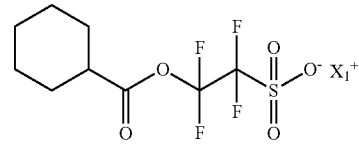
(2-1-32) 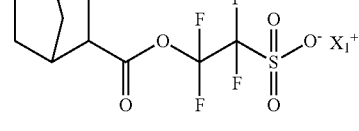
(2-1-33) 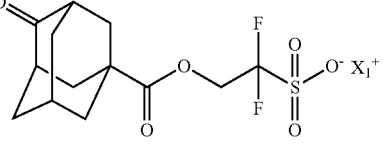

(2-1-34)

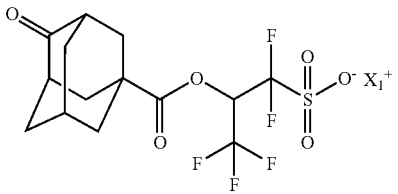

(2-1-35)

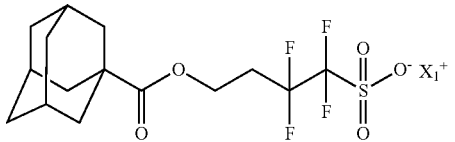

(2-1-36)

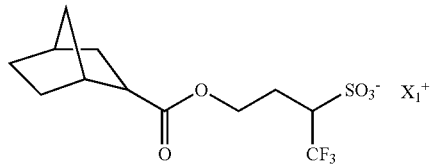

(2-1-37)

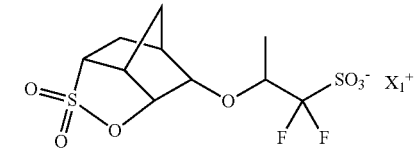

(2-1-38)

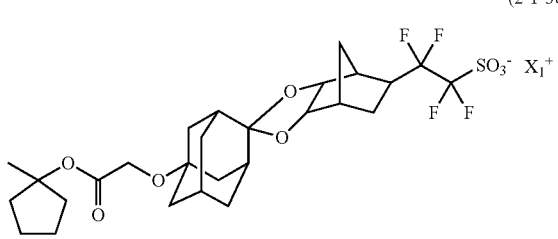

(2-1-39)

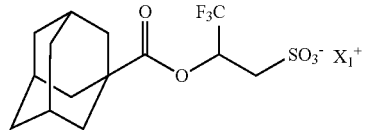

(2-1-40)

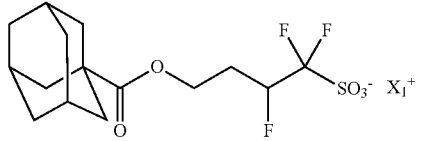

(2-1-41)

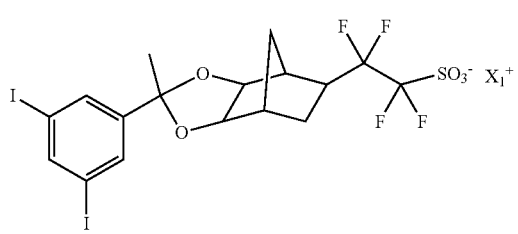

In the above formulas (2-1-1) to (2-1-41), $X_1^+$ is a monovalent onium cation.

Among them, radiation-sensitive acid generators represented by the above formulas (2-1-1), (2-1-11), (2-1-16), (2-1-36) to (2-1-41) are preferred.

(Radiation-Sensitive Acid Generator 2)

The radiation-sensitive acid generator 2 is represented by the following formula (2-2).

$$R^{5b}\text{—}SO_3^-X_2^+ \quad (2\text{-}2)$$

In the above formula (2-2), $R^{5b}$ is a monovalent organic group.

$X_2^+$ is a monovalent onium cation whose atom having a positive charge is not an atom forming a cyclic structure.

The monovalent organic group represented by $R^{5b}$ is not particularly limited, and may have a chain structure, a cyclic structure, or a structure formed by combining them. Examples of the chain structure include chain hydrocarbon groups that may either be saturated or unsaturated and linear or branched. Examples of the cyclic structure include cyclic hydrocarbon groups that may be alicyclic, aromatic, or heterocyclic. Other examples of the monovalent organic group include a group obtained by substituting part or all of hydrogen atoms contained in a group having a chain structure or a group having a cyclic structure by a substituent and a group containing, between carbon atoms of such a group, CO, CS, O, S, $SO_2$ or NR' or a combination of two or more of them. R' is a hydrocarbon group having 1 to 10 carbon atoms. Among them, the monovalent organic group is preferably a substituted or unsubstituted monovalent chain hydrocarbon group having 1 to 20 carbon atoms, a substituted or unsubstituted monovalent alicyclic hydrocarbon group having 3 to 20 carbon atoms, or a substituted or unsubstituted monovalent aromatic hydrocarbon group having 6 to 20 carbon atoms. The radiation-sensitive acid generator 2 according to the present embodiment also includes the radiation-sensitive acid generator 2 represented by the above formula (2-2) incorporated as part of the polymer by bonding to the polymer at the monovalent organic group represented by $R^{5b}$.

Examples of the substituent substituted for part or all of hydrogen atoms of the organic group include: halogen atoms such as a fluorine atom, a chlorine atom, a bromine atom, and an iodine atom; a hydroxyl group; a carboxyl group; a cyano group; a nitro group; an alkyl group; an alkoxy group, an alkoxycarbonyl group, an alkoxycarbonyloxy group, an acyl group, an acyloxy group, or a group obtained by substituting a hydrogen atom of such a group by a halogen atom; and an oxo group (=O).

Examples of the monovalent chain hydrocarbon group having 1 to 20 carbon atoms include a linear or branched saturated hydrocarbon group having 1 to 20 carbon atoms and a linear or branched unsaturated hydrocarbon group having 1 to 20 carbon atoms. The number of carbon atoms is 1 or more, but the lower limit thereof is preferably 2, more preferably 3, even more preferably 4. The upper limit of the number of carbon atoms is preferably 18, more preferably 16, even more preferably 14, particularly preferably 12.

Examples of the monovalent alicyclic hydrocarbon group having 3 to 20 carbon atoms include a monocyclic or polycyclic saturated hydrocarbon group and a monocyclic or polycyclic unsaturated hydrocarbon group. The monocyclic saturated hydrocarbon group is preferably a cyclopentyl group, a cyclohexyl group, a cycloheptyl group, or a cyclooctyl group. The polycyclic cycloalkyl group is preferably a bridged alicyclic hydrocarbon group such as a norbornyl group, an adamantly group, a tricyclodecyl group, or a tetracyclododecyl group. It is to be noted that the bridged alicyclic hydrocarbon group refers to a polycyclic alicyclic hydrocarbon group in which two carbon atoms that constitute an alicyclic ring and are not adjacent to each other are bonded by a bonding chain containing at least one carbon atom.

Examples of the monovalent aromatic hydrocarbon group having 6 to 20 carbon atoms include: an aryl group such as a phenyl group, a tolyl group, a xylyl group, a naphthyl group, or an anthryl group; and an aralkyl group such as a benzyl group, a phenethyl group, or a naphthylmethyl group.

The heterocyclic ring hydrocarbon group may be a group obtained by removing one hydrogen atom from an aromatic heterocyclic structure or a group obtained by removing one hydrogen atom from an alicyclic heterocyclic structure. The heterocyclic structure also includes a five-membered aromatic structure that has aromaticity by introduction of a hetero atom. Examples of the hetero atom include an oxygen atom, a nitrogen atom, and a sulfur atom.

Examples of the aromatic heterocyclic structure include:

an oxygen atom-containing aromatic heterocyclic structure such as furan, pyran, benzofuran, or benzopyran;

a nitrogen atom-containing aromatic heterocyclic structure such as pyrrole, imidazole, pyridine, pyrimidine, pyrazine, indole, quinoline, isoquinoline, acridine, phenazine, or carbazole;

a sulfur atom-containing aromatic heterocyclic structure such as thiophene; and an aromatic heterocyclic structure containing two or more hetero atoms, such as thiazole, benzothiazole, thiazine, or oxazine.

Examples of the alicyclic heterocyclic structure include:

an oxygen atom-containing alicyclic heterocyclic structure such as oxirane, tetrahydrofuran, tetrahydropyran, dioxolane, or dioxane;

a nitrogen atom-containing alicyclic heterocyclic structure such as aziridine, pyrrolidine, piperidine, or piperazine;

a sulfur atom-containing alicyclic heterocyclic structure such as thietane, thiolane, or thiane;

an alicyclic heterocyclic structure containing two or more hetero atoms, such as morpholine, 1,2-oxathiolane, or 1,3-oxathiolane; and a lactone structure, a cyclic carbonate structure, and a sultone structure.

Preferred examples of the monovalent onium cation represented by $X_2^+$ whose atom having a positive charge is not an atom forming a cyclic structure include monovalent onium cations represented by the above formulas (X-1), (X-3), and (X-5).

Examples of the radiation-sensitive acid generator 2 represented by the above formula (2-2) include radiation-sensitive acid generators represented by the following formulas (2-2-1) to (2-2-12) (hereinafter, also referred to as "radiation-sensitive acid generators (2-1) to (2-12)").

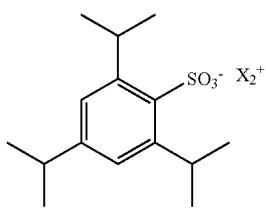
(2-2-1)

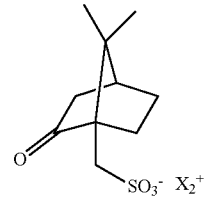
(2-2-2)

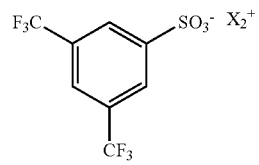
(2-2-3)

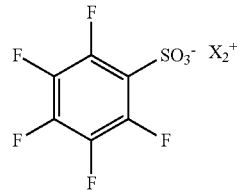
(2-2-4)

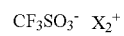
$CF_3SO_3^-$ $X_2^+$
(2-2-5)

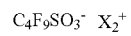
$C_4F_9SO_3^-$ $X_2^+$
(2-2-6)

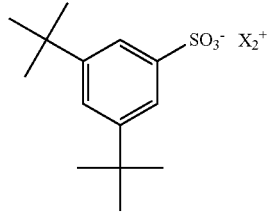
(2-2-7)

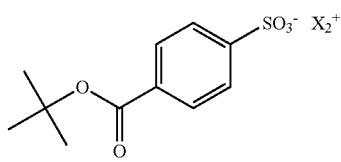
(2-2-8)

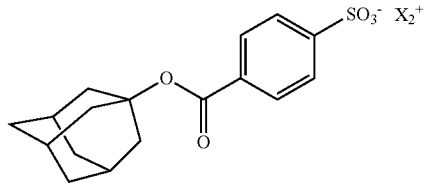
(2-2-9)

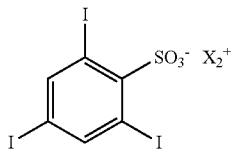
(2-2-10)

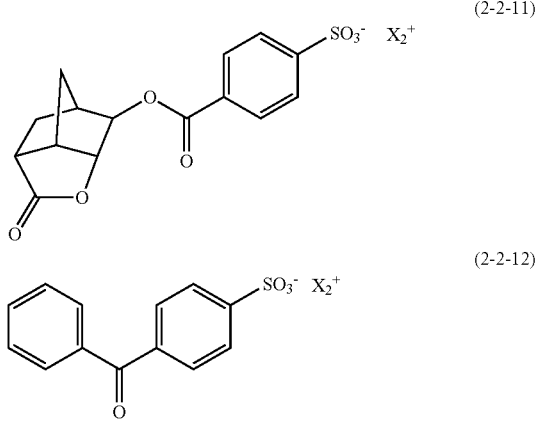

(2-2-11)

(2-2-12)

When KrF excimer laser light, EUV, or an electron beam is used as a radioactive ray for irradiation in an exposure step in a method for forming a resist pattern, a sulfonate anion in the radiation-sensitive acid generator 1 represented by the above formula (2-1) and a sulfonate anion in the radiation-sensitive acid generator 2 represented by the above formula (2-2) preferably have one or more iodine atoms.

The monovalent onium cation represented by $X_1^+$ and the monovalent onium cation represented by $X_2^+$ preferably have 3 or more fluorine atoms, and more preferably have 5 or more fluorine atoms. Examples of such an onium cation include a cation represented by the above formula (X-1) wherein k1=k2=k3=1 and $R^{a1}$=$R^{a2}$=$R^{a3}$=fluorine atom, a cation represented by the above formula (X-1) wherein k1=k2=k3=1, $R^{a1}$=$R^{a2}$=fluorine atom, and $R^{a3}$=trifluoromethyl group, and a cation represented by the above formula (X-1) wherein k1=k2=1, k3=0 and $R^{a1}$=$R^{a2}$=trifluoromethyl group.

The radiation-sensitive acid generators may be used singly or in combination of two or more of them. The lower limit of the content of the radiation-sensitive acid generator (when two or more kinds of radiation-sensitive acid generators are present, the content of the radiation-sensitive acid generator content is the total content of the radiation-sensitive acid generators) is preferably 0.1 parts by mass, more preferably 1 part by mass, even more preferably 3 parts by mass per 100 parts by mass of the resin. The upper limit of the content is preferably 50 parts by mass, more preferably 45 parts by mass, even more preferably 40 parts by mass. This makes it possible to exhibit excellent sensitivity, CDU performance, and resolution during resist pattern formation.

(Acid Diffusion Controlling Agent)

If necessary, the radiation-sensitive resin composition may contain an acid diffusion controlling agent. The acid diffusion controlling agent has the effect of controlling a phenomenon in which an acid generated from the radiation-sensitive acid generator by exposure diffuses in a resist film to prevent an undesired chemical reaction in an unexposed part. Further, the radiation-sensitive acid controlling agent improves the storage stability of a resulting radiation-sensitive resin composition. Further, the resolution of a resist pattern is further improved, the line width change of a resist pattern due to variation in post exposure delay time between exposure and development treatment can be prevented, and a radiation-sensitive resin composition excellent in process stability can be obtained.

Examples of the acid diffusion controlling agent include a compound represented by the following formula (7) (hereinafter, also referred to as a "nitrogen-containing compound (I)"), a compound having two nitrogen atoms in the same molecule (hereinafter, also referred to as a "nitrogen-containing compound (II)"), a compound having three nitrogen atoms (hereinafter, also referred to as a "nitrogen-containing compound (III)"), an amide group-containing compound, a urea compound, and a nitrogen-containing heterocyclic compound.

(7)

In the above formula (7), $R^{22}$, $R^{23}$, and $R^{24}$ are each independently a hydrogen atom, a substituted or unsubstituted alkyl group, a substituted or unsubstituted cycloalkyl group, a substituted or unsubstituted aryl group, or a substituted or unsubstituted aralkyl group.

Examples of the nitrogen-containing compound (I) include: a monoalkylamine such as n-hexylamine; a dialkylamine such as di-n-butylamine; a trialkylamine such as triethylamine; and an aromatic amine such as aniline.

Examples of the nitrogen-containing compound (II) include ethylenediamine and N,N,N',N'-tetramethylethylenediamine.

Examples of the nitrogen-containing compound (III) include: a polyamine compound such as polyethyleneimine or polyallylamine; and a polymer such as dimethylaminoethylacrylamide.

Examples of the amide group-containing compound include formamide, N-methylformamide, N,N-dimethylformamide, acetamide, N-methylacetamide, N,N-dimethylacetamide, propionamide, benzamide, pyrrolidone, and N-methylpyrrolidone.

Examples of the urea compound include methylurea, 1,1-dimethylurea, 1,3-dimethylurea, 1,1,3,3-tetramethylurea, 1,3-diphenylurea, and tributylthiourea.

Examples of the nitrogen-containing heterocyclic compound include: pyridines such as pyridine and 2-methylpyridine; morpholines such as N-propylmorpholine and N-(undecylcarbonyloxyethyl)morpholine; pyrazines; and pyrazoles.

As the nitrogen-containing organic compound, a compound having an acid-dissociable group may be used. Examples of such a nitrogen-containing compound having an acid-dissociable group include N-t-butoxycarbonyl piperidine, N-t-butoxycarbonyl imidazole, N-t-butoxycarbonyl benzimidazole, N-t-butoxycarbonyl-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, and N-t-amyloxycarbonyl-4-hydroxypiperidine.

As the acid diffusion controlling agent, an onium salt compound may appropriately be used which generates an acid having a pKa higher than that of an acid generated from the above-described radiation-sensitive acid generator (hereinafter, also referred to as a "radiation-sensitive weak acid generator" for the sake of expediency). An acid generated from the radiation-sensitive weak acid generator is a weak acid that does not induce dissociation of the acid-dissociable group under conditions where the acid-dissociable group in the resin is dissociated. It is to be noted that in this description, the term "dissociation" of the acid-dissociable group means that the acid-dissociable group is dissociated by post-exposure bake at 110° C. for 60 seconds.

Examples of the radiation-sensitive weak acid generator include a sulfonium salt compound represented by the following formula (8-1) and a iodonium salt compound represented by the following formula (8-2).

$$J^+E^- \quad (8\text{-}1)$$

$$U^+Q^- \quad (8\text{-}2)$$

In the above formulas (8-1) and (8-2), $J^+$ is a sulfonium cation, and $U^+$ is a iodonium cation. Examples of the sulfonium cation represented by $J^+$ include sulfonium cations represented by the above formulas (X-1) to (X-4). Examples of the iodonium cation represented by $U^+$ include iodonium cations represented by the above formulas (X-5) to (X-6). $E^-$ and $Q^-$ are each independently an anion represented by $OH^-$, $R^{\alpha\alpha}$—$COO^-$, or —$N^-$—. $R^{\alpha\alpha}$ is an alkyl group, an aryl group, or an aralkyl group. The hydrogen atom of the alkyl group represented by $R^{\alpha\alpha}$ or the hydrogen atom of aromatic ring of the aryl group or the aralkyl group may be substituted by a halogen atom, a hydroxyl group, a nitro group, a halogen atom-substituted or unsubstituted alkyl group having 1 to 12 carbon atoms, or a halogen atom-substituted or unsubstituted alkoxy group having 1 to 12 carbon atoms.

Examples of the radiation-sensitive weak acid generator include compounds represented by the following formulas.

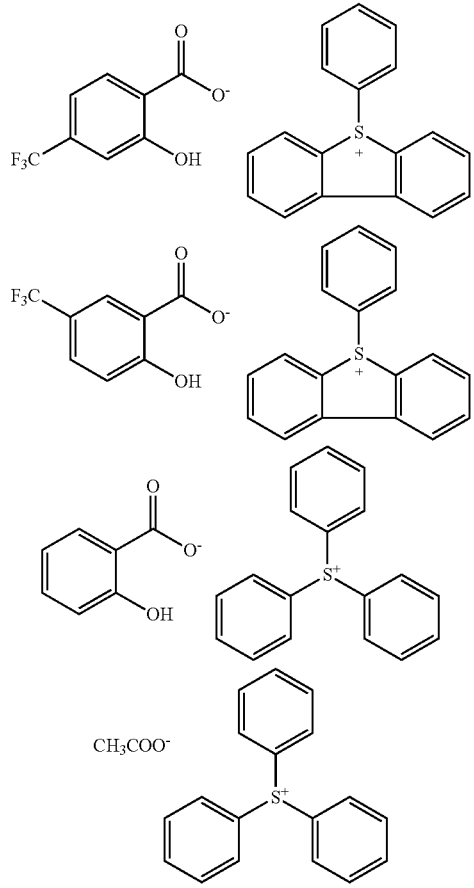

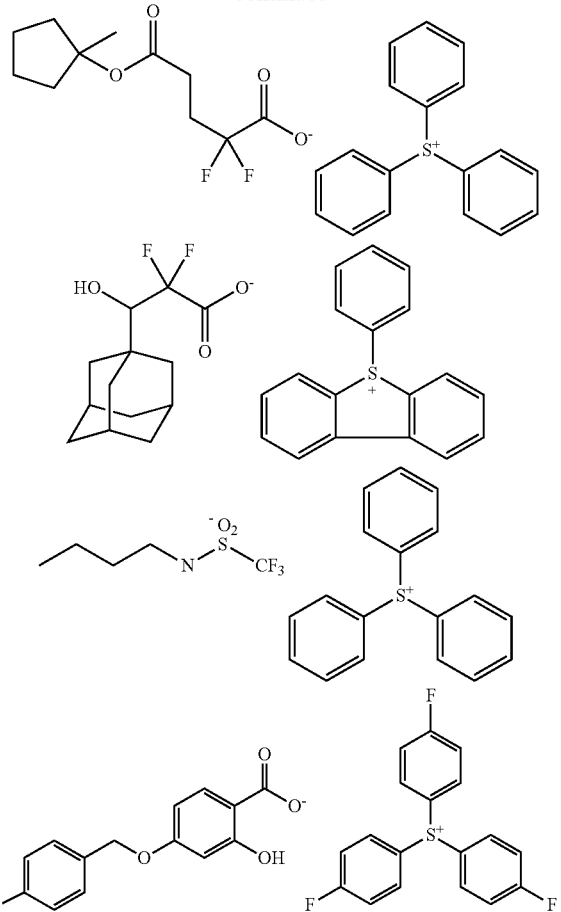

The lower limit of the content of the acid diffusion controlling agent is preferably 5 mol %, more preferably 10 mol %, even more preferably 15 mol % with respect to the total number of moles of the radiation-sensitive acid generator. The upper limit of the content is preferably 60 mol %, more preferably 55 mol %, even more preferably 50 mol %. When the content of the acid diffusion controlling agent is set to fall within the above range, the lithography performance of the radiation-sensitive resin composition can further be improved. The radiation-sensitive resin composition may contain one or two or more kinds of acid diffusion controlling agents.

<Solvent>

The radiation-sensitive resin composition according to the present embodiment contains a solvent. The solvent is not particularly limited as long as it can dissolve or disperse at least the resin, the radiation-sensitive acid generator, and an additive or the like contained if necessary.

Examples of the solvent include an alcohol-based solvent, an ether-based solvent, a ketone-based solvent, an amide-based solvent, an ester-based solvent, and a hydrocarbon-based solvent.

Examples of the alcohol-based solvent include:

a monoalcohol-based solvent having a carbon number of 1 to 18, including iso-propanol, 4-methyl-2-pentanol, 3-methoxybutanol, n-hexanol, 2-ethylhexanol, furfuryl alcohol, cyclohexanol, 3,3,5-trimethylcyclohexanol, and diacetone alcohol;

a polyhydric alcohol having a carbon number of 2 to 18, including ethylene glycol, 1,2-propylene glycol, 2-methyl- 2,4-pentanediol, 2,5-hexanediol, diethylene glycol, dipropylene glycol, triethylene glycol, and tripropylene glycol; and a partially etherized polyhydric alcohol-based solvent in which a part of hydroxy groups in the polyhydric alcohol-based solvent is etherized.

Examples of the ether-based solvent include:

a dialkyl ether-based solvent, including diethyl ether, dipropyl ether, and dibutyl ether;

a cyclic ether-based solvent, including tetrahydrofuran and tetrahydropyran;

an ether-based solvent having an aromatic ring, including diphenylether and anisole (methyl phenyl ether); and an etherized polyhydric alcohol-based solvent in which a hydroxy group in the polyhydric alcohol-based solvent is etherized.

Examples of the ketone-based solvent include:

a chain ketone-based solvent, including acetone, butanone, and methyl-iso-butyl ketone;

a cyclic ketone-based solvent, including cyclopentanone, cyclohexanone, and methylcyclohexanone; and 2,4-pentanedione, acetonylacetone, and acetophenone.

Examples of the amide-based solvent include:

a cyclic amide-based solvent, including N,N'-dimethyl imidazolidinone and N-methylpyrrolidone; and a chain amide-based solvent, including N-methylformamide, N,N-dimethylformamide, N,N-diethylformamide, acetamide, N-methylacetamide, N,N-dimethylacetamide, and N-methylpropionamide.

Examples of the ester-based solvent include:

a monocarboxylate ester-based solvent, including n-butyl acetate and ethyl lactate;

a partially etherized polyhydric alcohol acetate-based solvent, including diethylene glycol mono-n-butyl ether acetate, propylene glycol monomethyl ether acetate, and dipropylene glycol monomethyl ether acetate;

a lactone-based solvent, including γ-butyrolactone and valerolactone;

a carbonate-based solvent, including diethyl carbonate, ethylene carbonate, and propylene carbonate; and a polyhydric carboxylic acid diester-based solvent, including propylene glycol diacetate, methoxy triglycol acetate, diethyl oxalate, ethyl acetoacetate, ethyl lactate, and diethyl phthalate.

Examples of the hydrocarbon-based solvent include:

an aliphatic hydrocarbon-based solvent, including n-hexane, cyclohexane, and methylcyclohexane;

an aromatic hydrocarbon-based solvent, including benzene, toluene, di-iso-propylbenzene, and n-amylnaphthalene.

Among them, the ester-based solvent or the ketone-based solvent is preferred. The partially etherized polyhydric alcohol acetate-based solvent, the cyclic ketone-based solvent, or the lactone-based solvent is more preferred. Propylene glycol monomethyl ether acetate, cyclohexanone, or γ-butyrolactone is still more preferred. The radiation-sensitive resin composition may include one type of the solvent, or two or more types of the solvents in combination.

<Another Optional Component>

The radiation-sensitive resin composition may contain another optional component other than the above-descried components. Examples of the another optional component include a cross-linking agent, a localization enhancing agent, a surfactant, an alicyclic backbone-containing compound, and a sensitizer. These other optional components may be used singly or in combination of two or more of them.

(Cross-Linking Agent)

The cross-linking agent is a compound having two or more functional groups. The cross-linking agent causes a cross-linking reaction in a polymer component (1) by an acid catalytic reaction in a baking step after a one-shot exposure step to increase the molecular weight of the polymer component (1) so that the solubility of a pattern-exposed part in a developer is reduced. Examples of the functional group include a (meth)acryloyl group, a hydroxymethyl group, an alkoxymethyl group, an epoxy group, and a vinyl ether group.

(Localization Enhancing Agent)

The localization enhancing agent has an effect of localizing the high fluorine-containing resin on the surface of the resist film more effectively. The added amount of the high fluorine-containing resin can be decreased compared to the traditionally added amount by including the localization enhancing agent in the radiation-sensitive resin composition. The localization enhancing agent can further prevent from eluting the ingredient of the composition from the resist film to an immersion medium and carry out the immersion exposure at higher speed with a high-speed scan, while maintaining the lithography properties of the radiation-sensitive resin composition. As a result, the hydrophobicity of the surface of the resist film can be improved, resulting in the prevention of the defect due to the immersion, for example, the watermark defect. Example of the compound which may be used as the localization enhancing agent includes a low molecular weight compound having a specific dielectric constant of not less than 30 and not more than 200 and a boiling point of 100° C. or more at 1 atm. Specific examples of the compound include a lactone compound, a carbonate compound, a nitrile compound, and a polyhydric alcohol.

(Surfactant)

The surfactant has an effect of improving the coating properties, the striation, and the developability of the composition. Examples of the surfactant include a nonionic surfactant, including polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate. Examples of the surfactant which is commercially available include KP341 (manufactured by Shin-Etsu Chemical Co., Ltd.), POLYFLOW No. 75, POLYFLOW No. 95 (all manufactured by Kyoeisha Chemical Co., Ltd.), EFTOP EF301, EFTOP EF303, EFTOP EF352 (all manufactured by Tokem Products), Megafac F171, Megafac F173 (all manufactured by DIC), Fluorad FC430, Fluorad FC431 (all manufactured by Sumitomo 3M Limited.), AsahiGuard AG710, Surflon S-382, Surflon SC-101, Surflon SC-102, Surflon SC-103, Surflon SC-104, Surflon SC-105, Surflon SC-106 (all manufactured by Asahi Glass Co., Ltd.). The content of the surfactant in the radiation-sensitive resin composition is typically not more than 2 parts by mass based on 100 parts by mass of total resins.

(Alicyclic Backbone-Containing Compound)

The alicyclic backbone-containing compound has an effect of improving the dry etching resistance, the shape of the pattern, the adhesiveness between the substrate, and the like.

Examples of the alicyclic backbone-containing compound include:

adamantane derivatives, including 1-adamantane carboxylic acid, 2-adamantanone, and t-butyl 1-adamantane carboxylate;

deoxycholic acid esters, including t-butyl deoxycholate, t-butoxycarbonylmethyl deoxycholate, and 2-ethoxyethyl deoxycholate;

lithocholic acid esters, including t-butyl lithocholate, t-butoxycarbonylmethyl lithocholate, and 2-ethoxyethyl lithocholate; and 3-[2-hydroxy-2,2-bis(trifluoromethyl)ethyl]tetracyclo[4.4.0.1(2,5).1(7,10)]dode cane, and 2-hydroxy-9-methoxycarbonyl-5-oxo-4-oxa-tricyclo[4.2.1.0(3,7)]nonane. The content of the alicyclic backbone-containing compound in the radiation-sensitive resin composition is typically not more than 5 parts by mass based on 100 parts by mass of total resins.

(Sensitizer)

The sensitizer has the function of increasing the amount of an acid generated from the radiation-sensitive acid generator or the like, and is effective at improving "apparent sensitivity" of the radiation-sensitive resin composition.

Examples of the sensitizer include carbazoles, acetophenones, benzophenones, naphthalenes, phenols, biacetyl, eosin, rose bengal, pyrenes, anthracenes, and phenothiazines. These sensitizers may be used singly or in combination of two or more of them. The content of the sensitizer in the radiation-sensitive resin composition is usually 2 parts by mass or less per 100 parts by mass of the resin.

<Method for Preparing Radiation-Sensitive Resin Composition>

The radiation-sensitive resin composition can be prepared by, for example, mixing the resin, the radiation-sensitive acid generator, the solvent, and the another optional component added if necessary in a predetermined ratio. The radiation-sensitive resin composition is preferably filtered through, for example, a filter having a pore diameter of about 0.05 μm after mixing. The solid matter concentration of the radiation-sensitive resin composition is usually 0.1 mass % to 50 mass %, preferably 0.5 mass % to 30 mass %, more preferably 1 mass % to 20 mass %.

<<Method for Forming Pattern>>

A method for forming a pattern according to the present embodiment includes the steps of:

(1) applying the radiation-sensitive resin composition directly or indirectly onto a substrate to form a resist film (hereinafter, also referred to as a "resist film-forming step");

(2) exposing the resist film (hereinafter, also referred to as an "exposure step"); and (3) developing the exposed resist film (hereinafter, also referred to as a "development step").

The method for forming a pattern uses the above-described radiation-sensitive resin composition excellent in sensitivity in the exposure step, CDU performance, and resolution, and therefore a high-quality resist pattern can be formed. Hereinbelow, each of the steps will be described.

[Resist Film Forming Step]

In this step (the above mentioned step (1)), a resist film is formed with the radiation-sensitive resin composition. Examples of the substrate on which the resist film is formed include one traditionally known in the art, including a silicon wafer, silicon dioxide, and a wafer coated with aluminum. An organic or inorganic antireflection film may be formed on the substrate, as disclosed in JP-B-06-12452 and JP-A-59-93448. Examples of the applicating method include a rotary coating (spin coating), flow casting, and roll coating. After applicating, a prebake (PB) may be carried out in order to evaporate the solvent in the film, if needed. The temperature of PB is typically from 60° C. to 140° C., and preferably from 80° C. to 120° C. The duration of PB is typically from 5 seconds to 600 seconds, and preferably from 10 seconds to 300 seconds. The thickness of the resist film formed is preferably from 10 nm to 1,000 nm, and more preferably from 10 nm to 500 nm.

When the immersion exposure is carried out, irrespective of presence of a water repellent polymer additive such as the high fluorine-containing resin in the radiation-sensitive resin composition, the formed resist film may have a protective film for the immersion which is not soluble into the immersion liquid on the film in order to prevent a direct contact between the immersion liquid and the resist film. As the protective film for the immersion, a solvent-removable protective film that is removed with a solvent before the developing step (for example, see JP-A-2006-227632); or a developer-removable protective film that is removed during the development of the developing step (for example, see WO2005-069076 and WO2006-035790) may be used. In terms of the throughput, the developer-removable protective film is preferably used.

Further, when the next exposure step is performed using a radioactive ray having a wavelength of 50 nm or less, a resin having the structural unit A and, if necessary, the structural unit C is preferably used as the base resin in the composition.

[Exposing Step]

In this step (the above mentioned step (2)), the resist film formed in the resist film forming step as the step (1) is exposed by irradiating with a radioactive ray through a photomask (optionally through an immersion medium such as water). Examples of the radioactive ray used for the exposure include visible ray, ultraviolet ray, far ultraviolet ray, extreme ultraviolet ray (EUV); an electromagnetic wave including X ray and γ ray; an electron beam; and a charged particle radiation such as α ray. Among them, far ultraviolet ray, an electron beam, or EUV is preferred. ArF excimer laser light (wavelength is 193 nm), KrF excimer laser light (wavelength is 248 nm), an electron beam, or EUV is more preferred. An electron beam or EUV having a wavelength of 50 nm or less which is identified as the next generation exposing technology is further preferred.

When the exposure is carried out by immersion exposure, examples of the immersion liquid include water and fluorine-based inert liquid. The immersion liquid is preferably a liquid which is transparent with respect to the exposing wavelength, and has a minimum temperature factor of the refractive index so that the distortion of the light image reflected on the film becomes minimum. However, when the exposing light source is ArF excimer laser light (wavelength is 193 nm), water is preferably used because of the ease of availability and ease of handling in addition to the above considerations. When water is used, a small proportion of an additive that decreases the surface tension of water and increases the surface activity may be added. Preferably, the additive cannot dissolve the resist film on the wafer and can neglect an influence on an optical coating at an under surface of a lens. The water used is preferably distilled water.

After the exposure, post exposure bake (PEB) is preferably carried out to promote the dissociation of the acid-dissociable group in the resin by the acid generated from the radiation-sensitive acid generator with the exposure in the exposed part of the resist film. The difference of solubility into the developer between the exposed part and the non-exposed part is generated by the PEB. The temperature of PEB is typically from 50° C. to 180° C., and preferably from 80° C. to 130° C. The duration of PEB is typically from 5 seconds to 600 seconds, and preferably from 10 seconds to 300 seconds.

[Developing Step]

In this step (the above mentioned step (3)), the resist film exposed in the exposing step as the step (2) is developed. By this step, the predetermined resist pattern can be formed. After the development, the resist pattern is washed with a rinse solution such as water or alcohol, and the dried, in general.

Examples of the developer used for the development include, in the alkaline development, an alkaline aqueous solution obtained by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethyl ammonium hydroxide (TMAH), pyrrole, piperidine, choline, 1,8-diazabicyclo-[5.4.0]-7-undecene, 1,5-diazabicyclo-[4.3.0]-5-nonene. Among them, an aqueous TMAH solution is preferred, and 2.38% by mass of aqueous TMAH solution is more preferred.

In the case of the development with organic solvent, examples of the solvent include an organic solvent, including a hydrocarbon-based solvent, an ether-based solvent, an ester-based solvent, a ketone-based solvent, and an alcohol-based solvent; and a solvent containing an organic solvent. Examples of the organic solvent include one, two or more solvents listed as the solvent for the radiation-sensitive resin composition. Among them, an ester-based solvent or a ketone-based solvent is preferred. The ester-based solvent is preferably an acetate ester-based solvent, and more preferably n-butyl acetate or amyl acetate. The ketone-based solvent is preferably a chain ketone, and more preferably 2-heptanone. The content of the organic solvent in the developer is preferably not less than 80% by mass, more preferably not less than 90% by mass, further preferably not less than 95% by mass, and particularly preferably not less than 99% by mass. Examples of the ingredient other than the organic solvent in the developer include water and silicone oil.

Examples of the developing method include a method of dipping the substrate in a tank filled with the developer for a given time (dip method); a method of developing by putting and leaving the developer on the surface of the substrate with the surface tension for a given time (paddle method); a method of spraying the developer on the surface of the substrate (spray method); and a method of injecting the developer while scanning an injection nozzle for the developer at a constant rate on the substrate rolling at a constant rate (dynamic dispense method).

EXAMPLES

Hereinbelow, the present invention will specifically be described on the basis of examples, but the present invention is not limited to these examples. Methods for measuring various physical property values will be shown below. It is to be noted that in polymerization reactions in the following synthesis examples, part(s) by mass refers to a value per 100 parts by mass of the total mass of monomers used, and mol % refers to a value per 100 mol % of the total number of moles of monomers used, unless otherwise specified.

[Measurement of Weight-Average Molecular Weight (Mw), Number-Average Molecular Weight (Mn), and Dispersivity (Mw/Mn)]

The weight-average molecular weight and the number-average molecular weight were measured under measurement conditions described in the paragraph of Resin. The dispersivity (Mw/Mn) was calculated from the measurement results of Mw and Mn.

[$^1$H-NMR Analysis and $^{13}$C-NMR Analysis]

Measurements were performed using "JNM-Delta400" manufactured by JEOL Ltd.

Synthesis of Monomeric Compound [Z]

Synthesis Example 1: Synthesis of Monomeric Compound (Z-1)

A monomeric compound (Z-1) was synthesized in accordance with the following reaction scheme.

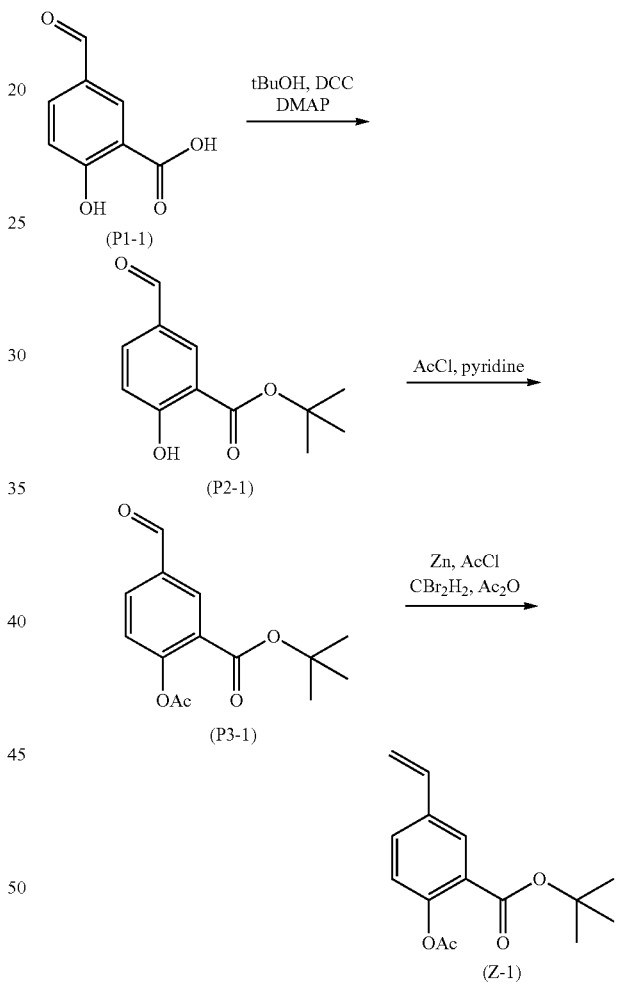

A compound represented by (P1-1) (154 mmol), N,N-dimethylaminopyridine (15.4 mmol), and t-butyl alcohol (154 mL) were mixed and stirred in a reaction container at room temperature. Then, a tetrahydrofuran (THF) (384 mL) solution of N,N'-dicyclohexylcarbodiimide (169 mmol) was added dropwise for 1 hour. After the completion of dropwise addition, the resulting mixture was further stirred at room temperature for 10 hours, methylene chloride (500 mL) was then added, the resulting mixture was filtered, and the solvent was distilled off from a filtrate. Purification on silica gel column chromatography gave a compound (P2-1) with a yield of 93%.

The compound (P2-1) (142 mmol) was dissolved in THF (284 mL), the resulting solution was stirred at room temperature, and pyridine (355 mmol) was added dropwise. After the completion of dropwise addition, the reaction solution was cooled to 0° C., and the THF (284 mL) solution of acetyl chloride (355 mmol) was added dropwise for 1 hour. The temperature of the resulting mixture was increased to room temperature, and the mixture was further stirred for 3 hours. After cooling, ultrapure water (500 mL) was added, and extraction with 300 mL of ethyl acetate was performed three times. Then, the thus obtained organic layer was washed with saturated saline (500 mL) and dried over sodium sulfate. The solvent was distilled off, and purification on silica gel column chromatography gave a compound (P3-1) with a yield of 99% or more.

A zinc powder (578 mmol) and N,N'-dimethylformamide (156 mL) were mixed and stirred at room temperature for 10 minutes, acetyl chloride (14.2 mmol) was then added dropwise, and the resulting mixture was stirred at room temperature for 1 hour. Then, an N,N'-dimethylformamide (60 ml) solution of the compound (P3-1) (142 mmol) and dibromomethane (234 mmol) was added dropwise for 2 hours. After the completion of dropwise addition, anhydrous acetic acid (142 mmol) was added dropwise, and the resulting mixture was stirred for 1 hour, and then 500 mL of a saturated aqueous ammonium chloride solution was added. Extraction with 300 mL of ethyl acetate was performed three times, and the thus obtained organic layer was washed with a saturated aqueous sodium hydrogen carbonate solution and then with saturated saline. The organic layer was dried over sodium sulfate and then concentrated, and purification on silica gel column chromatography gave a compound (Z-1) with a yield of 66%.

Synthesis Examples 2 to 20: Synthesis of Monomeric Compounds (Z-2) to (Z-20)

Monomeric compounds [Z] represented by the following formulas (Z-2) to (Z-20) were synthesized in the same manner as in Example 1 by appropriately selecting precursors.

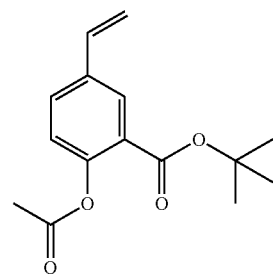
(Z-1)

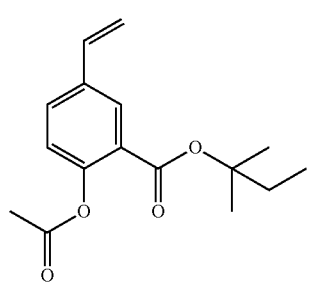
(Z-2)

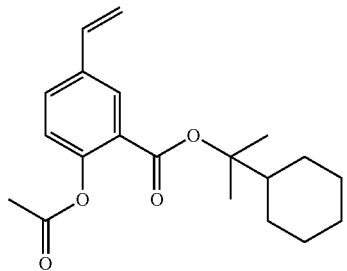
(Z-3)

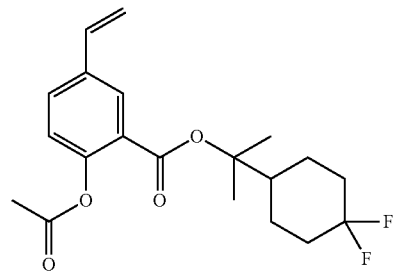
(Z-4)

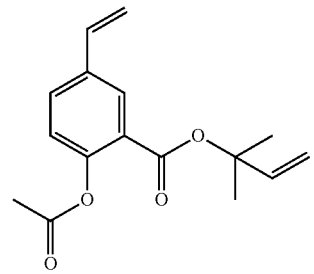
(Z-5)

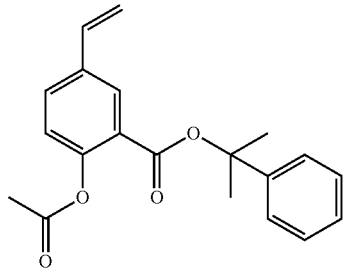
(Z-6)

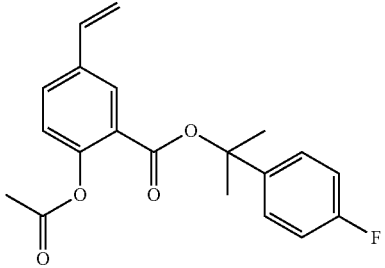
(Z-7)

(Z-8)
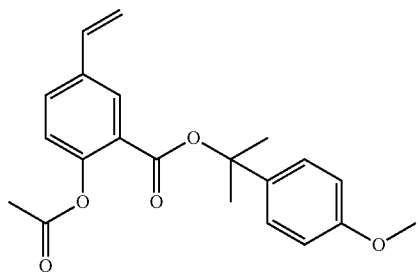
(Z-9)
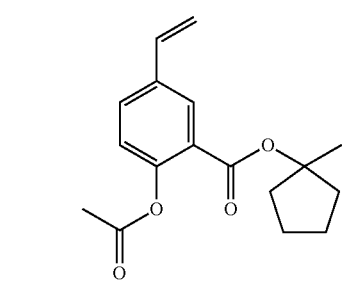
(Z-10)
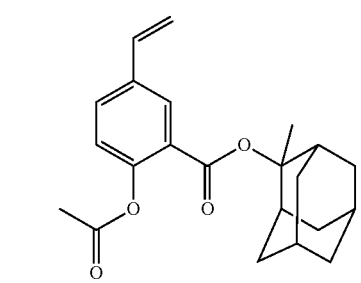
(Z-11)
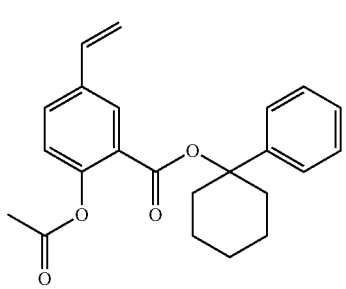
(Z-12)
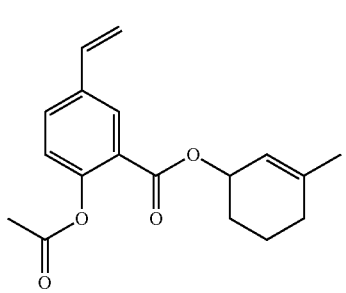
(Z-13)
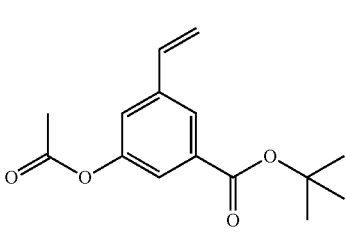
(Z-14)
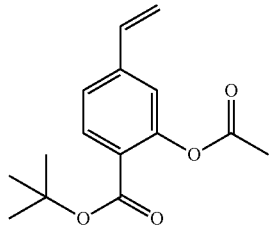
(Z-15)
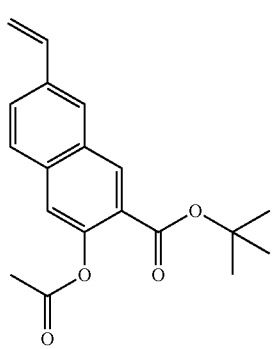
(Z-16)
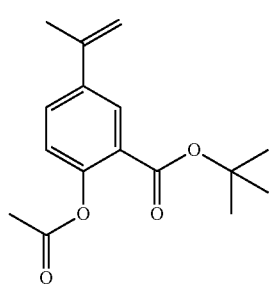
(Z-17)
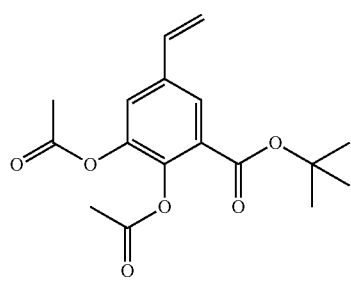
(Z-18)
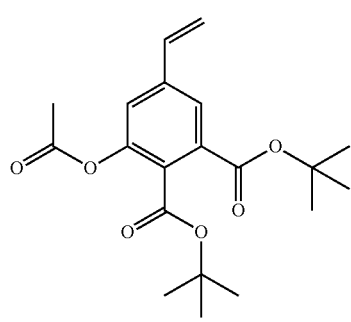

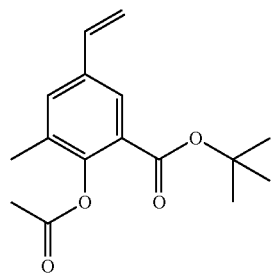

(Z-19)

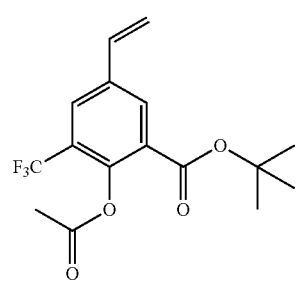

(Z-20)

Synthesis of Resin [A]

Monomers used for synthesis of resins in Examples and Comparative Examples are shown below. Compounds (M-4), (M-5), and (M-6) were used as compounds that gave the structural unit B1 having an acid-dissociable group as the structural unit B derived from a (meth)acrylic ester-based monomer, a compound (M-9) was used as a compound that gave the structural unit B2 having a non-acid-dissociable group as the structural unit B derived from a (meth)acrylic ester-based monomer, compounds (M-1), (M-2), and (M-3) were used as compounds that gave the structural unit C having a phenolic hydroxyl group, compounds (M-7) and (M-8) were used as compounds that gave the structural unit D having a polar group, and a compound (M-10) was used as a compound that gave the structural unit G forming a high fluorine-containing resin.

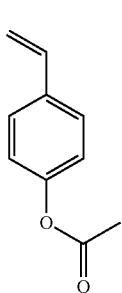

(M-1)

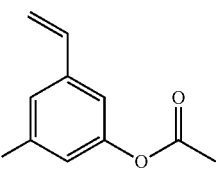

(M-2)

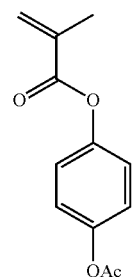

(M-3)

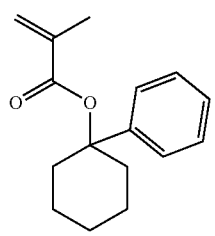

(M-4)

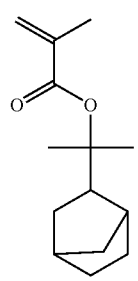

(M-5)

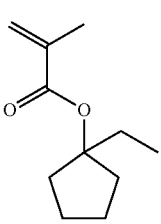

(M-6)

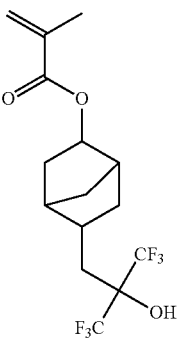

(M-7)

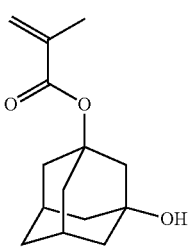

(M-8)

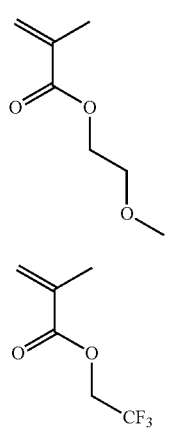

(M-9)

(M-10)

Synthesis Example 21: Synthesis of Resin (A-1)

The compound (Z-1) as a monomer was dissolved in propylene glycol monomethyl ether (200 parts by mass). As an initiator, 2,2'-azobis(methyl isobutyrate) (10 mol %) was added thereto to prepare a monomer solution. On the other hand, propylene glycol monomethyl ether (100 parts by mass with respect to the amount of all the monomers) was added to an empty reaction container and heated to 85° C. with stirring. Then, the monomer solution prepared above was dropped thereinto for 3 hours, and then the resulting mixture was further heated at 85° C. for 3 hours to perform a polymerization reaction for a total of 6 hours. After the completion of the polymerization reaction, the polymerization solution was cooled to room temperature. The polymerization solution was dropped into n-hexane (1,000 parts by mass) to coagulate and purify a polymer. Propylene glycol monomethyl ether (150 part by mass) was again added to the polymer. Further, methanol (150 parts by mass), triethylamine (1.5 molar equivalents with respect to the amount of the compound (Z-1) used), and water (1.5 molar equivalents with respect to the amount of the compound (Z-1) used) were added to the polymer, and the resulting mixture was hydrolyzed for 8 hours under reflux at a boiling point. After the completion of the reaction, the solvent and triethylamine were distilled off under a reduced pressure, and the thus obtained polymer was dissolved in acetone (150 parts by mass). The resulting solution was dropped into water (2,000 parts by mass) to coagulate the polymer. The thus produced white powder was separated by filtration and dried at 50° C. for 17 hours to obtain a resin (A-1) in the form of a white powder with a good yield.

Synthesis Examples 22 to 60: Synthesis of Resins (A-2) to (A-38), (CA-1), and (CA-2)

Resins (A-2) to (A-38), (CA-1), and (CA-2) were synthesized in the same manner as in Synthesis Example 21 by appropriately selecting monomers. It is to be noted that the amount of each of triethylamine and water used was the total of 1.5 molar equivalents with respect to the amount of the compounds (Z-1) to (Z-20), (M-1), and (M-3) used and 3.0 molar equivalents with respect to the amount of the compound (M-2) used.

The amount of each structural unit used and the values of Mw and Mw/Mn of each of the obtained resins are shown in Table 1.

TABLE 1

| | | Monomer* that gives structural unit A | | Monomer that gives structural unit B1 | | Monomer that gives structural unit B2 | | Monomer* that gives structural unit C | | Monomer that gives structural unit D | | | |
|---|---|---|---|---|---|---|---|---|---|---|---|---|---|
| | Resin | Type | Amount used (mol %) | Type | Amount used (mol %) | Type | Amount used (mol %) | Type | Amount used (mol %) | Type | Amount used (mol %) | Mw | Mw/Mn |
| Synthesis Example 21 | A-1 | Z-1 | 100 | — | — | — | — | — | — | — | — | 5800 | 1.4 |
| Synthesis Example 22 | A-2 | Z-1 | 55 | Z-5 | 45 | — | — | — | — | — | — | 4700 | 1.3 |
| Synthesis Example 23 | A-3 | Z-1 | 60 | — | — | — | — | M-3 | 40 | — | — | 5100 | 1.5 |
| Synthesis Example 24 | A-4 | Z-1 | 75 | — | — | — | — | — | — | M-7 | 25 | 7200 | 1.7 |
| Synthesis Example 25 | A-5 | Z-1 | 90 | — | — | — | — | — | — | M-8 | 10 | 4400 | 1.3 |
| Synthesis Example 26 | A-6 | Z-1 | 65 | — | — | M-9 | 35 | — | — | — | — | 4500 | 1.4 |
| Synthesis Example 27 | A-7 | Z-1 | 40 | Z-6 | 40 | — | — | M-3 | 20 | — | — | 5400 | 1.4 |
| Synthesis Example 28 | A-8 | Z-1 | 45 | — | — | M-4 | 55 | — | — | — | — | 6100 | 1.6 |
| Synthesis Example 29 | A-9 | Z-1 | 20 | — | — | M-4 | 40 | M-3 | 40 | — | — | 4800 | 1.6 |
| Synthesis Example 30 | A-10 | Z-1 | 45 | — | — | M-5 | 20 | M-3 | 35 | — | — | 5300 | 1.5 |
| Synthesis Example 31 | A-11 | Z-1 | 30 | — | — | M-6 | 40 | M-3 | 30 | — | — | 6800 | 1.7 |
| Synthesis Example 32 | A-12 | Z-1 | 35 | Z-14 | 5 | M-6 | 30 | M-9 | 30 | — | — | 5100 | 1.6 |
| Synthesis Example 33 | A-13 | Z-1 | 45 | — | — | — | — | M-1 | 55 | — | — | 6300 | 1.5 |
| Synthesis Example 34 | A-14 | Z-1 | 55 | — | — | — | — | M-2 | 45 | — | — | 6000 | 1.4 |
| Synthesis Example 35 | A-15 | Z-1 | 30 | — | — | M-4 | 25 | M-1 | 45 | — | — | 5500 | 1.6 |
| Synthesis Example 36 | A-16 | Z-1 | 40 | — | — | M-5 | 30 | M-1 | 30 | — | — | 7900 | 1.8 |
| Synthesis Example 37 | A-17 | Z-1 | 35 | — | — | M-6 | 35 | M-1 | 30 | — | — | 6100 | 1.3 |
| Synthesis Example 38 | A-18 | Z-1 | 10 | Z-10 | 25 | M-5 | 35 | M-1 | 30 | — | — | 4900 | 1.4 |
| Synthesis Example 39 | A-19 | Z-1 | 25 | — | — | M-5 | 20 | M-1 | 35 | M-7 | 20 | 6300 | 1.6 |
| Synthesis Example 40 | A-20 | Z-2 | 40 | — | — | M-5 | 30 | M-1 | 30 | — | — | 5400 | 1.5 |
| Synthesis Example 41 | A-21 | Z-3 | 40 | — | — | M-5 | 30 | M-1 | 30 | — | — | 5900 | 1.5 |
| Synthesis Example 42 | A-22 | Z-4 | 40 | — | — | M-5 | 30 | M-1 | 30 | — | — | 3900 | 1.3 |
| Synthesis Example 43 | A-23 | Z-5 | 40 | — | — | M-5 | 30 | M-1 | 30 | — | — | 6300 | 1.6 |
| Synthesis Example 44 | A-24 | Z-6 | 40 | — | — | M-5 | 30 | M-1 | 30 | — | — | 5900 | 1.5 |
| Synthesis Example 45 | A-25 | Z-7 | 40 | — | — | M-5 | 30 | M-1 | 30 | — | — | 4700 | 1.5 |
| Synthesis Example 46 | A-26 | Z-8 | 40 | — | — | M-5 | 30 | M-1 | 30 | — | — | 5800 | 1.4 |
| Synthesis Example 47 | A-27 | Z-9 | 40 | — | — | M-5 | 30 | M-1 | 30 | — | — | 6200 | 1.6 |
| Synthesis Example 48 | A-28 | Z-10 | 40 | — | — | M-5 | 30 | M-1 | 30 | — | — | 7100 | 1.7 |

TABLE 1-continued

| | | Monomer that gives structural unit A | | Monomer that gives structural unit B1 | | Monomer that gives structural unit B2 | | Monomer that gives structural unit C | | Monomer that gives structural unit D | | | |
|---|---|---|---|---|---|---|---|---|---|---|---|---|---|
| | Resin | Type | Amount used (mol %) | Type | Amount used (mol %) | Type | Amount used (mol %) | Type | Amount used (mol %) | Type | Amount used (mol %) | Mw | Mw/Mn |
| Synthesis Example 49 | A-29 | Z-11 | 40 | — | — | M-5 | 30 | — | — | M-1 | 30 | — | — | 5800 | 1.6 |
| Synthesis Example 50 | A-30 | Z-12 | 40 | — | — | M-5 | 30 | — | — | M-1 | 30 | — | — | 5600 | 1.6 |
| Synthesis Example 51 | A-31 | Z-13 | 40 | — | — | M-5 | 30 | — | — | M-1 | 30 | — | — | 5900 | 1.7 |
| Synthesis Example 52 | A-32 | Z-14 | 40 | — | — | M-5 | 30 | — | — | M-1 | 30 | — | — | 6000 | 1.6 |
| Synthesis Example 53 | A-33 | Z-15 | 40 | — | — | M-5 | 30 | — | — | M-1 | 30 | — | — | 6800 | 1.5 |
| Synthesis Example 54 | A-34 | Z-16 | 40 | — | — | M-5 | 30 | — | — | M-1 | 30 | — | — | 5000 | 1.6 |
| Synthesis Example 55 | A-35 | Z-17 | 40 | — | — | M-5 | 30 | — | — | M-1 | 30 | — | — | 6200 | 1.4 |
| Synthesis Example 56 | A-36 | Z-18 | 40 | — | — | M-5 | 30 | — | — | M-1 | 30 | — | — | 8200 | 1.6 |
| Synthesis Example 57 | A-37 | Z-19 | 40 | — | — | M-5 | 30 | — | — | M-1 | 30 | — | — | 5000 | 1.5 |
| Synthesis Example 58 | A-38 | Z-20 | 40 | — | — | M-5 | 30 | — | — | M-1 | 30 | — | — | 5300 | 1.7 |
| Synthesis Example 59 | CA-1 | — | — | — | — | M-5 | 40 | — | — | M-1 | 40 | M-7 | 20 | 4500 | 1.5 |
| Synthesis Example 60 | CA-2 | — | — | — | — | M-5 | 45 | — | — | M-3 | 40 | M-8 | 15 | 7800 | 1.6 |

The acetyl group moiety in the monomer that gives a structural unit A or C is converted to —OH by hydrolysis in the resin.

Synthesis Example 61: Synthesis of High Fluorine-Containing Resin (B)

The compound (M-6) and the compound (M-10) as monomers were dissolved in 2-butanone (100 parts by mass) so that a molar ratio between them was 70/30. As an initiator, azobisisobutyronitrile (5 mol %) was added thereto to prepare a monomer solution. On the other hand, 2-butanone (50 parts by mass) was placed in an empty reaction container, and the reaction container was purged with nitrogen for 30 minutes. The temperature in the reaction container was elevated to 80° C., and the monomer solution was added dropwise for 3 hours with stirring. The time point of start of dropwise addition was regarded as the time point of start of a polymerization reaction, and the polymerization reaction was performed for 6 hours. After the completion of the polymerization reaction, the resulting polymerization solution was cooled with water to 30° C. or lower. The reaction solution was transferred into a separating funnel and then homogeneously diluted with hexane (150 parts by mass), and then methanol (600 parts by mass) and water (30 parts by mass) were charged into the separating funnel and mixed. After the mixture was left to stand for 30 minutes, a lower layer was collected, and the solvent was replaced with propylene glycol monomethyl ether acetate to obtain a propylene glycol monomethyl ether acetate solution containing a high fluorine-containing resin (B).

Preparation of Radiation-Sensitive Resin Composition

Radiation-sensitive acid generators [C], other radiation-sensitive acid generators [CC], acid diffusion controlling agents [D], and solvents [E] used for preparation of radiation-sensitive resin compositions of Examples and Comparative Examples that will be described later are shown below.

[C] Radiation-Sensitive Acid Generators

Compounds represented by the following formulas (C-1) to (C-11) were used as radiation-sensitive acid generators.

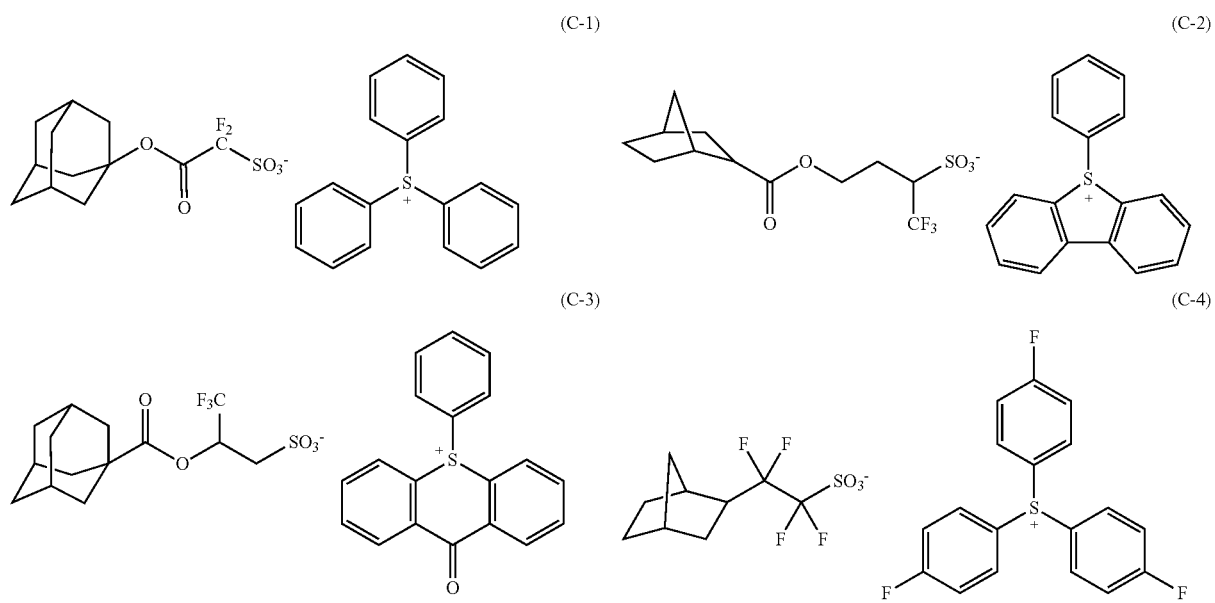

-continued
(C-5)
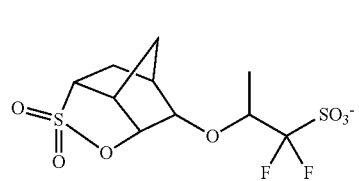 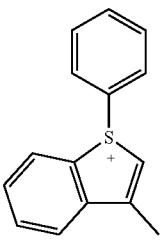
(C-6)
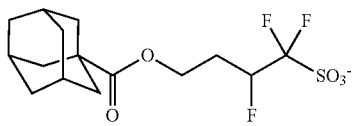 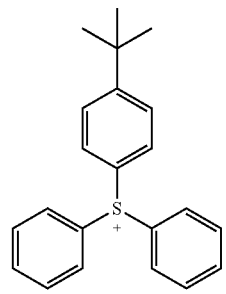
(C-7)
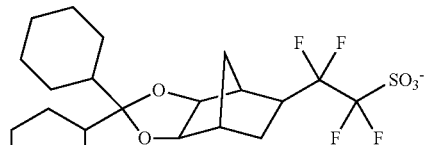 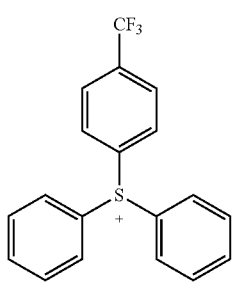
(C-8)
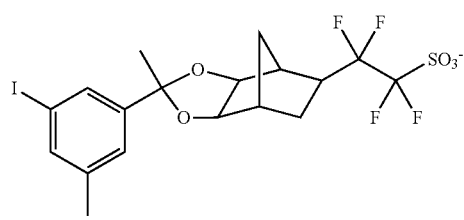 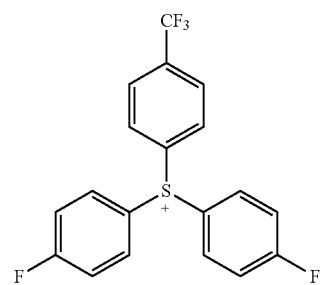
(C-9)
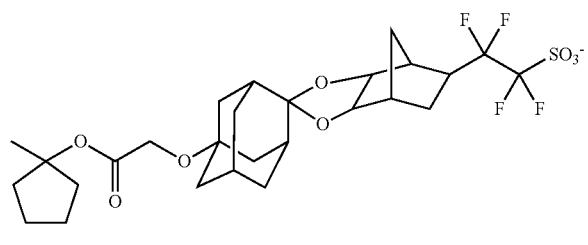 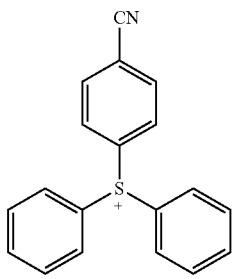
(C-10)
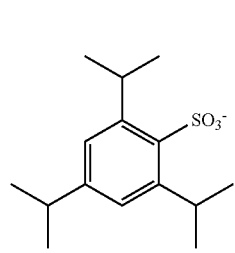 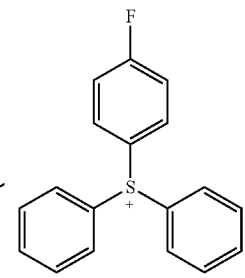
(C-11)
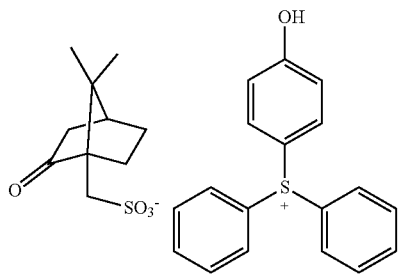

[CC] Other Radiation-Sensitive Acid Generators

Compounds represented by the following formulas (CC-1) and (CC-2) were used as other radiation-sensitive acid generators.

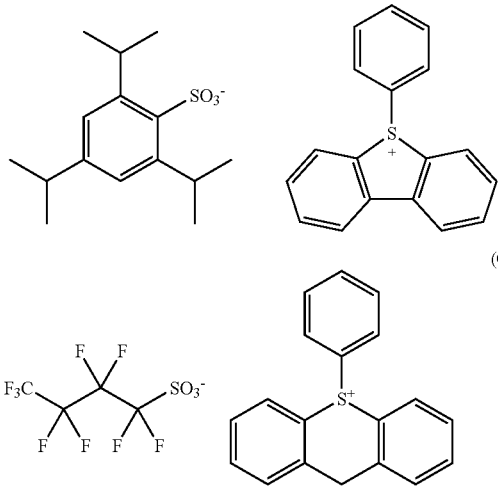

(CC-1)

(CC-2)

[D] Acid Diffusion Controlling Agents

Compounds represented by the following formulas (D-1) to (D-3) were used as acid diffusion controlling agents.

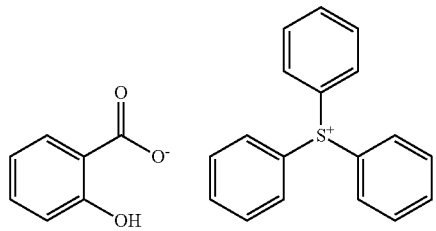

(D-1)

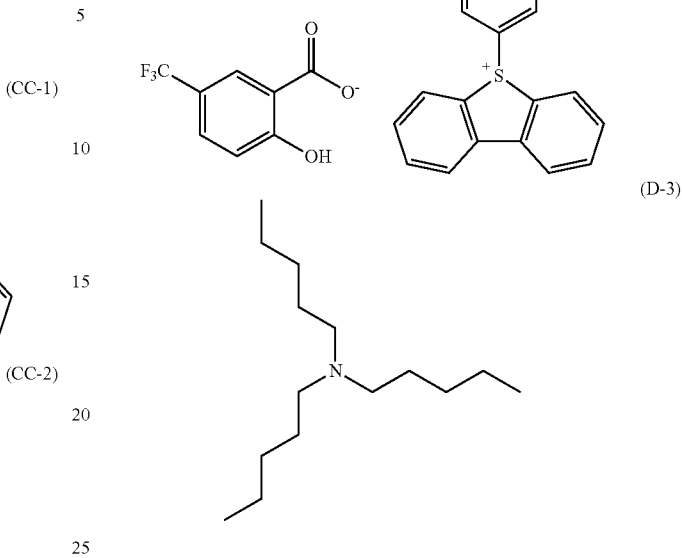

(D-2)

(D-3)

[E] Solvents

E-1: propylene glycol monomethyl ether acetate
E-2: propylene glycol monomethyl ether

Example 1

A radiation-sensitive resin composition (R-1) was prepared by blending 100 parts by mass of (A-1) as the resin [A], 1 part by mass of (B) as the high fluorine-containing resin [B], 5 parts by mass of (C-1) as the radiation-sensitive acid generator [C], 20 mol % of (D-1) as the acid diffusion controlling agent [D] with respect to the amount of the (C-1), and 7700 parts by mass of (E-1) and 3300 parts by mass of (E-2) as the organic solvents [E].

Examples 2 to 38 and Comparative Examples 1 to 5

Radiation-sensitive resin compositions (R-2) to (R-38) and (CR-1) to (CR-5) were prepared in the same manner as in Example 1 except that the type and content of each component used were changed as shown in the following Table 2.

TABLE 2

| | Radiation-sensitive resin composition | [A] Resin Type | [A] Resin parts by mass | [B] High fluorine-containing agent parts by mass | [C] Radiation-sensitive acid generator Type | [C] parts by mass | Type | parts by mass | [D] Acid diffusion controlling agent Type | mol % with respect to [C] | [E] Solvent Type | [E] parts by mass |
|---|---|---|---|---|---|---|---|---|---|---|---|---|
| Example 1 | R-1 | A-1 | 100 | 1 | C-1 | 5 | — | — | D-1 | 20 | E-1/E-2 | 7700/3300 |
| Example 2 | R-2 | A-2 | 100 | 1 | C-1 | 10 | — | — | D-2 | 50 | E-1/E-2 | 7700/3300 |
| Example 3 | R-3 | A-3 | 100 | 1 | C-1 | 10 | — | — | D-1 | 50 | E-1/E-2 | 7700/3300 |
| Example 4 | R-4 | A-4 | 100 | 5 | C-1 | 7 | — | — | D-2 | 20 | E-1/E-2 | 7700/3300 |
| Example 5 | R-5 | A-5 | 100 | 1 | C-3 | 10 | — | — | D-1 | 45 | E-1/E-2 | 7700/3300 |
| Example 6 | R-6 | A-6 | 100 | 1 | C-2 | 13 | — | — | D-1 | 50 | E-1/E-2 | 7700/3300 |
| Example 7 | R-7 | A-7 | 100 | 1 | C-2 | 15 | — | — | D-2 | 30 | E-1/E-2 | 7700/3300 |
| Example 8 | R-8 | A-8 | 100 | 1 | C-2 | 15 | — | — | D-2 | 50 | E-1/E-2 | 7700/3300 |
| Example 9 | R-9 | A-9 | 100 | 0 | C-2 | 20 | — | — | D-2 | 45 | E-1/E-2 | 7700/3300 |
| Example 10 | R-10 | A-10 | 100 | 1 | C-2 | 15 | — | — | D-1 | 50 | E-1/E-2 | 7700/3300 |
| Example 11 | R-11 | A-11 | 100 | 1 | C-3 | 22 | — | — | D-3 | 15 | E-1/E-2 | 7700/3300 |
| Example 12 | R-12 | A-12 | 100 | 1 | C-3 | 15 | — | — | D-2 | 50 | E-1/E-2 | 7700/3300 |

TABLE 2-continued

| | Radiation-sensitive resin composition | [A] Resin Type | parts by mass | [B] High fluorine-containing agent parts by mass | [C] Radiation-sensitive acid generator Type | parts by mass | Type | parts by mass | [D] Acid diffusion controlling agent Type | mol % with respect to [C] | [E] Solvent Type | parts by mass |
|---|---|---|---|---|---|---|---|---|---|---|---|---|
| Example 13 | R-13 | A-13 | 100 | 1 | C-4 | 40 | — | — | D-1 | 20 | E-1/E-2 | 7700/3300 |
| Example 14 | R-14 | A-14 | 100 | 1 | C-5 | 20 | C-7 | 20 | D-2 | 50 | E-1/E-2 | 7700/3300 |
| Example 15 | R-15 | A-15 | 100 | 1 | C-5 | 20 | C-1 | 20 | D-2 | 30 | E-1/E-2 | 7700/3300 |
| Example 16 | R-16 | A-16 | 100 | 1 | C-5 | 15 | — | — | D-1 | 50 | E-1/E-2 | 7700/3300 |
| Example 17 | R-17 | A-17 | 100 | 1 | C-6 | 10 | — | — | D-2 | 30 | E-1/E-2 | 7700/3300 |
| Example 18 | R-18 | A-18 | 100 | 1 | C-6 | 18 | — | — | D-1 | 45 | E-1/E-2 | 7700/3300 |
| Example 19 | R-19 | A-19 | 100 | 1 | C-6 | 15 | — | — | D-3 | 10 | E-1/E-2 | 7700/3300 |
| Example 20 | R-20 | A-20 | 100 | 1 | C-6 | 20 | — | — | D-2 | 45 | E-1/E-2 | 7700/3300 |
| Example 21 | R-21 | A-21 | 100 | 1 | C-6 | 13 | — | — | D-1 | 45 | E-1/E-2 | 7700/3300 |
| Example 22 | R-22 | A-22 | 100 | 1 | C-6 | 22 | — | — | D-1 | 30 | E-1/E-2 | 7700/3300 |
| Example 23 | R-23 | A-23 | 100 | 1 | C-7 | 25 | — | — | D-1 | 45 | E-1/E-2 | 7700/3300 |
| Example 24 | R-24 | A-24 | 100 | 1 | C-7 | 20 | — | — | D-2 | 20 | E-1/E-2 | 7700/3300 |
| Example 25 | R-25 | A-25 | 100 | 1 | C-7 | 25 | — | — | D-1 | 30 | E-1/E-2 | 7700/3300 |
| Example 26 | R-26 | A-26 | 100 | 1 | C-7 | 25 | — | — | D-1 | 50 | E-1/E-2 | 7700/3300 |
| Example 27 | R-27 | A-27 | 100 | 1 | C-8 | 25 | — | — | D-1 | 30 | E-1/E-2 | 7700/3300 |
| Example 28 | R-28 | A-28 | 100 | 1 | C-8 | 25 | — | — | D-2 | 35 | E-1/E-2 | 7700/3300 |
| Example 29 | R-29 | A-29 | 100 | 1 | C-8 | 20 | — | — | D-1 | 30 | E-1/E-2 | 7700/3300 |
| Example 30 | R-30 | A-30 | 100 | 1 | C-8 | 25 | — | — | D-1 | 50 | E-1/E-2 | 7700/3300 |
| Example 31 | R-31 | A-31 | 100 | 1 | C-9 | 15 | — | — | D-1 | 35 | E-1/E-2 | 7700/3300 |
| Example 32 | R-32 | A-32 | 100 | 1 | C-9 | 25 | — | — | D-3 | 10 | E-1/E-2 | 7700/3300 |
| Example 33 | R-33 | A-33 | 100 | 1 | C-10 | 10 | — | — | D-2 | 50 | E-1/E-2 | 7700/3300 |
| Example 34 | R-34 | A-34 | 100 | 1 | C-10 | 20 | — | — | D-1 | 20 | E-1/E-2 | 7700/3300 |
| Example 35 | R-35 | A-35 | 100 | 1 | C-11 | 15 | — | — | D-1 | 45 | E-1/E-2 | 7700/3300 |
| Example 36 | R-36 | A-36 | 100 | 1 | C-11 | 25 | — | — | D-2 | 30 | E-1/E-2 | 7700/3300 |
| Example 37 | R-37 | A-37 | 100 | 1 | C-11 | 28 | — | — | D-2 | 20 | E-1/E-2 | 7700/3300 |
| Example 38 | R-38 | A-38 | 100 | 1 | C-11 | 20 | — | — | D-1 | 30 | E-1/E-2 | 7700/3300 |
| Comparative Example 1 | CR-1 | CA-1 | 100 | 1 | C-1 | 20 | — | — | D-1 | 30 | E-1/E-2 | 7700/3300 |
| Comparative Example 2 | CR-2 | CA-2 | 100 | 1 | C-8 | 20 | — | — | D-1 | 30 | E-1/E-2 | 7700/3300 |
| Comparative Example 3 | CR-3 | A-17 | 100 | 1 | CC-1 | 20 | — | — | D-1 | 30 | E-1/E-2 | 7700/3300 |
| Comparative Example 4 | CR-4 | A-17 | 100 | 1 | CC-2 | 20 | — | — | D-1 | 30 | E-1/E-2 | 7700/3300 |
| Comparative Example 5 | CR-5 | CA-1 | 100 | 1 | CC-1 | 20 | — | — | D-1 | 30 | E-1/E-2 | 7700/3300 |

<Resist Pattern Formation>

Each of the radiation-sensitive resin compositions prepared above was applied using a spin coater (CLEAN TRACK ACT12 manufactured by Tokyo Electron Ltd.) onto the surface of a 12-inch silicon wafer having a lower layer film with a thickness of 20 nm (AL412 (manufactured by Brewer Science)). After soft baking (SB) was performed at 100° C. for 60 seconds, cooling was performed at 23° C. for 30 seconds to form a resist film having a thickness of 30 nm. Then, the resist film was irradiated with EUV light using an EUV scanner (type "NXE3300", manufactured by ASML, NA=0.33, lighting condition: Conventional, s=0.89). The resist film was subjected to post-exposure baking (PEB) at 100° C. for 60 seconds. Then, the resist film was developed at 23° C. for 30 seconds with a 2.38 wt % aqueous tetramethylammonium hydroxide solution to form contact hole patterns (diameter: 25 nm, pitch: 50 nm).

<Evaluation>

The sensitivity, CDU performance, and resolution of each of the radiation-sensitive resin compositions were evaluated by performing measurements on each of the resist patterns formed above according to the following methods. It is to be noted that a scanning electron microscope ("CG-5000" manufactured by Hitachi High-Tech Corporation) was used for measurement of the resist pattern. The evaluation results are shown in the following Table 3.

[Sensitivity]

An exposure dose at which a contact hole pattern having a diameter of 25 nm was formed in the resist pattern formation was defined as an optimum exposure dose, and the optimum exposure dose was evaluated as sensitivity (mJ/cm$^2$). When the optimum exposure dose was 60 mJ/cm$^2$ or less, sensitivity was evaluated as "excellent", and the optimum exposure dose exceeds 60 mJ/cm$^2$, sensitivity was evaluated as "poor".

[CDU Performance]

The resist pattern was observed from above using the scanning electron microscope, and measurement was performed at freely-selected 800 points in total. A size variation (3σ) was determined and evaluated as CDU performance (nm). The smaller value indicates that a hole diameter variation in a long period is smaller and CDU performance is better. When the value was 4.5 nm or less, CDU performance was evaluated as "excellent" and when the value exceeded 4.5 nm, CDU performance was evaluated as "poor".

[Resolution]

The diameter of a minimum contact hole pattern resolved when an exposure dose was changed was measured, and this measurement value was defined as resolution (nm). The smaller value indicates that resolution is better. When the value was 22 nm or less, resolution was evaluated as "excellent", and when the value exceeded 22 nm, resolution was evaluated as "poor".

TABLE 3

| | Radiation-sensitive resin composition | Sensitivity (mJ/cm$^2$) | CDU (nm) | Resolution (nm) |
|---|---|---|---|---|
| Example 1 | R-1 | 59 | 4.2 | 20 |
| Example 2 | R-2 | 53 | 4.4 | 21 |
| Example 3 | R-3 | 55 | 4.2 | 20 |
| Example 4 | R-4 | 54 | 4.2 | 20 |
| Example 5 | R-5 | 52 | 4.1 | 20 |
| Example 6 | R-6 | 53 | 4.2 | 20 |
| Example 7 | R-7 | 51 | 4.2 | 19 |
| Example 8 | R-8 | 49 | 4.1 | 19 |
| Example 9 | R-9 | 50 | 4.0 | 20 |
| Example 10 | R-10 | 48 | 3.8 | 19 |
| Example 11 | R-11 | 49 | 4.1 | 19 |
| Example 12 | R-12 | 49 | 4.0 | 20 |
| Example 13 | R-13 | 47 | 4.0 | 20 |
| Example 14 | R-14 | 45 | 4.0 | 19 |
| Example 15 | R-15 | 48 | 3.9 | 19 |
| Example 16 | R-16 | 49 | 3.7 | 18 |
| Example 17 | R-17 | 47 | 3.8 | 19 |
| Example 18 | R-18 | 45 | 3.6 | 18 |
| Example 19 | R-19 | 45 | 3.7 | 19 |
| Example 20 | R-20 | 44 | 3.6 | 19 |
| Example 21 | R-21 | 42 | 3.7 | 19 |
| Example 22 | R-22 | 40 | 3.8 | 18 |
| Example 23 | R-23 | 44 | 3.6 | 19 |
| Example 24 | R-24 | 45 | 3.7 | 19 |
| Example 25 | R-25 | 45 | 3.5 | 18 |
| Example 26 | R-26 | 41 | 3.8 | 18 |
| Example 27 | R-27 | 39 | 3.5 | 17 |
| Example 28 | R-28 | 38 | 3.6 | 18 |
| Example 29 | R-29 | 40 | 3.5 | 18 |
| Example 30 | R-30 | 39 | 3.5 | 17 |
| Example 31 | R-31 | 49 | 4.0 | 20 |
| Example 32 | R-32 | 45 | 3.6 | 19 |
| Example 33 | R-33 | 40 | 3.8 | 18 |
| Example 34 | R-34 | 40 | 3.7 | 18 |
| Example 35 | R-35 | 42 | 3.8 | 20 |
| Example 36 | R-36 | 46 | 3.5 | 19 |
| Example 37 | R-37 | 44 | 3.7 | 19 |
| Example 38 | R-38 | 43 | 3.5 | 18 |
| Comparative Example 1 | CR-1 | 72 | 5.0 | 24 |
| Comparative Example 2 | CR-2 | 65 | 4.9 | 23 |
| Comparative Example 3 | CR-3 | 68 | 5.2 | 24 |
| Comparative Example 4 | CR-4 | 70 | 5.5 | 24 |
| Comparative Example 5 | CR-5 | 75 | 5.8 | 23 |

Synthesis of Monomeric Compound [Z]

Synthesis Example 62: Synthesis of Monomeric Compound (Z-21)

A monomeric compound (Z-21) was synthesized according to the following reaction scheme.

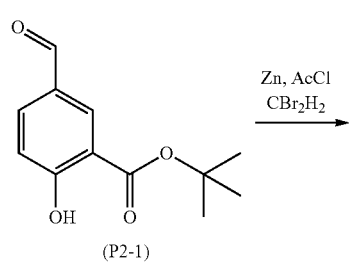

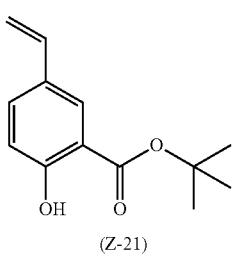

A zinc powder (578 mmol) and N,N'-dimethylformamide (156 mL) were mixed and stirred at room temperature for 10 minutes, acetyl chloride (14.2 mmol) was then added dropwise, and the resulting mixture was stirred at room temperature for 1 hour. Then, a N,N'-dimethylformamide (60 mL) solution of the compound (P2-1) (142 mmol) and dibromomethane (234 mmol) was added dropwise for 2 hours. After the completion of dropwise addition, 500 mL of a saturated aqueous ammonium chloride solution was added. Extraction with 300 mL of ethyl acetate was performed three times, and the thus obtained organic layer was washed with a saturated aqueous sodium hydrogen carbonate solution and then with saturated saline. The organic layer was dried over sodium sulfate, then concentrated, and purified by silica gel column chromatography to obtain a compound (Z-21) with a yield of 52%.

<Synthesis of Resin [A]>

Monomers used for synthesis of resins in Examples and Comparative Examples are shown below. (M-11) and (M-12) were used as compounds that gave the structural unit C having a phenolic hydroxyl group, and (M-13) and (M-14) were used as compounds that gave a structural unit having a radiation-sensitive acid generating group.

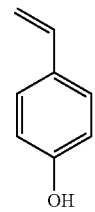

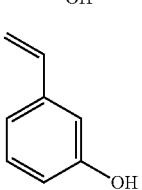

-continued

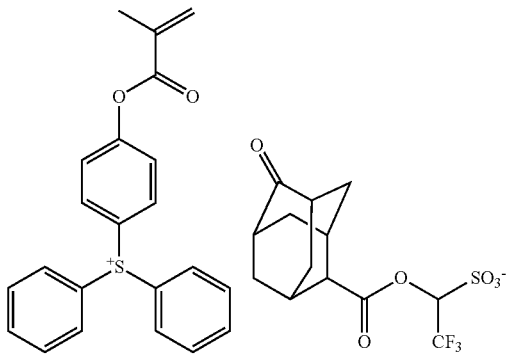

(M-14)

Synthesis Example 63: Synthesis of Resin (A-39)

The compound (Z-21), the compound (M-6), the compound (M-12), and the compound (M-13) as monomers were dissolved in tetrahydrofuran (200 parts by mass) so that a molar ratio among them was 10/45/30/15. As an initiator, 2,2'-azobis(isomethylbutyrate) (10 mol %) was added thereto to prepare a monomer solution. On the other hand, tetrahydrofuran (100 parts by mass with respect to the total amount of all the monomers) was added to an empty reaction container and refluxed with stirring. Then, the monomer solution prepared above was added dropwise for 3 hours, and then the resulting mixture was further refluxed for 3 hours to perform a polymerization reaction for 6 hours in total. After the completion of the polymerization reaction, the polymerization solution was cooled to room temperature. The polymerization solution was added dropwise to methanol (1,000 parts by mass) to coagulate and purify a polymer. Further, the polymer was repeatedly washed with hexane and then isolated and dried so that a resin (A-39) was obtained in the form of a white powder with a good yield.

Synthesis Example 64: Synthesis of Resin (A-40)

A resin (A-40) was synthesized in the same manner as in Synthesis Example 63 by appropriately selecting monomers.

The amount of each structural unit used and the values of Mw and Mw/Mn of each of the obtained resins are shown in Table 4.

TABLE 4

|  |  | Monomer that gives structural unit A | | Monomer that gives structural unit B1 | | Monomer that gives structural unit C | | Monomer that gives structural unit D | | | |
|---|---|---|---|---|---|---|---|---|---|---|---|
| Resin | Type | Type | Amount used (mol %) | Type | Amount used (mol %) | Type | Amount used (mol %) | Type | Amount used (mol %) | Mw | Mw/Mn |
| Synthesis Example 63 | A-39 | Z-21 | 10 | M-6 | 45 | M-12 | 30 | M-13 | 15 | 4500 | 1.6 |
| Synthesis Example 64 | A-40 | Z-21 | 20 | M-5 | 40 | M-11 | 30 | M-14 | 10 | 5000 | 1.7 |

Preparation of Radiation-Sensitive Resin Composition

Radiation-sensitive acid generators [C], other radiation-sensitive acid generators [CC], acid diffusion controlling agents [D], and solvents [E] used for preparation of radiation-sensitive resin compositions of the following Examples and Comparative Examples are shown below.

[C] Radiation-Sensitive Acid Generators

Compounds represented by the following formulas (C-12) to (C-14) were used as radiation-sensitive acid generators.

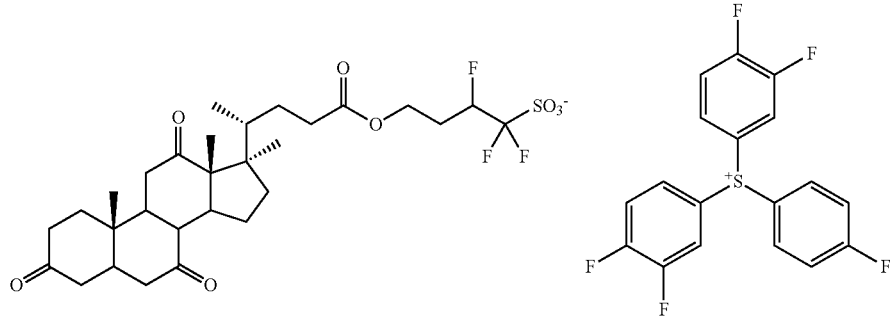

(C-12)

-continued

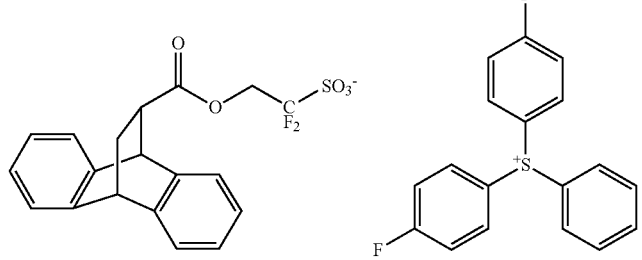

(C-13)

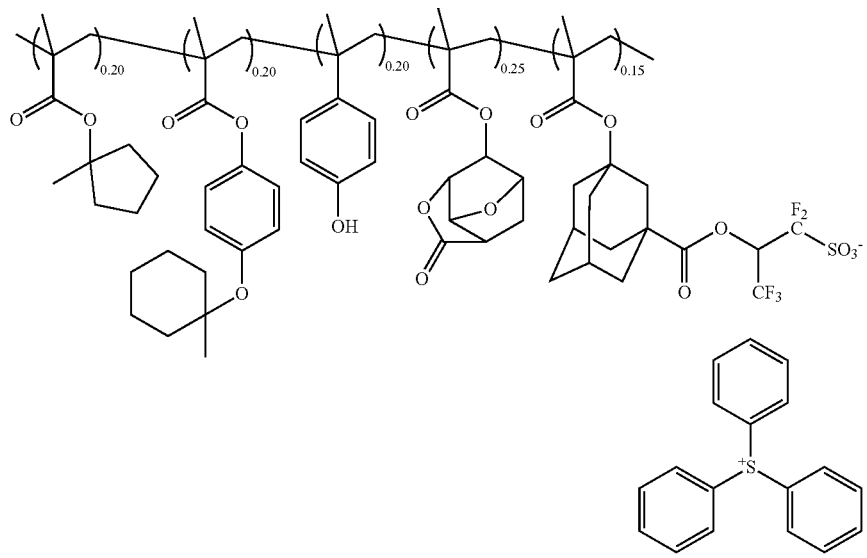

(C-14)

Examples 39 to 43

Radiation-sensitive resin compositions (R-39) to (R-43) were prepared in the same manner as in Example 1 except that the type and content of each component used were changed as shown in the following Table 5.

TABLE 5

| | Radiation-sensitive resin composition | [A] Resin Type | [A] Resin parts by mass | [B] High fluorine-containing agent parts by mass | [C] Radiation-sensitive acid generator Type | [C] Radiation-sensitive acid generator parts by mass | [D] Acid diffusion controlling agent Type | [D] Acid diffusion controlling agent mol % with respect to [C] | [E] Solvent Type | [E] Solvent parts by mass |
|---|---|---|---|---|---|---|---|---|---|---|
| Example 39 | R-39 | A-15 | 100 | 1 | C-12 | 20 | D-1 | 30 | E-1/E-2 | 7700/3300 |
| Example 40 | R-40 | A-15 | 100 | 1 | C-13 | 20 | D-1 | 30 | E-1/E-2 | 7700/3300 |
| Example 41 | R-41 | A-15 | 100 | 1 | C-14 | 30 | D-1 | 30 | E-1/E-2 | 7700/3300 |
| Example 42 | R-42 | A-39 | 100 | 1 | C-1 | 20 | D-1 | 30 | E-1/E-2 | 7700/3300 |
| Example 43 | R-43 | A-40 | 100 | 1 | C-1 | 20 | D-1 | 30 | E-1/E-2 | 7700/3300 |

<Resist Pattern Formation and Evaluation>

Contact hole patterns (diameter: 25 nm, pitch: 50 nm) were formed in the same manner as in Examples 1 to 38 and Comparative Examples 1 to 5. Then, sensitivity, CDU performance, and resolution of each of the radiation-sensitive resin compositions were evaluated in the same manner as in Examples 1 to 38 and Comparative Examples 1 to 5 by measuring each of the resist patterns formed above. The evaluation results are shown in the following Table 6.

TABLE 6

| | Radiation-sensitive resin composition | Sensitivity (mJ/cm$^2$) | CDU (nm) | Resolution (nm) |
|---|---|---|---|---|
| Example 39 | R-39 | 55 | 4.2 | 20 |
| Example 40 | R-40 | 48 | 4.3 | 20 |
| Example 41 | R-41 | 52 | 4.0 | 19 |
| Example 42 | R-42 | 54 | 4.4 | 20 |
| Example 43 | R-43 | 57 | 4.2 | 21 |

Preparation of Radiation-Sensitive Resin Composition

An acid diffusion controlling agent [D] used for preparation of a radiation-sensitive resin composition of the following Example is shown below.

[D] Acid Diffusion Controlling Agent

A compound represented by the following formula (D-4) was used as an acid diffusion controlling agent.

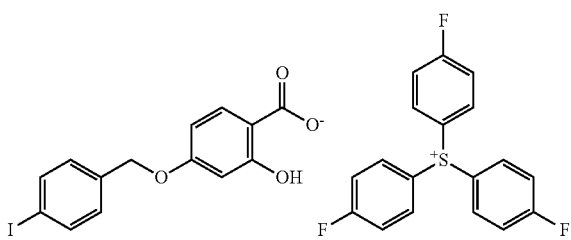

(D-4)

Example 44

A radiation-sensitive resin composition (R-44) was prepared in the same manner as in Example 1 except that the type and content of each component used was changed as shown in the following Table 7.

<Resist Pattern Formation and Evaluation>

Contact hole patterns (diameter: 25 nm, pitch: 50 nm) were formed in the same manner as in Examples 1 to 38 and Comparative Examples 1 to 5. Then, sensitivity, CDU performance, and resolution of each of the radiation-sensitive resin compositions were evaluated in the same manner as in Examples 1 to 38 and Comparative Examples 1 to 5 by observing each of the resist patterns formed above. The evaluation results are shown in the following Table 8.

TABLE 8

| | Radiation-sensitive resin composition | Sensitivity (mJ/cm$^2$) | CDU (nm) | Resolution (nm) |
|---|---|---|---|---|
| Example 44 | R-44 | 37 | 3.4 | 16 |

As apparent from the results shown in Table 3 and Table 6, all the radiation-sensitive resin compositions of Examples were superior in sensitivity, CDU performance, and resolution to the radiation-sensitive resin compositions of Comparative Examples. As apparent from the results shown in Table 8, the radiation-sensitive resin composition of Example were excellent in sensitivity, CDU performance, and resolution.

The radiation-sensitive resin composition and the method for forming a pattern according to the present embodiments make it possible to improve sensitivity, CDU, and resolution than ever before. Therefore, they can suitably be used for fine resist pattern formation in the lithography process of various electronic devices such as semiconductor devices and liquid crystal devices.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive resin composition comprising:
 a resin comprising a structural unit A represented by formula (1);
 at least one radiation-sensitive acid generator selected from the group consisting of a radiation-sensitive acid generator represented by formula (2-1) and a radiation-sensitive acid generator represented by formula (2-2); and

TABLE 7

| Radiation-sensitive resin composition | [A] Resin | | [B] High fluorine-containing agent | [C] Radiation-sensitive acid generator | | [D] Acid diffusion controlling agent | | [E] Solvent | |
|---|---|---|---|---|---|---|---|---|---|
| | Type | parts by mass | parts by mass | Type | parts by mass | Type | mol % with respect to [C] | Type | parts by mass |
| Example 44 R-44 | A-27 | 100 | 1 | C-8 | 25 | D-4 | 30 | E-1/E-2 | 7700/3300 | a solvent:

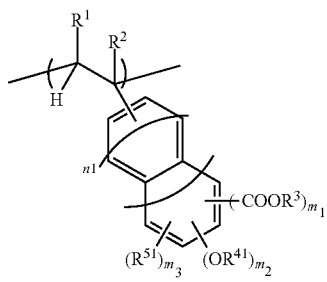
(1)

wherein
$R^1$ and $R^2$ are each independently a hydrogen atom, a fluorine atom, a methyl group, or a trifluoromethyl group,
$R^3$ is an acid-dissociable group or a non-acid-dissociable group, provided that when one $R^3$ is present, the $R^3$ is an acid-dissociable group and when two or more $R^3$s are present, at least one of the two or more $R^3$s is an acid-dissociable group, and when two or more $R^3$s are present, the two or more $R^3$s are the same or different from each other,
$R^{41}$ is a hydrogen atom or a protective group to be deprotected by action of an acid, and when two or more $R^{41}$s are present, the two or more $R^{41}$s are the same or different from each other,
$R^{51}$ is a cyano group, a nitro group, an alkyl group, a fluorinated alkyl group, an alkoxycarbonyloxy group, an acyl group, or an acyloxy group, and when two or more $R^{31}$s are present, the two or more $R^{51}$s are the same or different from each other, and
$n_1$ is an integer of 0 to 2, $m_1$ is an integer of 1 to 8, $m_2$ is an integer of 1 to 8, and $m_3$ is an integer of 0 to 6, provided that $n_1$, $m_1$, $m_2$, and $m_3$ satisfy $2 \leq m_1+m_2+m_3 \leq 2n_1+5$;

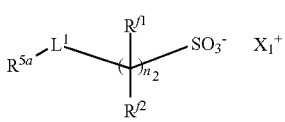
(2-1)

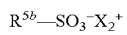
(2-2)

wherein
in the formula (2-1),
$n_2$ is an integer of 1 to 5,
$R^{f1}$ and $R^{f2}$ are each independently a hydrogen atom, a fluorine atom, or a fluoroalkyl group, provided that when $n_2$ is 1, at least one of $R^{f1}$ and $R^{f2}$ is a fluorine atom or a fluoroalkyl group and when $n_2$ is 2 to 5, at least one of two or more $R^{f1}$s and two or more $R^{f2}$s is a fluorine atom or a fluoroalkyl group, the two or more $R^{f1}$s are the same or different from each other, and the two or more $R^{f2}$s are the same or different from each other, $L_1$ is a divalent linking group,
$R^{5a}$ is a monovalent organic group having a cyclic structure,
$x_1^+$ is a monovalent onium cation;
in the formula (2-2),
$R^{5b}$ is a monovalent organic group, and
$X_2^+$ is a monovalent onium cation whose atom having a positive charge is not an atom forming a cyclic structure.

2. The radiation-sensitive resin composition according to claim 1, wherein the resin further comprises a structural unit B derived from a (meth)acrylic ester-based monomer.

3. The radiation-sensitive resin composition according to claim 2, wherein the structural unit B has an acid-dissociable group.

4. The radiation-sensitive resin composition according to claim 1, wherein the resin further comprises a structural unit C represented by formula (5):

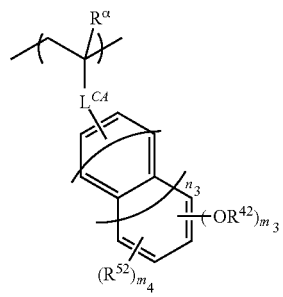
(5)

wherein
$R^\alpha$ is a hydrogen atom, a fluorine atom, a methyl group, or a trifluoromethyl group,
$L^{CA}$ is a single bond, —COO—*, or —O—*, wherein * represents a hand bonding to an aromatic ring,
$R^{42}$ and $R^{52}$ have the same meaning as $R^{41}$ and $R^{51}$ in formula (1), respectively, and
$n_3$ is an integer of 0 to 2, $m_3$ is an integer of 1 to 8, and $m_4$ is an integer of 0 to 8, provided that $n_3$, $m_3$, and $m_4$ satisfy $1 \leq m_3+m_4 \leq 2n_3+5$.

5. The radiation-sensitive resin composition according to claim 1, wherein in formula (1), a carbon atom bonded to $COOR^3$ and a carbon atom bonded to $OR^{41}$ are adjacent to each other.

6. The radiation-sensitive resin composition according to claim 1, further comprising an onium salt compound that generates, by irradiation with a radioactive ray, an acid having a pKa higher than a pKa of an acid generated from the radiation-sensitive acid generator.

7. The radiation-sensitive resin composition according to claim 1, wherein the onium cations in formula (2-1) and formula (2-2) are each independently a sulfonium cation or a iodonium cation.

8. A method for forming a pattern, comprising:
applying the radiation-sensitive resin composition according to claim 1 directly or indirectly onto a substrate to form a resist film;
exposing the resist film; and
developing the exposed resist film with a developer.

9. The method according to claim 8, wherein in the exposing of the resist film, the resist film is exposed to an extreme ultraviolet ray or an electron beam.

* * * * *